US012588593B2

(12) United States Patent
Faust et al.

(10) Patent No.: US 12,588,593 B2
(45) Date of Patent: Mar. 31, 2026

(54) FILL PROFILE AND TRACKING CONTROL DURING AN UNLOADING OPERATION BASED ON A CAD FILE

(71) Applicant: Deere & Company, Moline, IL (US)

(72) Inventors: Jeremy J. Faust, Grimes, IA (US);
Kellen E. O'Connor, Clive, IA (US)

(73) Assignee: DEERE & COMPANY, Moline, IL (US)

( * ) Notice: Subject to any disclaimer, the term of this patent is extended or adjusted under 35 U.S.C. 154(b) by 153 days.

(21) Appl. No.: 18/465,580

(22) Filed: Sep. 12, 2023

(65) Prior Publication Data
US 2024/0138301 A1 May 2, 2024

Related U.S. Application Data

(60) Provisional application No. 63/512,368, filed on Jul. 7, 2023, provisional application No. 63/381,187, filed on Oct. 27, 2022, provisional application No. 63/381,178, filed on Oct. 27, 2022.

(51) Int. Cl.

| | |
|---|---|
| *A01D 41/127* | (2006.01) |
| *A01B 69/00* | (2006.01) |
| *A01B 69/04* | (2006.01) |
| *G06F 30/15* | (2020.01) |

(Continued)

(52) U.S. Cl.
CPC ........ *A01D 41/1278* (2013.01); *A01B 69/001* (2013.01); *A01B 69/008* (2013.01); *A01D 41/1275* (2013.01); *G06F 30/15* (2020.01); *G06T 7/20* (2013.01); *G06T 7/70* (2017.01); *G06T 2207/10028* (2013.01); *G06T 2207/30252* (2013.01)

(58) Field of Classification Search
None
See application file for complete search history.

(56) References Cited

U.S. PATENT DOCUMENTS

| | | | |
|---|---|---|---|
| 8,032,255 B2 | 10/2011 | Phelan et al. | |
| 8,060,283 B2 | 11/2011 | Mott et al. | |
| 8,126,620 B2 | 2/2012 | Ringwald et al. | |

(Continued)

FOREIGN PATENT DOCUMENTS

| | | |
|---|---|---|
| CA | 2791436 A1 | 4/2014 |
| CN | 108550141 A | 9/2018 |

(Continued)

OTHER PUBLICATIONS

Tumenjargal et al., "Development of ISO 11783 Compliant Agricultural Systems: Experience Report", Automotive Systems and Software Engineering, 2019, pp. 197-223 (Year: 2019).*

(Continued)

*Primary Examiner* — Tamara L Weber
(74) *Attorney, Agent, or Firm* — Christopher J. Volkmann; KELLY, HOLT & CHRISTENSON PLLC

(57) ABSTRACT

Computer aided design (CAD) files for a plurality of different kinds of receiving vehicles are loaded to a remote server. Based on a receiving vehicle identifier, a corresponding CAD file or information derived from a CAD file is sent to a leading vehicle that is performing an unloading operation to load material into the receiving vehicle. An unloading control system controls the unloading operation based on the CAD file or information.

20 Claims, 40 Drawing Sheets

(51) Int. Cl.

| | | |
|---|---|---|
| *G06T 7/20* | (2017.01) | |
| *G06T 7/70* | (2017.01) | |

(56) References Cited

U.S. PATENT DOCUMENTS

| | | | |
|---|---|---|---|
| 8,380,401 | B2 | 2/2013 | Pighi et al. |
| 8,626,406 | B2 | 1/2014 | Schleicher et al. |
| 8,662,972 | B2 | 3/2014 | Behnke et al. |
| 8,868,304 | B2 | 10/2014 | Bonefas |
| 9,043,096 | B2 | 5/2015 | Zielke et al. |
| 9,049,817 | B2 | 6/2015 | McCully et al. |
| 9,119,342 | B2 | 9/2015 | Bonefas |
| 9,169,032 | B2 | 10/2015 | Gengerke |
| 9,185,845 | B2 | 11/2015 | Van Mill et al. |
| 9,187,259 | B2 | 11/2015 | Van Mill et al. |
| 9,272,853 | B2 | 3/2016 | Van Mill et al. |
| 9,392,746 | B2 | 7/2016 | Darr et al. |
| 9,457,971 | B2 | 10/2016 | Bonefas et al. |
| 9,529,364 | B2 | 12/2016 | Foster et al. |
| 9,545,048 | B2 | 1/2017 | Pickett et al. |
| 9,596,805 | B2 | 3/2017 | Van Mill et al. |
| 9,596,809 | B2 | 3/2017 | Van Mill et al. |
| 9,615,509 | B2 | 4/2017 | Flickinger et al. |
| 9,642,305 | B2 | 5/2017 | Nykamp et al. |
| 9,763,389 | B2 | 9/2017 | Bump et al. |
| 9,820,436 | B2 | 11/2017 | Inoue et al. |
| 9,861,040 | B2 | 1/2018 | Bonefas |
| 9,873,570 | B2 | 1/2018 | Van Mill et al. |
| 9,992,931 | B2 | 6/2018 | Bonefas et al. |
| 10,019,790 | B2 | 7/2018 | Bonefas et al. |
| 10,028,434 | B2 | 7/2018 | Van Mill et al. |
| 10,028,441 | B2 | 7/2018 | Van Mill et al. |
| 10,028,442 | B1 | 7/2018 | Crosby |
| 10,106,333 | B2 | 10/2018 | Beaujot et al. |
| 10,278,328 | B2 | 5/2019 | Thomson et al. |
| 10,292,327 | B2 | 5/2019 | Ducroquet et al. |
| 10,351,364 | B2 | 7/2019 | Green et al. |
| 10,406,961 | B2 | 9/2019 | Grodecki et al. |
| 10,760,946 | B2 | 9/2020 | Meier et al. |
| 10,765,063 | B2 | 9/2020 | Van Mill et al. |
| 10,807,812 | B2 | 10/2020 | Thomson et al. |
| 11,008,177 | B2 | 5/2021 | Banthia et al. |
| 11,457,562 | B2 | 10/2022 | Van Mill et al. |
| 11,825,765 | B2 | 11/2023 | Van Mill et al. |
| 2009/0321154 | A1 | 12/2009 | Johnson |
| 2011/0066337 | A1 | 3/2011 | Kormann |
| 2011/0220677 | A1 | 9/2011 | Bertolani |
| 2012/0215394 | A1 | 8/2012 | Wang et al. |
| 2014/0224377 | A1 | 8/2014 | Bonefas |
| 2015/0149048 | A1* | 5/2015 | Menke .................. A01D 43/087 701/50 |
| 2015/0264866 | A1 | 9/2015 | Foster et al. |
| 2017/0042088 | A1 | 2/2017 | Nykamp et al. |
| 2017/0055446 | A1 | 3/2017 | Nykamp et al. |
| 2020/0039306 | A1 | 2/2020 | Rogan |
| 2020/0319655 | A1 | 10/2020 | Desai et al. |
| 2021/0195840 | A1 | 7/2021 | Puryk et al. |
| 2021/0294337 | A1 | 9/2021 | Van Mill et al. |
| 2021/0329840 | A1 | 10/2021 | Craig |
| 2021/0337729 | A1 | 11/2021 | O'Connor et al. |
| 2022/0015288 | A1 | 1/2022 | Christiansen et al. |
| 2022/0019239 | A1* | 1/2022 | Christiansen ........ A01D 43/087 |
| 2022/0071078 | A1 | 3/2022 | Boyer et al. |
| 2022/0287239 | A1 | 9/2022 | Faust et al. |
| 2022/0408641 | A1 | 12/2022 | Van Mill et al. |
| 2022/0410704 | A1 | 12/2022 | O'Connor et al. |

FOREIGN PATENT DOCUMENTS

| | | | |
|---|---|---|---|
| DE | 102009027245 | A1 | 12/2010 |
| DE | 102012211001 | A1 | 1/2014 |
| DE | 102015109799 | A1 | 12/2016 |
| DE | 102016214320 | A1 | 2/2017 |
| EP | 1219153 | A2 | 7/2002 |
| EP | 2044826 | A2 | 4/2009 |
| EP | 2245917 | A2 | 11/2010 |
| EP | 2995191 | A1 | 3/2016 |
| EP | 3316218 | A1 | 5/2018 |
| EP | 3815486 | A1 | 5/2021 |
| EP | 3949714 | A1 | 2/2022 |
| EP | 3955183 | A1 | 2/2022 |
| EP | 4056019 | A1 | 9/2022 |
| EP | 4062740 | A1 | 9/2022 |
| EP | 4070636 | A1 | 10/2022 |
| EP | 4101286 | A1 | 12/2022 |
| GB | 1104906 | A | 3/1968 |
| WO | 2018102524 | A1 | 6/2018 |
| WO | WO 2022036114 | A1 | 2/2022 |
| WO | 2023150219 | A1 | 8/2023 |

OTHER PUBLICATIONS

Determine Volume of Solid, Oct. 16, 2019, 3 pages. https://knowledge. autodesk.com/support/autocad/learn-explore/caas/sfdcarticles/ sfdcarticles/Determine-volume-of-solid.html#:~: text=To% 20determine%20the%20volume%20of%20a%20solid%20object% 2C%20use%20the,Press%20ENTER.

SolidWorks Calculating Volume of a Solid, Feb. 3, 2022, 6 pages. https://www.goengineer.com/blog/solidworks-calculating-volume-of-a-solid.

Extended European Search Report and Written Opinion issued in European Patent Application No. 23202822.5, dated Mar. 19, 2024, in 07 pages.

Extended European Search Report and Written Opinion issued in European Patent Application No. 23203069.2, dated Mar. 18, 2024, in 07 pages.

Extended European Search Report and Written Opinion issued in European Patent Application No. 23203519.6, dated Mar. 14, 2024, in 05 pages.

Extended European Search Report and Written Opinion issued in European Patent Application No. 23203536.0, dated Mar. 14, 2024, in 06 pages.

Extended European Search Report and Written Opinion issued in European Patent Application No. 23203537.8, dated Mar. 14, 2024, in 05 pages.

Extended European Search Report and Written Opinion issued in European Patent Application No. 23202466.1, dated Mar. 26, 2024, in 07 pages.

Extended European Search Report and Written Opinion issued in European Patent Application No. 23202485.1, dated Mar. 26, 2024, in 07 pages.

Extended European Search Report and Written Opinion issued in European Patent Application No. 23203067.6, dated Mar. 26, 2024, in 11 pages.

Extended European Search Report and Written Opinion issued in European Patent Application No. 23202510.6, dated Apr. 4, 2024, in 08 pages.

Extended European Search Report and Written Opinion issued in European Patent Application No. 23202817.5, dated Apr. 23, 2024, in 08 pages.

U.S. Appl. No. 18/352,576 Application and Drawings filed on Jul. 14, 2023, 39 pages.

U.S. Appl. No. 18/447,718 Application and Drawings filed on Aug. 10, 2023, 53 pages.

U.S. Appl. No. 18/358,401 Application and Drawings filed on Jul. 25, 2023, 47 pages.

U.S. Appl. No. 18/471,701 Application and Drawings filed on Sep. 21, 2023, 50 pages.

U.S. Appl. No. 63/381,178 Application and Drawings filed on Oct. 27, 2022, 101 pages.

U.S. Appl. No. 63/381,187 Application and Drawings filed on Oct. 27, 2022, 104 pages.

U.S. Appl. No. 63/512,368 Application and Drawings filed on Jul. 7, 2023, 101 pages.

https://teslamotorsclub.com/tmc/threads/lane-change-notification. 252072/, dated Dec. 29, 2021, 4 pages.

(56)     References Cited

OTHER PUBLICATIONS

John Deere, Active Fill Control Retrieved from internet on Jun. 27. 2023, 2 pages. <https://www.deere.com/en/technology-products/precision-ag-technology/guidance/active-fill-control/>.

John Deere, Machine Sync Retrieved from internet: Jun. 27, 2023, 3 pages. <https://www.deere.com/en/technology-products/precision-ag-technology/guidance/machine-sync/>.

Huang, Xiaoshui & Mel, Guofeng & Zhang, Jian & Abbas, Rana. (2021). A comprehensive survey on point cloud registration, Mar. 5, 2021, 17 pages. Retrieved from internet: <https://www.researchgate.net/publication/349787695_A_comprehensive_survey_on_point_cloud_registration>.

U.S. Appl. No. 18/334,874 Application and Drawings filed on Jun. 14. 2023, 59 pages.

U.S. Appl. No. 18/334,861 Application and Drawings filed on Jun. 14, 2023, 96 pages.

U.S. Appl. No. 18/334,869 Application and Drawings filed on Jun. 14, 2023, 85 pages.

U.S. Appl. No. 18/334,863 Application and Drawings filed on Jun. 14, 2023, 73 pages.

U.S. Appl. No. 18/334,886 Application and Drawings filed on Jun. 14, 2023, 47 pages.

Killbros: "1950 Dual-Auger Grain Cart," Killbros Farm Equipment, 2016, 8 Pages, Retrieved from URL: https://web.archive.org/web/20160203214035/https://www.killbrosequip.com/grain-carts/1950.

Search Report for German Application No. 102023132671.6, dated Jul. 4, 2024, 10 Pages.

* cited by examiner

Figure 5:
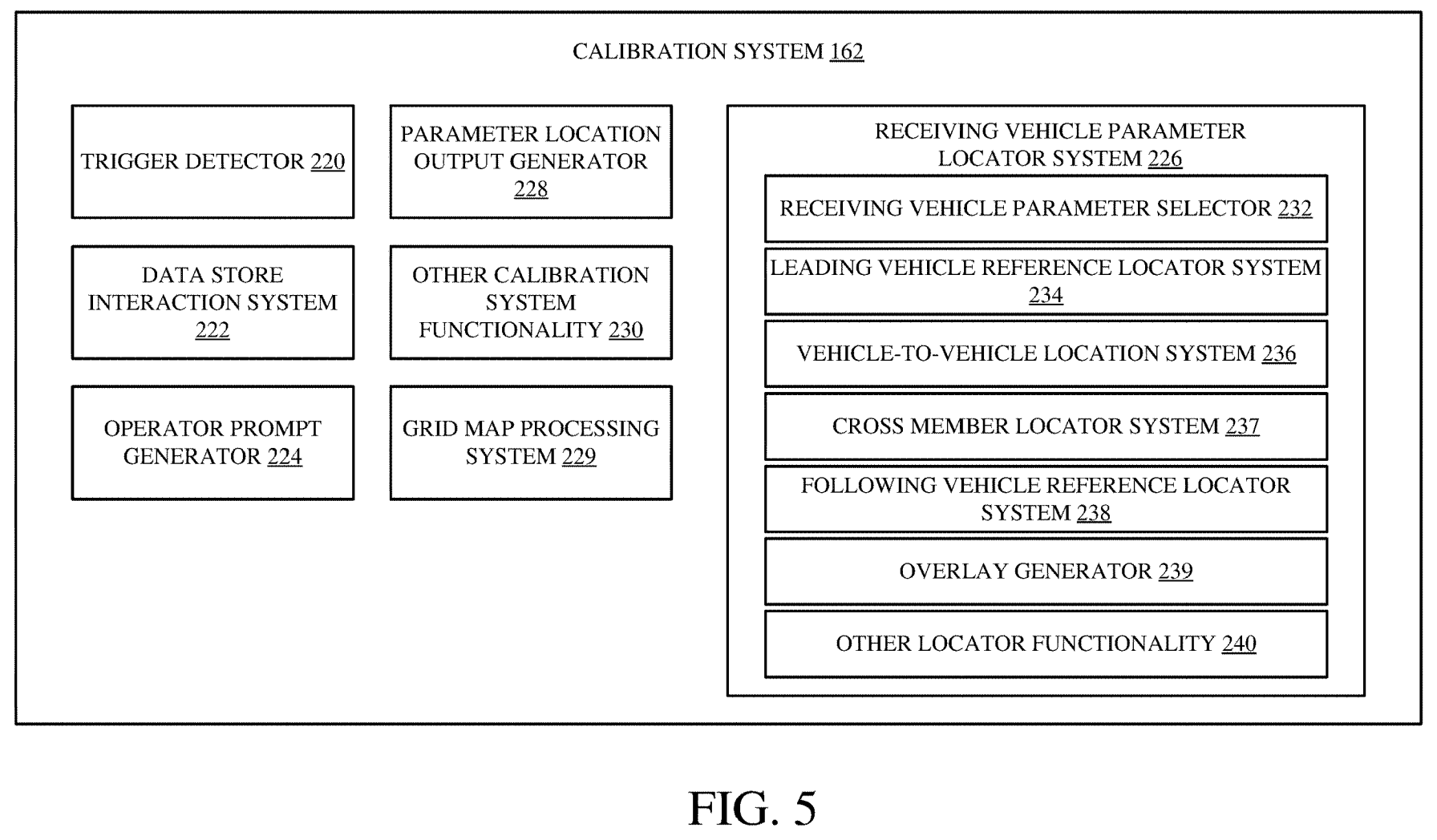

CALIBRATION SYSTEM 162

TRIGGER DETECTOR 220

DATA STORE INTERACTION SYSTEM 222

OPERATOR PROMPT GENERATOR 224

PARAMETER LOCATION OUTPUT GENERATOR 228

OTHER CALIBRATION SYSTEM FUNCTIONALITY 230

GRID MAP PROCESSING SYSTEM 229

RECEIVING VEHICLE PARAMETER LOCATOR SYSTEM 226

RECEIVING VEHICLE PARAMETER SELECTOR 232

LEADING VEHICLE REFERENCE LOCATOR SYSTEM 234

VEHICLE-TO-VEHICLE LOCATION SYSTEM 236

CROSS MEMBER LOCATOR SYSTEM 237

FOLLOWING VEHICLE REFERENCE LOCATOR SYSTEM 238

OVERLAY GENERATOR 239

OTHER LOCATOR FUNCTIONALITY 240

Figure 7B:
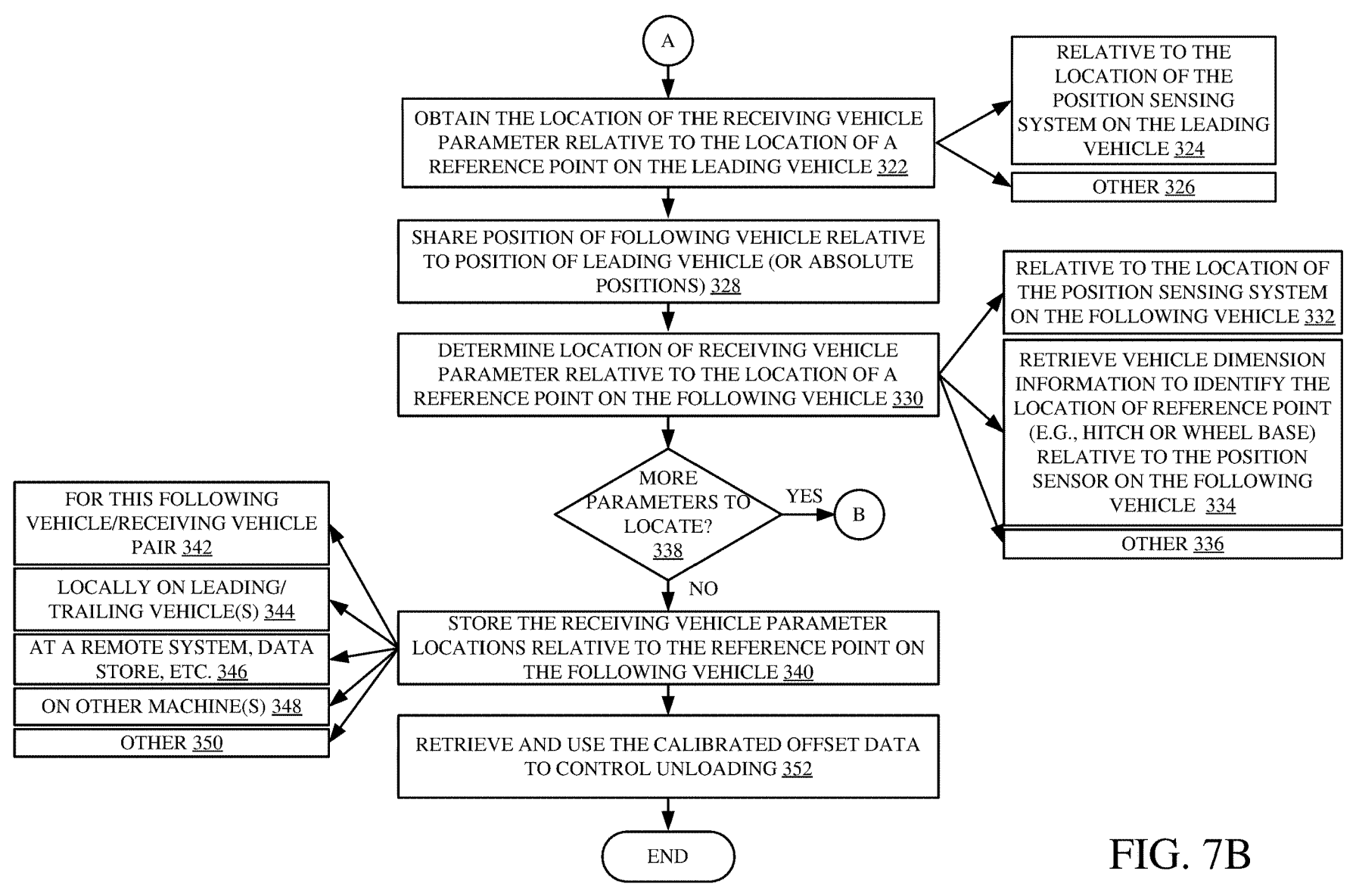

OBTAIN THE LOCATION OF THE RECEIVING VEHICLE PARAMETER RELATIVE TO THE LOCATION OF A REFERENCE POINT ON THE LEADING VEHICLE 322

RELATIVE TO THE LOCATION OF THE POSITION SENSING SYSTEM ON THE LEADING VEHICLE 324

OTHER 326

SHARE POSITION OF FOLLOWING VEHICLE RELATIVE TO POSITION OF LEADING VEHICLE (OR ABSOLUTE POSITIONS) 328

DETERMINE LOCATION OF RECEIVING VEHICLE PARAMETER RELATIVE TO THE LOCATION OF A REFERENCE POINT ON THE FOLLOWING VEHICLE 330

RELATIVE TO THE LOCATION OF THE POSITION SENSING SYSTEM ON THE FOLLOWING VEHICLE 332

RETRIEVE VEHICLE DIMENSION INFORMATION TO IDENTIFY THE LOCATION OF REFERENCE POINT (E.G., HITCH OR WHEEL BASE) RELATIVE TO THE POSITION SENSOR ON THE FOLLOWING VEHICLE 334

OTHER 336

MORE PARAMETERS TO LOCATE? 338

YES → B

NO

STORE THE RECEIVING VEHICLE PARAMETER LOCATIONS RELATIVE TO THE REFERENCE POINT ON THE FOLLOWING VEHICLE 340

FOR THIS FOLLOWING VEHICLE/RECEIVING VEHICLE PAIR 342

LOCALLY ON LEADING/ TRAILING VEHICLE(S) 344

AT A REMOTE SYSTEM, DATA STORE, ETC. 346

ON OTHER MACHINE(S) 348

OTHER 350

RETRIEVE AND USE THE CALIBRATED OFFSET DATA TO CONTROL UNLOADING 352

END

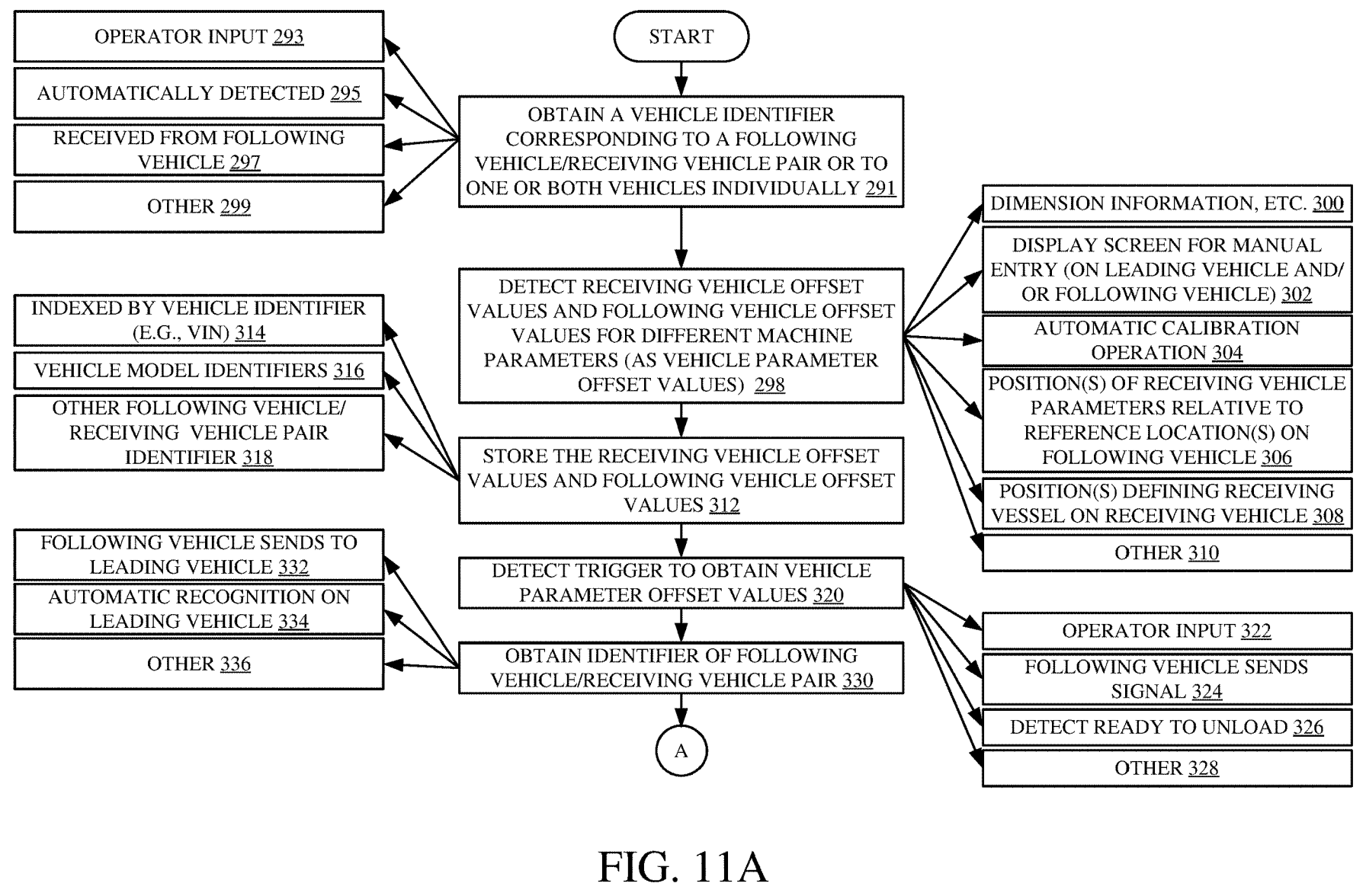

START

OBTAIN A VEHICLE IDENTIFIER CORRESPONDING TO A FOLLOWING VEHICLE/RECEIVING VEHICLE PAIR OR TO ONE OR BOTH VEHICLES INDIVIDUALLY 291

- OPERATOR INPUT 293
- AUTOMATICALLY DETECTED 295
- RECEIVED FROM FOLLOWING VEHICLE 297
- OTHER 299

DETECT RECEIVING VEHICLE OFFSET VALUES AND FOLLOWING VEHICLE OFFSET VALUES FOR DIFFERENT MACHINE PARAMETERS (AS VEHICLE PARAMETER OFFSET VALUES) 298

- INDEXED BY VEHICLE IDENTIFIER (E.G., VIN) 314
- VEHICLE MODEL IDENTIFIERS 316
- OTHER FOLLOWING VEHICLE/ RECEIVING VEHICLE PAIR IDENTIFIER 318

STORE THE RECEIVING VEHICLE OFFSET VALUES AND FOLLOWING VEHICLE OFFSET VALUES 312

DETECT TRIGGER TO OBTAIN VEHICLE PARAMETER OFFSET VALUES 320

- FOLLOWING VEHICLE SENDS TO LEADING VEHICLE 332
- AUTOMATIC RECOGNITION ON LEADING VEHICLE 334
- OTHER 336

OBTAIN IDENTIFIER OF FOLLOWING VEHICLE/RECEIVING VEHICLE PAIR 330

A

- DIMENSION INFORMATION, ETC. 300
- DISPLAY SCREEN FOR MANUAL ENTRY (ON LEADING VEHICLE AND/ OR FOLLOWING VEHICLE) 302
- AUTOMATIC CALIBRATION OPERATION 304
- POSITION(S) OF RECEIVING VEHICLE PARAMETERS RELATIVE TO REFERENCE LOCATION(S) ON FOLLOWING VEHICLE 306
- POSITION(S) DEFINING RECEIVING VESSEL ON RECEIVING VEHICLE 308
- OTHER 310

- OPERATOR INPUT 322
- FOLLOWING VEHICLE SENDS SIGNAL 324
- DETECT READY TO UNLOAD 326
- OTHER 328

FIG. 11A

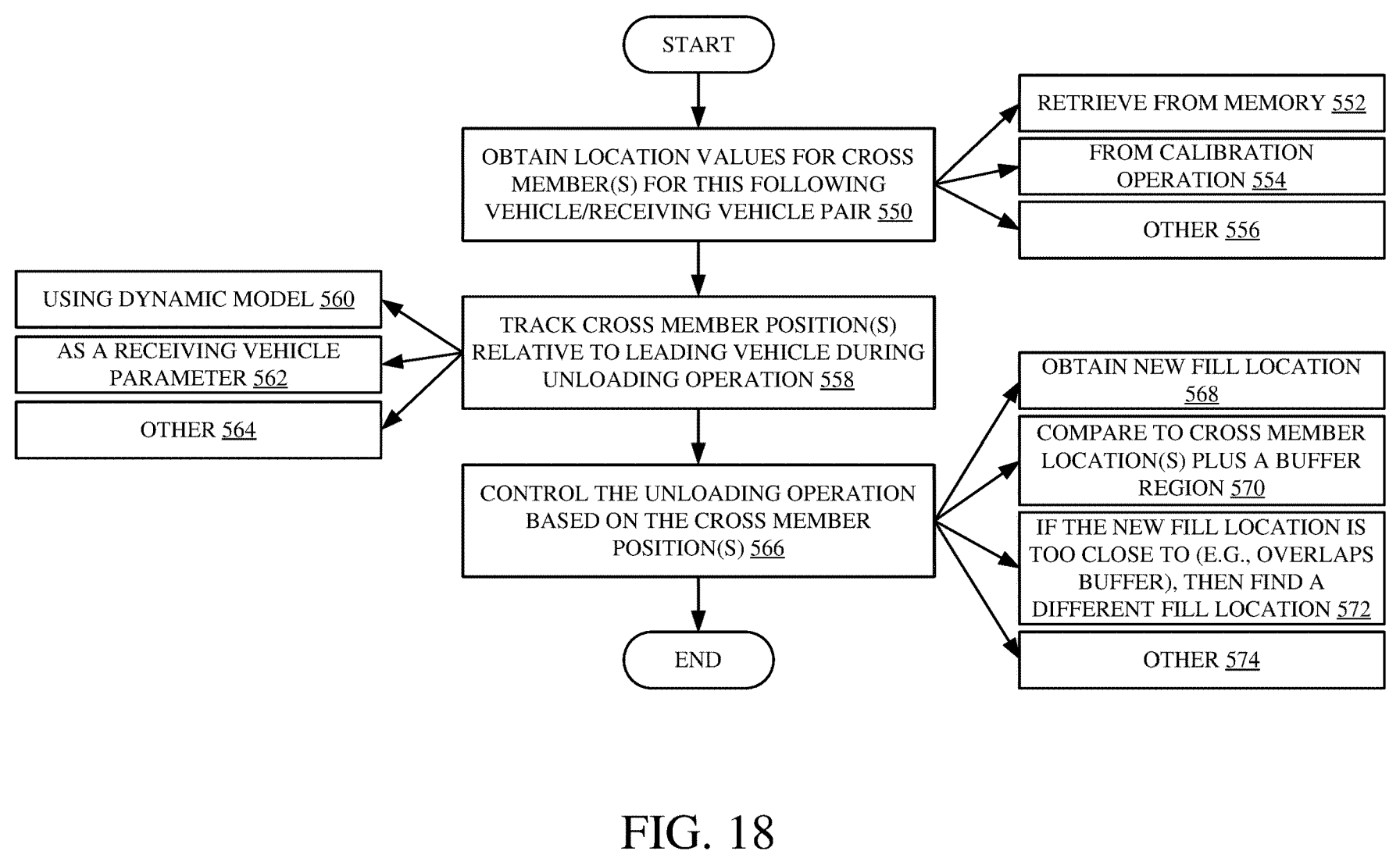

RETRIEVE FROM MEMORY 552

FROM CALIBRATION OPERATION 554

OTHER 556

OBTAIN NEW FILL LOCATION 568

COMPARE TO CROSS MEMBER LOCATION(S) PLUS A BUFFER REGION 570

IF THE NEW FILL LOCATION IS TOO CLOSE TO (E.G., OVERLAPS BUFFER), THEN FIND A DIFFERENT FILL LOCATION 572

OTHER 574

START

OBTAIN LOCATION VALUES FOR CROSS MEMBER(S) FOR THIS FOLLOWING VEHICLE/RECEIVING VEHICLE PAIR 550

TRACK CROSS MEMBER POSITION(S) RELATIVE TO LEADING VEHICLE DURING UNLOADING OPERATION 558

CONTROL THE UNLOADING OPERATION BASED ON THE CROSS MEMBER POSITION(S) 566

END

USING DYNAMIC MODEL 560

AS A RECEIVING VEHICLE PARAMETER 562

OTHER 564

FIG. 18

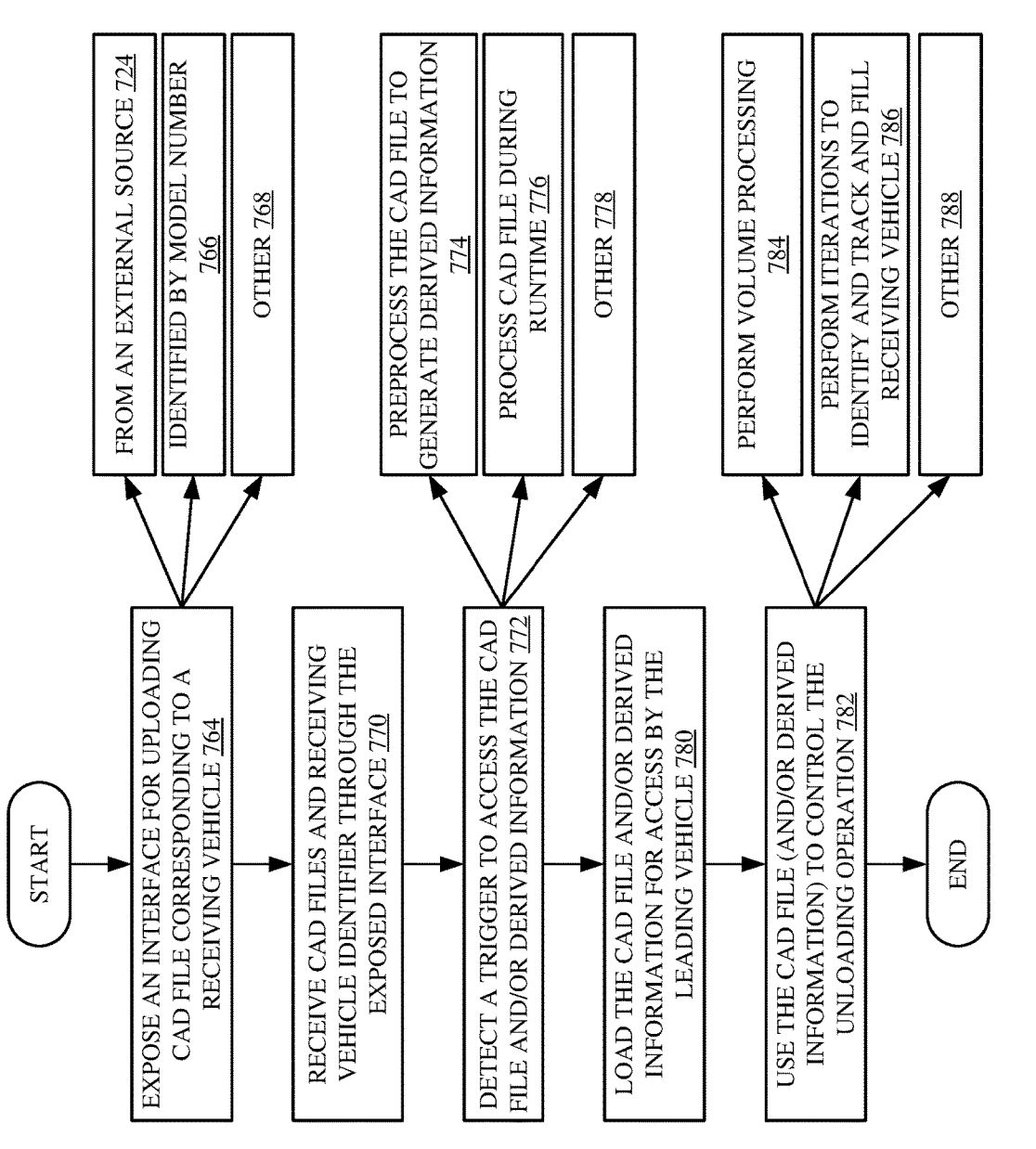

FROM AN EXTERNAL SOURCE 724

IDENTIFIED BY MODEL NUMBER 766

OTHER 768

PREPROCESS THE CAD FILE TO GENERATE DERIVED INFORMATION 774

PROCESS CAD FILE DURING RUNTIME 776

OTHER 778

PERFORM VOLUME PROCESSING 784

PERFORM ITERATIONS TO IDENTIFY AND TRACK AND FILL RECEIVING VEHICLE 786

OTHER 788

START

EXPOSE AN INTERFACE FOR UPLOADING CAD FILE CORRESPONDING TO A RECEIVING VEHICLE 764

RECEIVE CAD FILES AND RECEIVING VEHICLE IDENTIFIER THROUGH THE EXPOSED INTERFACE 770

DETECT A TRIGGER TO ACCESS THE CAD FILE AND/OR DERIVED INFORMATION 772

LOAD THE CAD FILE AND/OR DERIVED INFORMATION FOR ACCESS BY THE LEADING VEHICLE 780

USE THE CAD FILE (AND/OR DERIVED INFORMATION) TO CONTROL THE UNLOADING OPERATION 782

END

FIG. 27

FILL PROFILE AND TRACKING CONTROL DURING AN UNLOADING OPERATION BASED ON A CAD FILE

CROSS-REFERENCE TO RELATED APPLICATION

The present application is based on and claims the benefit of U.S. provisional patent application Ser. No. 63/512,368, filed Jul. 7, 2023, U.S. provisional patent application Ser. No. 63/381,178, filed Oct. 27, 2022, U.S. provisional patent application Ser. No. 63/381,187, filed Oct. 27, 2022, the content of which is hereby incorporated by reference in its entirety.

FIELD OF THE DESCRIPTION

The present description generally relates to machines that load material into receiving vehicles, such as harvesting machines that fill carts, semitrailers, or other agricultural receiving vehicles. More specifically, but not by limitation, the present description relates to automated control of an unloading operation using information in a computer aided design (CAD) file corresponding to a receiving vehicle.

BACKGROUND

There are a wide variety of different types of vehicles that load material into other vehicles. Some such vehicles include agricultural vehicles such as forage harvesters or other harvesters (such as combine harvesters, sugarcane harvesters, silage harvesters, etc.), that harvest grain or other crop. Such harvesters often unload material into carts, which may be pulled by tractors, or semitrailers, as the harvesters are moving. Other vehicles that unload material into receiving vehicles include construction vehicles, such as cold planers that unload into a dump truck, and other vehicles.

Taking an agricultural harvester as an example, while harvesting in a field using a forage harvester or combine harvester, an operator attempts to control the harvester to maintain harvesting efficiency, during many different types of conditions. The soil conditions, crop conditions, etc. can all change. This may result in the operator changing control settings. This means the operator needs to devote a relatively large amount of attention to controlling the forage harvester or combine harvester.

At the same time, a semitruck or tractor-pulled cart (a receiving vehicle), is often in position relative to the harvester (e.g., alongside the harvester or behind the harvester) so that the harvester can fill the semitrailer or cart, while moving through the field. In some current systems, this requires the operator of the harvester to control the position of the unloading spout and/or flap so that the receiving vehicle is filled evenly, but not over filled. Even a momentary misalignment between the spout and the receiving vehicle may result in hundreds of pounds of harvested material being dumped on the ground, rather than in the receiving vehicle.

The discussion above is merely provided for general background information and is not intended to be used as an aid in determining the scope of the claimed subject matter.

SUMMARY

Computer aided design (CAD) files for a plurality of different kinds of receiving vehicles are loaded to a remote server. Based on a receiving vehicle identifier, a corresponding CAD file or information derived from a CAD file is sent to a leading vehicle that is performing an unloading operation to load material into the receiving vehicle. An unloading control system controls the unloading operation based on the CAD file or information.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

FIG. 5 is a block diagram of one example of a calibration system.

FIGS. 7A and 7B (collectively referred to as FIG. 7) show a flow diagram illustrating an example operation of a harvesting machine.

FIGS. 11A and 11B (collectively referred to herein as FIG. 11) show a flow diagram illustrating one example of the operation of an offset value management system.

FIG. 18. is a flow diagram showing one example of the operation of an unloading control system in controlling an unloading operation based on the location of the cross member on the receiving vehicle.

FIG. 27 is a flow diagram illustrating one example of how CAD files are obtained and used in unloading control.

DETAILED DESCRIPTION

Figure 1:
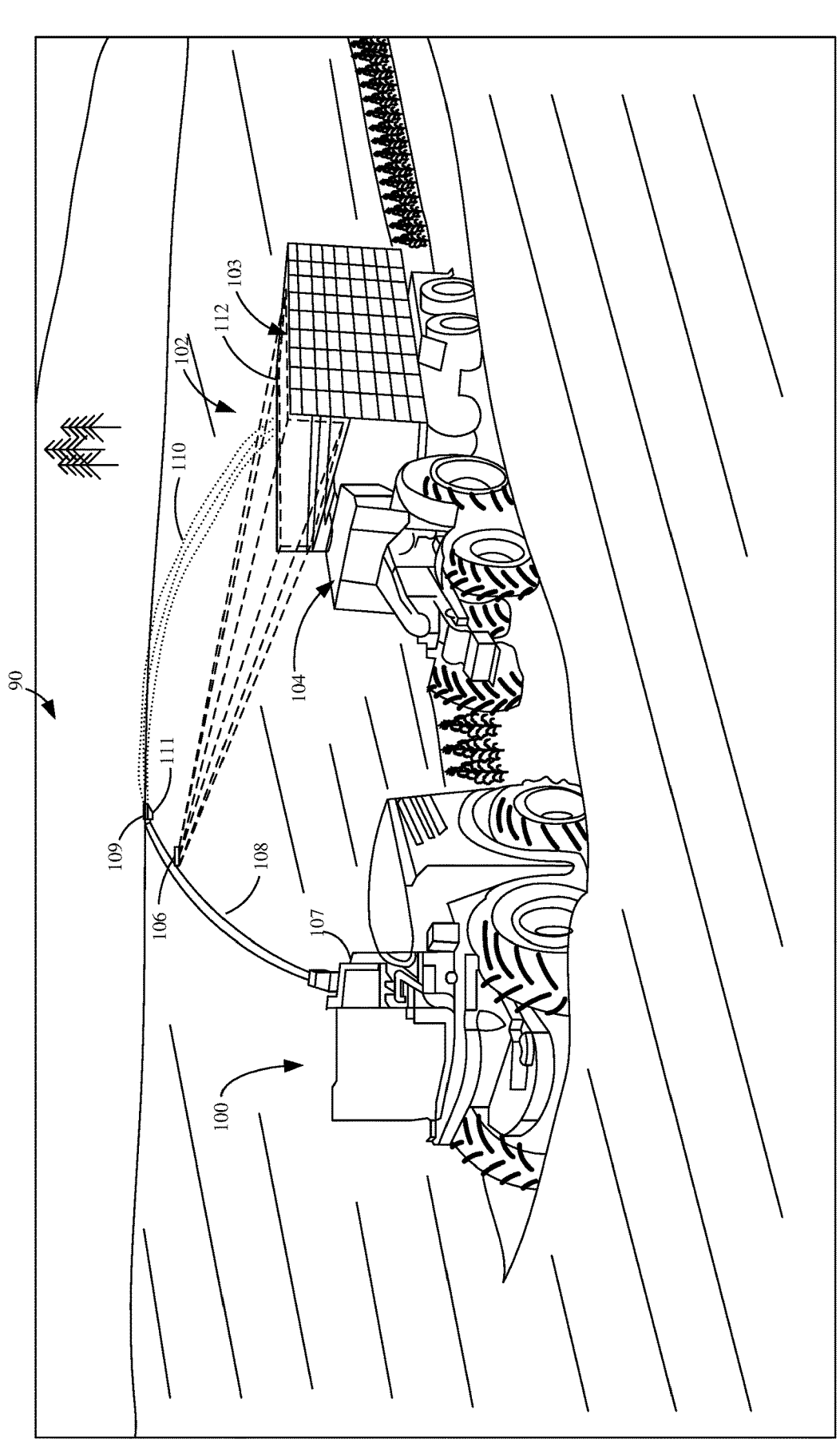
FIG. 1 is a pictorial illustration of one example of a forage harvester filling a tractor-pulled receiving vehicle, with the receiving vehicle following the forage harvester.

The present discussion proceeds with respect to an agricultural harvester, but it will be appreciated that the present discussion is also applicable to construction machines or other material loading vehicles as well. As discussed above, it can be very difficult for an operator to maintain high efficiency in controlling a harvester, and also to optimally monitor the position of the receiving vehicle during an unloading (or filling) operation. This difficulty can even be exacerbated when the receiving vehicle is located behind the harvester (such as a forage harvester), so that the forage harvester is executing a rear unloading operation, but the difficulty also exists in side-by-side unloading scenarios.

The difficulty can be further exacerbated when the receiving vehicle has cross members or hoops or other fixtures that span over a portion of the opening in the receiving vehicle. Such cross members or hoops may be rigid or flexible (e.g., belts or straps) and are often used to hold a cover for the receiving vehicle. If grain or other material contacts the cross members, the grain or other material often bounces out of the receiving vehicle onto the ground and/or may damage the cross member.

In order to address these issues, some automatic cart filling control systems have been developed to automate portions of the filling process. One such automatic fill control system uses a stereo camera on the spout of the harvester to capture an image of the receiving vehicle. An image processing system determines dimensions of the receiving vehicle and the distribution of crop deposited inside the receiving vehicle. The system also detects material height within the receiving vehicle, in order to automatically aim the spout toward empty spots and control the flap position (and thus material trajectory) to achieve a more even fill, while reducing spillage. Such systems can fill the receiving vehicle according to a fill strategy (such as front-to-back, back-to-front, etc.) that is set by the operator or that is set in other ways, but often do not avoid cross members.

In addition, some current harvesters are provided with a machine synchronization control system. The harvester may be a combine harvester so that the spout is not movable relative to the frame during normal unloading operations. Instead, the relative position of the receiving vehicle and the combine harvester is changed in order to fill the receiving vehicle as desired. Thus, in a front-to-back fill strategy, for instance, the relative position of the receiving vehicle, relative to the combine harvester, is changed so that the spout is first filling the receiving vehicle at the front end, and then gradually fills the receiving vehicle moving rearward. In such an example, the combine harvester and receiving vehicle may have machine synchronization systems which communicate with one another. When the relative position of the two vehicles is to change, the machine synchronization system on the combine harvester can send a message to the machine synchronization system on the towing vehicle to nudge the towing vehicle slightly forward or rearward relative to the combine harvester, as desired. By way of example, the machine synchronization system on the combine harvester may receive a signal from the fill control system on the combine harvester indicating that the position in the receiving vehicle that is currently being filled is approaching its desired fill level. In that case, the machine synchronization system on the combine harvester can send a "nudge" signal to the machine synchronization system on the towing vehicle. The "nudge", once received by the machine synchronization system on the towing vehicle, causes the towing vehicle to momentarily speed up or slow down, thus nudging the position of the receiving vehicle forward or rearward, respectively, relative to the combine harvester.

In all of the systems that attempt to automate part or all of the unloading process from a harvester into a receiving vehicle, the automated system attempts to understand where the receiving vehicle is located over time relative to the towing vehicle (e.g., the tractor pulling the receiving vehicle—also referred to has the following vehicle), and relative to the leading vehicle (e.g., the harvester or the vehicle that is controlling the following vehicle). For purposes of the present discussion, the term leading vehicle will be the vehicle that is unloading material into the receiving vehicle. The term following vehicle will refer to the propulsion vehicle, or towing vehicle (such as a tractor), that is providing propulsion to the receiving vehicle (such as a cart).

Determining the location of the receiving vehicle over time can be accomplished using different types of systems. In some current systems, a camera and image processor are used to capture an image (static or video) of parts of the receiving vehicle (the edges of the receiving area of the cart, the walls of the cart, the front end and rear end of the cart, the hoops or cross members on the receiving vehicle, etc., collectively referred to herein as receiving vehicle parameters) and an image processor processes that image in attempt to identify the receiving vehicle parameters, in real-time, during the harvesting operation. The image processor identifies the receiving vehicle parameters in the image and a controller then attempts to identify the location of the receiving vehicle parameters relative to the leading vehicle (e.g., relative to the harvester), in real-time, during harvesting and unloading.

However, this can be prone to errors. For instance, during the harvesting and unloading operation, the environment can be relatively dusty or have other obscurants so that it can be difficult to continuously identify the receiving vehicle parameters and then calculate their location relative to the leading vehicle. The dust or other obscurants in the environment can lead to an image that is difficult to process, and therefore, the accuracy in identifying the receiving vehicle parameters (and thus locating them relative to the leading vehicle) can take additional time, and can be error prone.

The present description thus proceeds, in one example, with respect to a system that conducts a calibration operation that identifies one or more receiving vehicle parameters and the position of the parameter(s) relative to a reference point on the following vehicle. A detector on the leading vehicle detects the receiving vehicle parameters. Positioning systems (e.g., global navigation satellite systems—GNSS receivers) on the leading vehicle and the following vehicle communicate with one another so that the relative position of the leading vehicle, relative to the following vehicle, is known. An offset on the following vehicle between the positioning system and a reference point (such as a hitch, wheelbase, etc.) is also known. A calibration system thus determines the relative position of the receiving vehicle parameters, relative to the location of the leading vehicle (as identified by the positioning system on the leading vehicle) and transposes that information into a location of the receiving vehicle parameters relative to the reference point on the following vehicle. This is referred to as the calibrated offset value corresponding to the receiving vehicle parameter. Then, during an unloading operation, the leading vehicle (e.g., the harvester) need only receive the position of the following vehicle (e.g., the GPS coordinates of the tractor). The leading vehicle can then calculate where the receiving vehicle parameter (e.g., the front wall, the side walls, the rear wall, hoops or cross members, etc. of the receiving vehicle) is located relative to the reference location on the trailing vehicle (e.g., the trailer hitch of the tractor) based upon the calibrated offset value for the particular receiving vehicle parameter under consideration.

In another example, the location of the hitch point (or pivot point) where the receiving vehicle is coupled to the following vehicle is identified relative to the leading vehicle. The position and heading or route of the following vehicle is detected relative to the leading vehicle. A dynamic model identifies the location of the receiving vehicle relative to the leading vehicle based on the location of the hitch relative to the leading vehicle and based on the position and heading or route of the following vehicle relative to the loading vehicle.

In this way, the leading vehicle need not rely on real-time images captured in a noisy (e.g., dusty) environment to attempt to identify the location of the receiving vehicle during the unloading process. Instead, during harvesting and unloading, once the GNSS location of the hitch point on the following vehicle is known (or the relative position of the hitch point on the following vehicle is known relative to the leading vehicle), along with the route or heading of the following vehicle relative to the leading vehicle, then the location of the receiving vehicle can be identified using the dynamic model, without performing image processing. The unloading operation can thus be controlled based on the output from the dynamic model.

In another example, the receiving vehicle may have cross members or other fixtures which span a portion of the opening in the receiving vehicle. The present discussion thus proceeds with respect to an example system which identifies the location of the cross members during a calibration operation. The cross members can be identified using image processing and offset values or by generating a grid map of the receiving vehicle, where values in the grid map identify the location of the cross members or fixtures.

In yet another example, it may be desirable to control an unloading operation based on volume of material unloaded into the receiving vehicle. However, the volume of a receiving vehicle may be difficult to obtain without manual measurement. One example of the present description thus proceeds with respect to obtaining and processing a computer aided design (CAD) file corresponding to the receiving vehicle and identifying a volume profile for the receiving vehicle based on the CAD file. The volume profile can then be used to control the unloading operation. The CAD file can also be used to obtain dimension information and other information. The receiving vehicle can thus be tracked using the CAD file (or derived information) as well. Similarly, logistic control signals can be generated to perform logistics operations control as well, also based on the CAD file (or derived information).

FIG. 1 is a pictorial illustration showing one example of a self-propelled forage harvester 100 (a material loading vehicle also referred to as a leading vehicle) filling a tractor-pulled grain cart (or receiving vehicle) 102. Cart 102 thus defines an interior that forms a receiving vessel 103 for receiving harvested material through a receiving area 112. In the example shown in FIG. 1, a tractor 104 (a towing vehicle also referred to as a following vehicle), that is pulling grain cart 102, is positioned directly behind forage harvester 100 Also, in the example illustrated in FIG. 1, forage harvester 100 has a detector such as camera 106 mounted on the spout 108 through which the harvested material 110 is traveling. The spout 108 can be pivotally or rotatably mounted to a frame 107 of harvester 100. In the example shown in FIG. 1, the detector 106 is a stereo-camera or a mono-camera that captures an image (e.g., a still image or video) of the receiving area 112 of cart 102. Also, in the example shown in FIG. 1, the receiving area 112 is defined by an upper edge of the walls of cart 102.

When harvester 100 has an automatic fill control system that includes image processing, as discussed above, the automatic fill control system attempts to identify the location of the receiving area 112 by identifying the edges or walls of the receiving area and can then gauge the height of harvested material in cart 102, and the location of that material in the receiving vehicle. The system thus automatically controls the position of spout 108 and flap 109 to direct the trajectory of material 110 into the receiving area 112 of cart 102 to obtain an even fill throughout the entire length and width of cart 102, while not overfilling cart 102. By automatically, it is meant, for example, that the operation is performed without further human involvement except, perhaps, to initiate or authorize the operation.

For example, when executing a back-to-front automatic fill strategy the automatic fill control system may attempt to move the spout and flap so the material begins landing at a first landing point in the back of vessel 103 of receiving vehicle 102. Then, once a desired fill level is reached in the back of vessel 103, the automatic fill control system moves the spout and flap so the material begins landing just forward of the first landing point in vessel 103.

There can be problems with this approach. The environment of receiving area 112 can have dust or other obscurants making it difficult to visually identify the location and bounds of receiving area 112. Thus, it can be difficult to accurately control the trajectory of material 110 to achieve the desired fill strategy.

Figure 2:
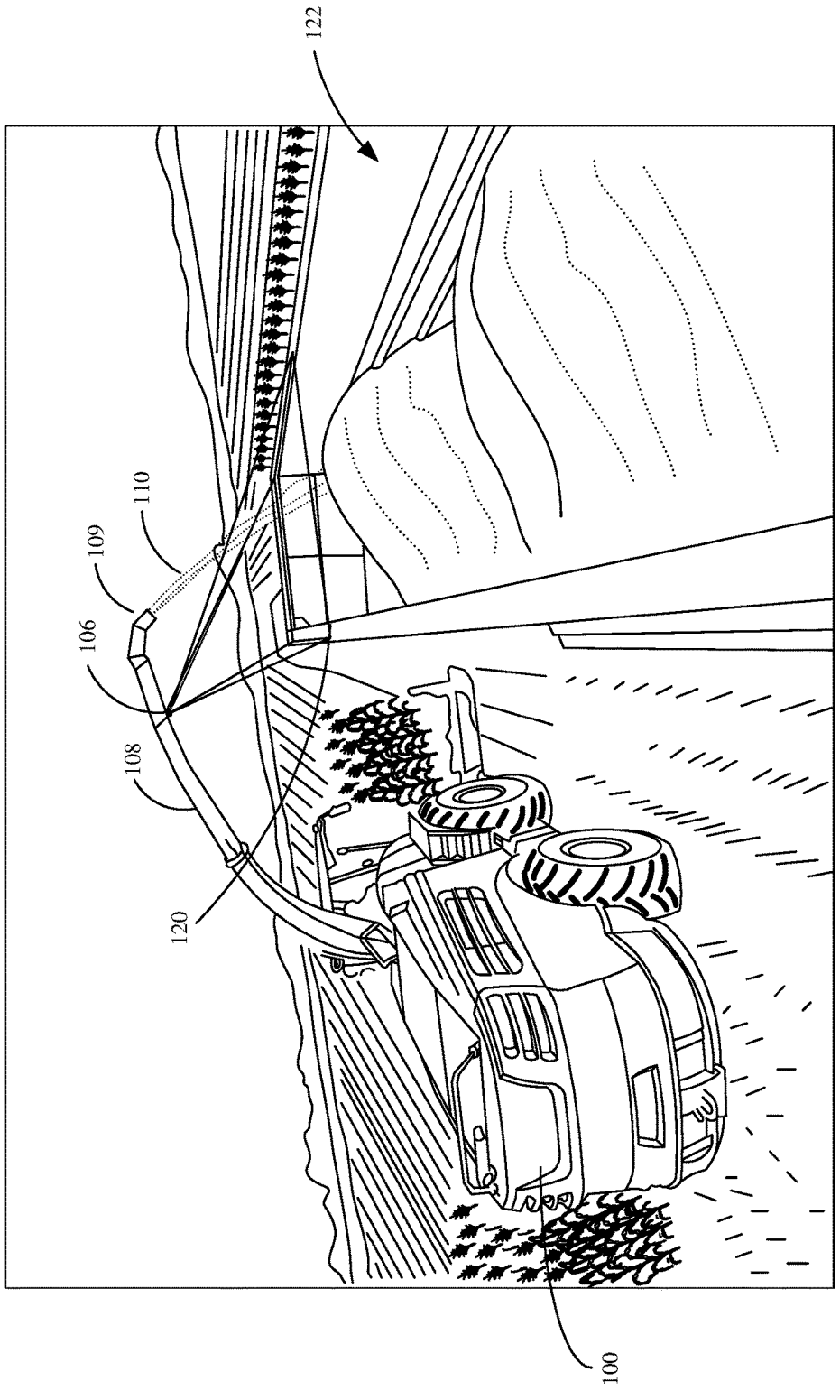
FIG. 2 is a pictorial illustration of one example of a forage harvester filling a receiving vehicle that is alongside the forage harvester.

FIG. 2 is a pictorial illustration showing another example of a self-propelled forage harvester 100, this time loading a semi-trailer (or receiving vessel on a receiving vehicle) 122 in a configuration in which a semi-tractor (also referred to as a following vehicle) is pulling semi-trailer 122 alongside forage harvester 100. Therefore, the spout 108 and flap 109 are positioned to unload the harvested material 110 to fill trailer 122 according to a pre-defined side-by-side fill strategy. Again, FIG. 2 shows that camera 106 can capture an image (which can include a still image or video) of semi-trailer 122. In the example illustrated in FIG. 2, the field of view of camera 106 is directed toward the receiving area 120 of trailer 122 so that image processing can be performed to identify a landing point for the harvested material in trailer 122.

Figure 3:
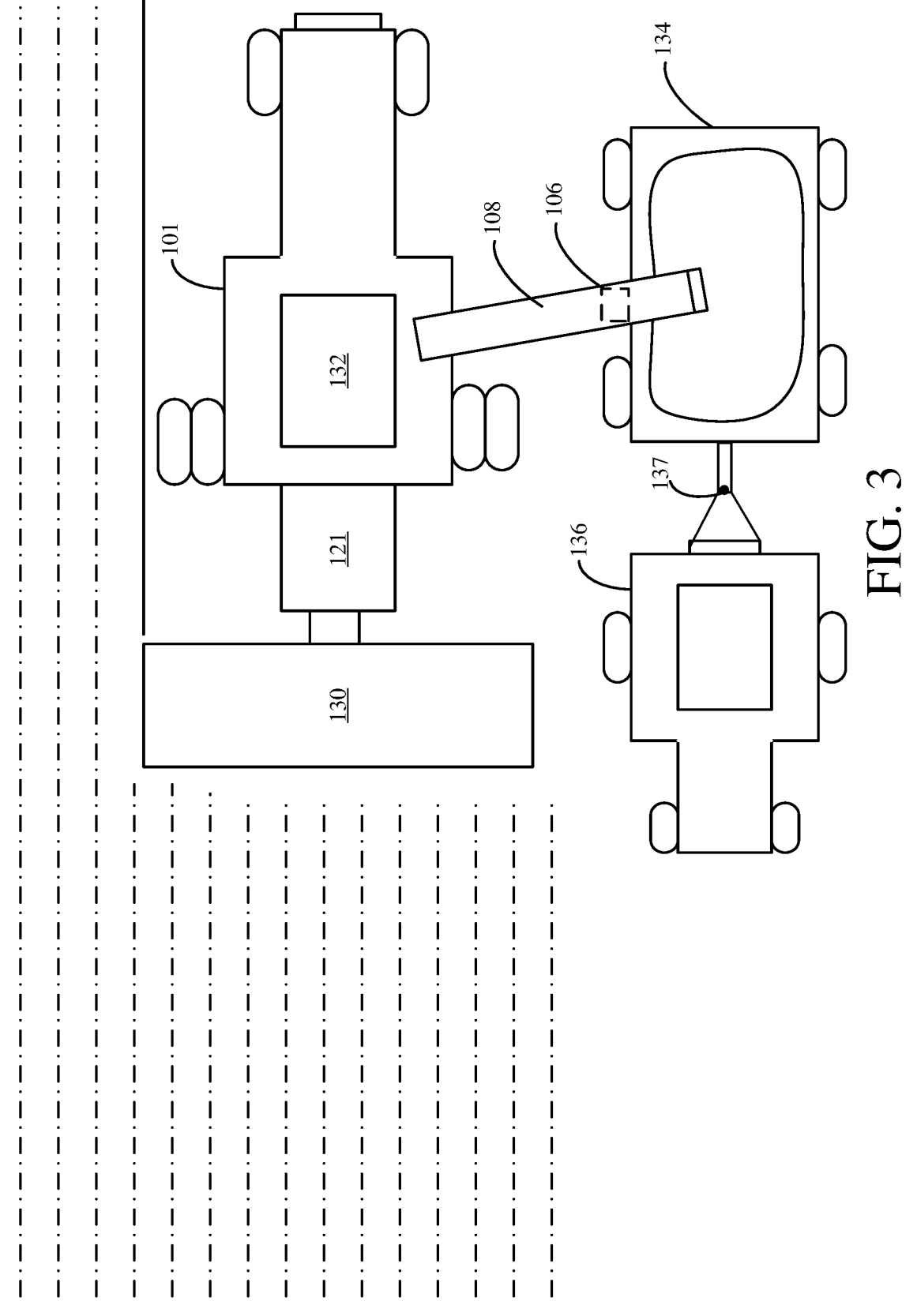
FIG. 3 shows a combine harvester filling a receiving vehicle.

FIG. 3 shows an example in which leading vehicle 101 is a combine harvester, with an operators compartment 121 and with a header 130 that engages crop. The crop is processed and placed in a clean grain tank 132, where it is unloaded (such as using an auger) through spout 108 into a receiving vehicle 134 (e.g., a grain cart) that is pulled by a following vehicle 136 (e.g., a tractor). FIG. 3 shows that receiving vehicle 134 is coupled to following vehicle 136 at a hitch point, or pivot point, 137. When harvester 101 is a combine harvester, it may be that the spout 108 is not moved relative to the frame of harvester 101 during normal unloading operations. Instead, the relative position of the receiving vehicle 134 and the combine harvester 101 is changed in order to fill the receiving vessel as desired. Thus, if a front-to-back fill strategy is to be employed, then the relative position of the receiving vessel in receiving vehicle 134, relative to the combine harvester 101, is changed so that the spout 108 is first filling the receiving vehicle 134 at the front end, and then gradually fills the receiving vessel moving rearward.

In the configuration shown in FIGS. 1, 2, and 3, spout 108 illustratively has a detector, such as a stereo camera, that again attempts to identify parameters of the receiving vehicle so that the receiving vehicle can be located and so that the unloading operation can be controlled to unload material at a desired location in the receiving vehicle to accomplish a desired fill strategy. Again, as with the configuration illustrated in FIG. 1, the environment of the receiving vehicles 122 and 134 in FIGS. 2 and 3, respectively, may have dust or other obscurants making it difficult to identify the parameters of the receiving vehicle (e.g., the edges or walls that define the receiving vessel) during runtime.

Thus, the present description proceeds with respect to a system that conducts a calibration operation for the following vehicle and receiving vehicle to identify an offset between one of the receiving vehicle parameters (e.g., the front wall, either or both sidewalls, the rear wall, hoop(s), cross members, etc.) and a known reference location on the following vehicle on the following vehicle (such as the tractor hitch, point 137 the wheelbase, etc.). The offset is referred to has the calibrated offset value. The calibrated offset value can then be used during the harvesting operation to locate the receiving vehicle relative to the following vehicle without the need to identify the receiving vehicle parameters in an image that may be captured in a noisy environment (such as a dusty environment or an environment that has other obscurants) during the harvesting and unloading operation. Instead, the control system simply needs to obtain the location of the following vehicle (such as through a GNSS receiver or another location detection system) and then use that location to calculate the location of the receiving vehicle using the calibrated offset value.

For instance, by tracking the position of hitch point 137 and the route of following vehicle 136 relative to leading vehicle 101, a dynamic model can be used to identify the location of receiving vehicle 134 relative to leading vehicle 101. This location can be used to control the unloading operation (e.g., control the trajectory of material being unloaded, control the position of the vehicles, controlling the unloading subsystem, etc.).

In addition, it may be desirable to load the receiving vehicle based on the volume of material loaded into the receiving vehicle. However, the bottom of the different receiving vehicles may have different shapes, making it difficult to determine the volume of material loaded into the receiving vehicle. One example of the present description thus accesses a CAD file to identify parameters or characteristics of the receiving vehicle. Such parameters or characteristics can include a volume profile and dimensions so the receiving vehicle can be more accurately tracked and filled as desired.

Figure 4:
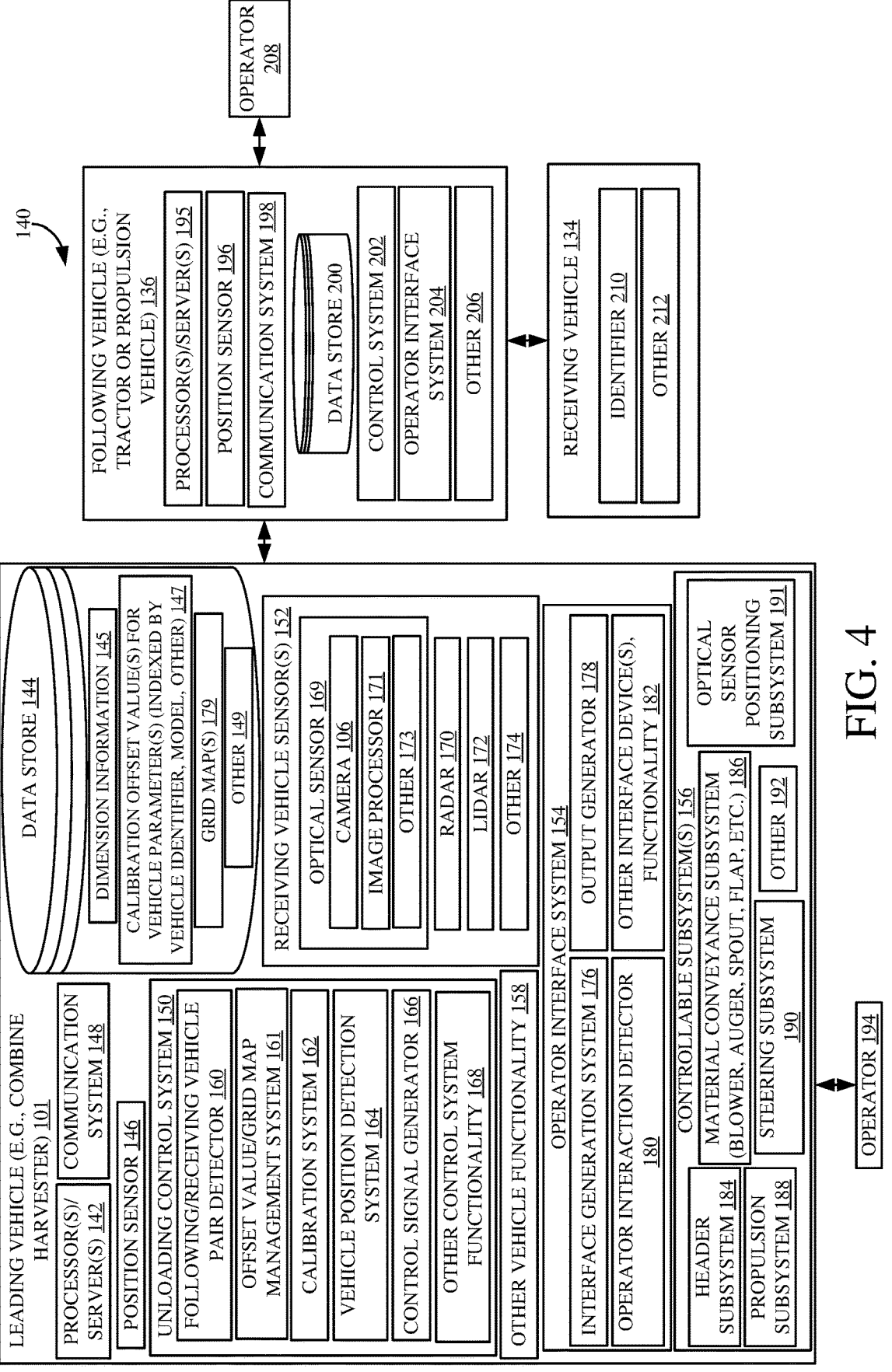
FIG. 4 is a block diagram of one example of an agricultural system.

FIG. 4 is a block diagram showing one example of an agricultural system 140 which includes leading vehicle (in the present example, a combine harvester) 101 which is followed by following vehicle (in the present example, a tractor or another propulsion vehicle) 136. Following vehicle 136 is pulling a receiving vehicle 134. It will be appreciated that while agricultural system 140 shown in FIG. 4 includes leading vehicle 101, following vehicle 136, and receiving vehicle 134 (e.g., the vehicles shown in the example illustrated in FIG. 3) other leading vehicles, following vehicles, and receiving vehicles can be used as well. The example shown in FIG. 4 is shown for the sake of example only.

Leading vehicle 101 includes one or more processors or servers 142, data store 144 (which can include machine dimension information 145, vehicle parameter offset values—e.g., calibrated offset value(s) for vehicle parameter(s), 147 which may be indexed by vehicle identification number—VIN or vehicle model number or other vehicle identifier, and other information 149), position sensor 146, communication system 148, unloading control system 150, receiving vehicle sensors 152, operator interface system 154, controllable subsystems 156, and other vehicle functionality 158. Unloading control system 150 can include following/receiving vehicle pair detector 160, offset value/grid map management system 161, calibration system 162, vehicle position detection system 164, control signal generator 166, and other control system functionality 168. Receiving vehicle sensors 152 can include optical sensor 169, RADAR sensor 170, LIDAR sensor 172, and/or other sensors 174. Optical sensor 169 can include camera 106, image processor 171, and/or other items 173. Operator interface system 154 can include interface generation system 176, output generator 178, operator interaction detector 180, and other interface devices and/or functionality 182. Controllable subsystems 156 can include header subsystem 184, material conveyance subsystem (e.g., blower, spout, flap, etc.) 186, propulsion subsystem 188, steering subsystem 190, optical sensor positioning system 191, and other items 192. FIG. 4 also shows that leading vehicle 101 can be operated by an operator 194.

Following vehicle 136 can include position sensor 196, communication system 198, one or more processors or servers 195, data store 200, control system 202, operator interface system 204, and any of a wide variety other functionality 206. FIG. 4 also shows that following vehicle 136 is operated by operator 208. Receiving vehicle 134 can include an identifier 210 and/or other items 212. Before describing the overall operation of agricultural system 140 in more detail, a description of some of the items in system 140, and their operation, will first be provided.

Position sensor 146 can be a global navigation satellite system (GNSS) receiver, a dead reckoning system, a cellular triangulation system, or any of a wide variety of other systems that identify the coordinates or location of leading vehicle 101 in a global or local coordinate system. Data store 144 can store dimension information and orientation information, such as information that identifies the location and orientation of optical sensor 106 relative to the material conveyance system (e.g., blower, spout, flap, etc.) 186. Data store 144 can store calibrated offset values described in greater detail elsewhere here, as well as other information.

Communication system 148 enables the communication of items on vehicle 101 with other items on vehicle 101, as well as communication with following vehicle 136 and other communication. For example, communication system 148 can communicate with a remote system to request a CAD file (or information generated from a CAD file) corresponding to receiving vehicle 134. Therefore, communication system 148 can be a controller area network (CAN) bus and bus controller, a cellular communication device, a Wi-Fi communication device, a local or wide area network communication device, a Bluetooth communication device, and/or any of a wide variety of devices or systems that enable communication over different types of networks or combinations of networks.

Receiving vehicle sensors 152 sense the receiving vehicle 134 and/or parameters of receiving vehicle 134. In the example discussed herein, the parameters of receiving vehicle 134 can be structural portions of receiving vehicle 134 that allow the location of the receiving area of receiving vehicle 134 to be determined. The receiving vehicle parameters, for example, may be the front wall or top front edge of the receiving vehicle 134, the side walls or top side edges of receiving vehicle 134, the rear wall or the top rear edge of receiving vehicle 134, etc. Therefore, optical sensor 169 can include camera 106 and image processor 171. During the calibration process, camera 106 can capture an image (static or video) of receiving vehicle 134 and image processor 171 can identify the location of the receiving vehicle parameters within that image. Thus, image processor 171 can identify the location of the front wall or front edge of receiving vehicle 134 within the captured image, and/or the other receiving vehicle parameters. In other examples, RADAR sensor 170 and/or LIDAR sensor 172 can be used to identify the receiving vehicle parameters in different ways. Sensors 170 and 172 can have signal processing systems that process the signals generated by RADAR and LIDAR sensors to identify the receiving vehicle parameters.

Unloading control system 150 controls the unloading process by which material conveyance subsystem 186 conveys material from leading vehicle 101 to receiving vehicle 134. Following vehicle/receiving vehicle pair detector 160 detects the identity of following vehicle 136 and receiving vehicle 134 (e.g., the identity of this tractor/cart pair). Offset value/grid map management system 161 can then determine whether calibration data (e.g., calibration offset value(s) or a grid map) have already been generated for this particular pair of vehicles. If so, offset value/grid map management system 161 can retrieve the calibration data such as calibrated offset values 147 or grid map 179 from data store 144 and provide those values to vehicle position detection system 162 so the values can be used to locate receiving vehicle 134 and to control the unloading process. Offset value/grid map management system 161 can receive vehicle parameter offset values and/or grid maps from calibration system 162 (e.g., as calibrated offset values or grid maps) or from operator inputs from operator 194 and/or operator 208 or from other places. System 161 then stores the vehicle parameter offset values 147 and/or grid maps 179. Values 147 and/or grid maps 179 can be indexed in data store 144 by an identifier for following vehicle 136 (e.g., the VIN), by the model number or other identifier, by a receiving vehicle identifier of one or both vehicles 134, 136, by a vehicle pair identifier, or otherwise. System 161 can also identify a mismatch between the vehicle parameter offset values 147 and/or grid maps 179 that have been returned and the actual vehicle parameter offset values/grid maps for the following vehicle/receiving vehicle pair. For example, if the operator of following vehicle 136 hooks up a different receiving vehicle, this can be identified and processed by system 161 to notify the operator(s) and/or to obtain the correct vehicle parameter offset values or grid maps, as is described in greater detail below with respect to FIGS. 10-12. If calibrated offset values or grid maps have not yet been generated for this following vehicle 136/receiving vehicle 134 pair, then calibration system 162 can be used to perform a calibration operation for this particular following vehicle 136/receiving vehicle 134 pair.

In one example, the calibration operation identifies the location of the receiving vehicle parameters (e.g., the front wall, rear wall, side walls, etc., of the receiving vehicle) relative to a reference location on the following vehicle 136 (e.g., relative to the hitch point 137, wheelbase, etc. of following vehicle 136). The calibration operation can also identify the location of hitch point 137 relative to the position sensor 196 or other known location on following vehicle 136. These locations are referred to as the calibrated offset values for this particular following vehicle/receiving vehicle pair. The calibrated offset values can then be stored in data store 144 for use in identifying the location of receiving vehicle 134 and controlling the unloading operation.

In another example, as described elsewhere herein (such as below with respect to FIGS. 21-24), the calibration operation can be performed to generate a grid map to identify the location of cross members or other fixtures on the receiving vehicle that may impede the unloading operation.

In yet another example, as described elsewhere herein (such as below with respect to FIGS. 25-28) a CAD file, or information generated from a CAD file, corresponding to receiving vehicle 134 can be processed and used to track receiving vehicle 134, control the unloading operation, and/or generate logistics control signals.

Vehicle position detection system 164 detects the position of leading vehicle 101 and following vehicle 136 either in terms of absolute coordinates within a global or local coordinate system, or in terms of a relative position in which the positions of vehicles 101 and 136 are determined relative to one another. For instance, vehicle position detection system 164 can receive an input from position sensor 146 on vehicle 101 and from position sensor 196 (which may also be a GNSS receiver, etc.) on following vehicle 136 to determine where the two vehicles are located relative to one another. Vehicle position detection system 164 can then detect the location of receiving vehicle 134 relative to the material conveyance subsystem 186 using the calibration offset value for this particular following vehicle/receiving vehicle pair and/or using a dynamic model as described elsewhere herein, such as below with respect to FIGS. 13A-15B.

For instance, by knowing the location of following vehicle 136, and by knowing the calibrated offset values, which locate the walls (or other receiving vehicle parameter(s)), of receiving vehicle 134 relative to a reference position on following vehicle 136, vehicle position detection system 164 can identify the location of the walls of receiving vehicle 134 relative to the material conveyance subsystem 186 on leading vehicle 101. In another example, by knowing the route and location of following vehicle 136, and by knowing the location of hitch point 137, position detection system 164 can use a dynamic model that models the kinematics of receiving vehicle 134 to identify the location of receiving vehicle 134 relative to the material conveyance subsystem 186 on leading vehicle 101. This location can then be used to determine how to control vehicles 101 and 136 to perform an unloading operation so that material conveyance system 186 loads material into receiving vehicle 134 according to a desired fill pattern.

In another example, the position, orientation, and/or pose of receiving vehicle 134 relative to leading vehicle 101 can be generated by gathering point cloud data from image(s) of receiving vehicle 134 and comparing the point cloud data to data in the CAD file. Such a comparison can be repeatedly performed to track the movement of the receiving vehicle 134 relative to leading vehicle 101.

Control signal generator 166 generates control signals that can be used to control vehicle 101 and following vehicle 136 to accomplish the desired fill pattern. For instance, control signal generator 166 can generate control signals to control the material conveyance subsystem 186 to start or stop material conveyance, to control the spout position or flat position in order to control the trajectory of material that is being conveyed to receiving vehicle 134, or to control the propulsion system 188 or steering subsystem 190. Control signal generator 166 can also generate control signals that are sent by communication system 148 to the following vehicle 136 to "nudge" the following vehicle forward or rearward relative to leading vehicle 101, to instruct the operator 208 of following vehicle 136 to perform a desired operation, or to generate other control signals.

Header subsystem 184 controls the header of the harvester. Material conveyance subsystem 186 may include a blower, spout, flap, auger, etc., which control conveyance of harvested material from leading vehicle 101 to receiving vehicle 134, as well as the trajectory of such material. Propulsion subsystem 188 can be an engine that powers one or more different motors, electric motors, or other systems that provide propulsion to leading vehicle 101. Steering subsystem 190 can be used to control the heading and forward/backward directions of travel of leading vehicle 101. Optical sensor positioning subsystem 191 can be a controllable actuator that points or aims or otherwise controls the orientation of optical sensor 169 to change the location of the field of view of sensor 169 (or other sensors).

Operator interface system 154 can generate interfaces for operator 194 and receive inputs from operator 194. Therefore, operator interface system 154 can include interface mechanisms such as a steering wheel, joysticks, pedals, buttons, displays, levers, linkages, etc. Interface generation system 176 can generate interfaces for interaction by operator 194, such as on a display screen, a touch sensitive displays screen, or in other ways. Output generator 178 outputs that interface on a display screen or in other ways and operator interaction detector 180 can detect operator interactions with the displayed interface, such as the operator actuating icons, links, buttons, etc. Operator 194 can interact with the interface using a point and click device, touch gestures, speech commands (where speech recognition and/or speech synthesis are provided), or in other ways.

As mentioned above, position sensor 196 on following vehicle 136 may be a global navigation satellite system (GNSS) receiver, a dead reckoning system, a cellular triangulation system, or any of a wide variety of other systems that provide coordinates of following vehicle 136 in a global or local coordinate system, or that provide an output indicating the position of following vehicle 136 relative to a reference point (such as relative to leading vehicle 101), etc. Communication system 198 allows the communication of items on vehicle 136 with one another, and also provides for communication with leading vehicle 101, and/or other systems. Therefore, communication system 198 can be similar to communication system 148 discussed above, or different. It will be assumed for the purpose of the present discussion that communication systems 148 and 198 are similar, although this is for the sake of example only. Data store 200 can store dimension data which identify different dimensions of following vehicle 136, the location and/or orientation of different sensors on vehicle 136, kinematic information describing vehicle 134 and/or vehicle 136, and other information. Control system 202 can be used to receive inputs and generate control signals. The control signals can be used to control communication system 198, operator interface system 204, data store 200, the propulsion and/or steering subsystem on following vehicle 136, and/or other items. Operator interface system 204 can also include operator interface mechanisms, such as a steering wheel, joysticks, buttons, levers, pedals, linkages, etc. Operator interface system 204 can also include a display screen that can be used to display operator interfaces for interaction by operator 208. Operator 208 can interact with the operator interfaces using a point and click device, touch gestures, voice commands, etc.

Identifier 210 on receiving vehicle 134 may be visual indicia, or electronic indicia, or another item that specifically identifies receiving vehicle 134. Identifier 210 may also simply be the make or model of receiving vehicle 134, or another marker that identifies receiving vehicle 134.

FIG. 5 is a block diagram showing one example of calibration system 162 in more detail. In the example shown in FIG. 5, calibration system 162 includes trigger detector 220, data store interaction system 222, operator prompt generator 224, receiving vehicle parameter locator system 226, parameter location output generator 228, grid map processing system 229, and other calibration system functionality 230. Receiving vehicle parameter locator system 226 includes receiving vehicle parameter selector 232, leading vehicle reference locator system 234, vehicle-to-vehicle location system 236, cross member locator system 237, following vehicle reference locator system 238, overlay generator 239, and other locator functionality 240. Before describing the operation of calibration system 162 in more detail, a description of some of the items in calibration system 162, and their operation, will first be described.

Trigger detector 220 detects a trigger indicating that calibration system 162 is to perform a calibration operation to identify the calibrated offset value that locates one or more receiving vehicle parameters (front wall, rear wall, side walls, etc.) relative to a reference point on a following vehicle (e.g., a towing vehicle or tractor that is providing propulsion to the receiving vehicle) or to generate a grid map corresponding to the receiving vehicle. In one example, trigger detector 220 detects an operator input indicating that the operator wishes to perform a calibration operation. In another example, the receiving vehicle sensors 152 (shown in FIG. 4) may detect a new following vehicle/receiving vehicle pair for which no calibrated offset value or grid map has been generated. This may trigger the calibration system 162 to perform a calibration operation. The calibration system may be triggered by leading vehicle 101 beginning to perform a harvesting operation (e.g., where the harvesting functionality is engaged) or for other reasons.

Operator prompt generator 224 then prompts the operators of one or more of leading vehicle 101 and following vehicle 136 to position receiving vehicle 134 so that the receiving vehicle parameter may be detected by one or more of the receiving vehicle sensors 152 and/or so a grid map can be generated for receiving vehicle 134. For instance, where the receiving vehicle sensors 152 include an optical sensor (such as camera 106) then the prompt may direct the operators of the vehicles to move the vehicles in place relative to one another so that the camera 106 can capture an image of the receiving vehicle parameters and so that those parameters and/or cross members or fixtures can be identified by image processor 171 within the image.

Figure 6:
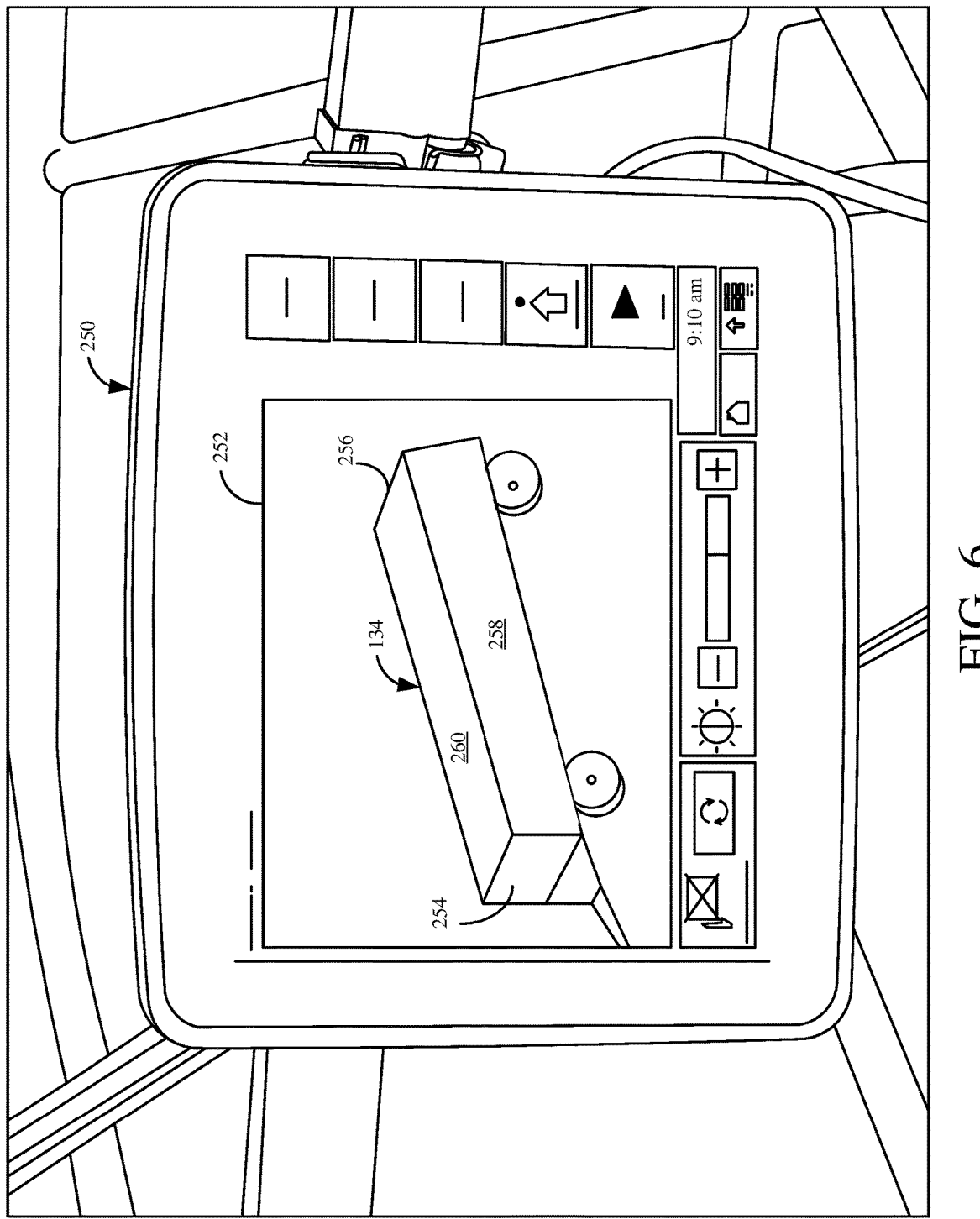
FIG. 6 is one example of an operator interface display.

FIG. 6, for instance, shows one example of a user interface display device 250 displaying a display 252 that can be generated for the operator of either leading vehicle 101 or following vehicle 136 or both. Operator interface display 252 displays an image (static or video) taken by camera 106. In the example shown in FIG. 6, the operators have moved the vehicles into position relative to one another so that an image of receiving vehicle 134 can be captured by camera 106. In the example shown in FIG. 6, receiving vehicle 134 includes a front wall 254, a rear wall 256, a near wall 258 (which is near camera 106), and a far wall 260 which is further from camera 106 than near wall 258). The top edges of each of the walls 254-260 are also visible in the image illustrated in display 252.

Returning to the description of FIG. 5, data store interaction system 222 can interact with data store 144 to obtain dimension information indicating the location and orientation of camera 106 (or other receiving vehicle sensors 152) that is used to detect the receiving vehicle parameters. In one example, image processor 171 then processes the image to identify the receiving vehicle parameters (such as the walls 254-260) within the captured image or data to generate a grid map. Grid map processing system 229 can generate a grid map for the receiving vehicle that can be used to identify the locations of cross members or other fixtures (as described in greater detail below with respect to FIGS. 21-24). Receiving vehicle parameter locator system 226 can then process the location of the receiving vehicle parameters in the captured image to identify the location of the receiving vehicle parameters relative to a reference point on the following vehicle (e.g., tractor) 134. In doing so, receiving vehicle parameter selector 232 selects which receiving vehicle parameter is to be processed first (such as front wall 254, rear wall 256, or side walls 258 and/or 260). Leading vehicle reference locator system 234 then identifies the location of the selected parameter (for purposes of the present description it will be assumed that the selected receiving vehicle parameter is front wall 254) relative to a reference point on the leading vehicle 101. For instance, system 234 can identify the location of the front wall 254 of receiving vehicle 134 relative to the location of the GPS receiver (or other position sensor) 146 on leading vehicle 101. Vehicle-to-vehicle location system 236 then communicates with the following vehicle 136 to identify the location of leading vehicle 101 relative to the location of following vehicle 136. In particular, system 236 may identify the location of the position sensor 146 on leading vehicle 101 relative to the location of the position sensor 196 on following vehicle 136.

Cross member locator system 237 can be used to identify the locations of cross members so the unloading operation can be controlled to avoid dumping material onto the cross members. System 237 is described in greater detail elsewhere herein. Following vehicle reference locator system 238 then identifies the location of the selected parameter (the front wall 254) of receiving vehicle 134 relative to the reference point on following vehicle 136. For instance, where the reference point on following vehicle 136 is the hitch point 137, then following vehicle reference locator system 238 first identifies the location of front wall 254 relative to the position sensor 196 on following vehicle 136 and then, using dimension information or other information about following vehicle 136, identifies the offset between the reference position (e.g., the hitch point 137) on following vehicle 136 and the position sensor 196 on following vehicle 136. Once this offset is known, then the location of the front wall 254 of receiving vehicle 134 to the hitch can be calculated by following vehicle reference locator system 238. The result is that system 238 generates an output indicating the location of the selected receiving vehicle parameter (in this case the front wall 254 of receiving vehicle 134) relative to the reference point on the following vehicle 136 (in this case the hitch of following vehicle 136). This is referred to herein as the calibrated offset value.

Overlay generator 239 can be used to overlay the calculated locations of receiving vehicle parameters (including the walls, cross members, etc.) over an optical image of the receiving vehicle 134 so the operator can easily see if the calculated locations coincide with those on the image. If not, the operator can illustratively interact with the image (e.g., by moving items on the overlay so they match the image), and the locations of the moved overlay items can then be connected.

Parameter location output generator 228 generates an output from calibration system 162 to store the calibration offset value in data store 144 for his particular following vehicle 136/receiving vehicle 134 pair. Thus, when vehicle position detection system 164 on leading vehicle 101 encounters this following vehicle 136/receiving vehicle 134 pair during the harvesting operation, the calibrated offset value can be retrieved and used in controlling the unloading operation during which harvested material is unloaded from leading vehicle 101 into receiving vehicle 134.

Figure 7A:
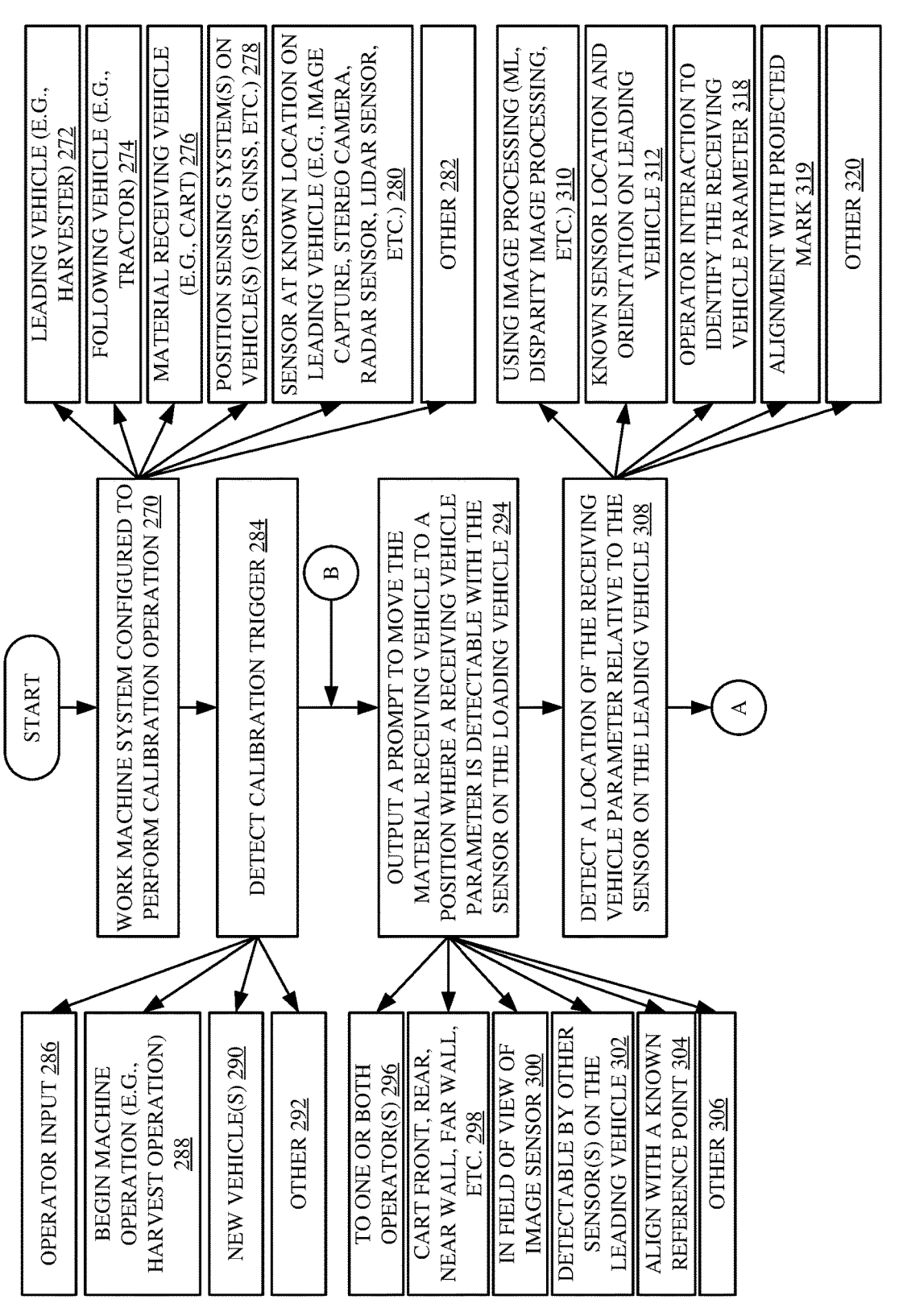

FIGS. 7A and 7B (collectively referred to herein as FIG. 7) show a flow diagram illustrating one example of the operation of agricultural system 140 in performing a calibration operation to identify the calibrated offset value corresponding to one or more receiving vehicle parameters of receiving vehicle 134. It will be noted that a calibration operation to generate a grid map is described in greater detail below with respect to FIGS. 22A and 22B. Continuing with respect to FIG. 7, it is first assumed that the work machines are configured so that a calibration operation can be performed, as indicated by block 270 in the flow diagram of FIG. 7. In one example, the leading vehicle 101 is a harvester as indicated by block 272 and the following vehicle is a tractor or other towing vehicle as indicated by block 274. Also in the example, the receiving vehicle is a grain cart as indicated by block 276. Also, in the present example, it is assumed that both the leading vehicle and the following vehicle have a position sensing system 146, 196, respectively, as indicated by block 278 in the flow diagram of FIG. 7. Further, it is assumed that leading vehicle 101 has a receiving vehicle sensor 152 that is at a known location and orientation on leading vehicle 101, as indicated by block 280 in the flow diagram of FIG. 7. The receiving vehicle sensor 152 may be an image capture device, such as a stereo camera 106, a RADAR sensor 170, a LIDAR sensor 172, etc. The work machines may be configured in other ways to perform the calibration operation as well, as indicated by block 282 in the flow diagram of FIG. 7.

Detecting a calibration trigger is indicated by block 284 in the flow diagram of FIG. 7. In one example, operator 194 may provide an operator input through operator interface system 154 to trigger a calibration operation for the following vehicle 136/receiving vehicle 134 pair. Detecting a trigger based on an operator input is indicated by block 286 in the flow diagram of FIG. 7. Calibration trigger detector 220 may detect a trigger based upon leading vehicle 101 beginning to perform the harvesting operation, which may be detected by detecting engagement of the header or other harvesting functionality, or in another way. Detecting a trigger based upon the beginning of the machine operation is indicated by block 288 in the flow diagram of FIG. 7. The calibration trigger may be detected based on following vehicle/receiving vehicle pair detector 160 detecting that the current following vehicle/receiving vehicle pair is a new pair for which no calibration offset data has been generated. Detecting a trigger based on the detection of a new vehicle (one for which no calibration offset data is stored) is indicated by block 290 in the flow diagram of FIG. 7. The calibration trigger can be detected in a variety of other ways, based upon other trigger criteria as well, as indicated by block 292 in the flow diagram of FIG. 7.

Once the calibration operation has been triggered, operator prompt generator 224 generates a prompt that can be displayed or otherwise output to operator 194 and/or operator 208 by operator interface systems 154, 204, respectively. The prompt prompts the operator, to move the vehicles so the material receiving vehicle 134 is in a position where at least one of the receiving vehicle parameters is detectable by the receiving vehicle sensor(s) 152 on leading vehicle 101. Outputting such a prompt is indicated by block 294 in the flow diagram of FIG. 7, and outputting the prompt to one or both operators is indicated by block 296. Again, the receiving vehicle parameters to be detected may include the front wall 254, rear wall 256, near wall 258, far all 260, etc., as indicated by block 298 in the flow diagram of FIG. 7.

Therefore, for instance, the operators 194, 208 of the vehicles 101, 136 may position receiving vehicle 134 so that the receiving vehicle parameter to be located is in the field of view of the image sensor or camera 106, as indicated by block 300 in the flow diagram of FIG. 7. In another example, the receiving vehicle parameter to be located is detectable by one of the other sensors 170-174 on leading vehicle 101, as indicated by block 302 in the flow diagram of FIG. 7. In yet another example, the receiving vehicle parameter to be located (e.g., the front wall 254 of vehicle 134) is aligned with a known point of reference on leading vehicle 101. For instance, it may be that the spout 108 on the combine harvester 101 is at a known location relative to the position sensor 146 on combine harvester 101. In that case, the front wall 254 of receiving vehicle 134 may be aligned with the spout 108 so that the location of front wall 254, relative to the reference point (e.g., spout 108) on leading vehicle 101 is known. Aligning the receiving vehicle parameter to be located with a known reference point on the leading vehicle 101 is indicated by block 304 in the flow diagram of FIG. 7. The prompt can be output to the operators in other ways as well, as indicated by block 306 in the flow diagram of FIG. 7.

Leading vehicle reference locator system 234 then detects a location of the receiving vehicle parameter (e.g., front wall 254) relative to the sensor 152 on the leading vehicle as indicated by block 308 in the flow diagram of FIG. 7. In one example, camera 106 captures an image of receiving vehicle 134 and image processor 171 processes the image captured by camera 106 using a machine learned processor, or disparity image processor, etc., in order to identify the location of the receiving vehicle parameter (e.g., front wall 254) in the captured image, as indicated by block 310. System 234 can then obtain data identifying the known sensor location and/or orientation of the receiving vehicle sensor 152 (e.g., camera 106) on leading vehicle 101, as indicated by block 312. System 234 uses the location of the front wall 254 in the captured image and the location and orientation of the camera 106 to calculate the location of front wall 254 relative to camera 106.

Figure 8:
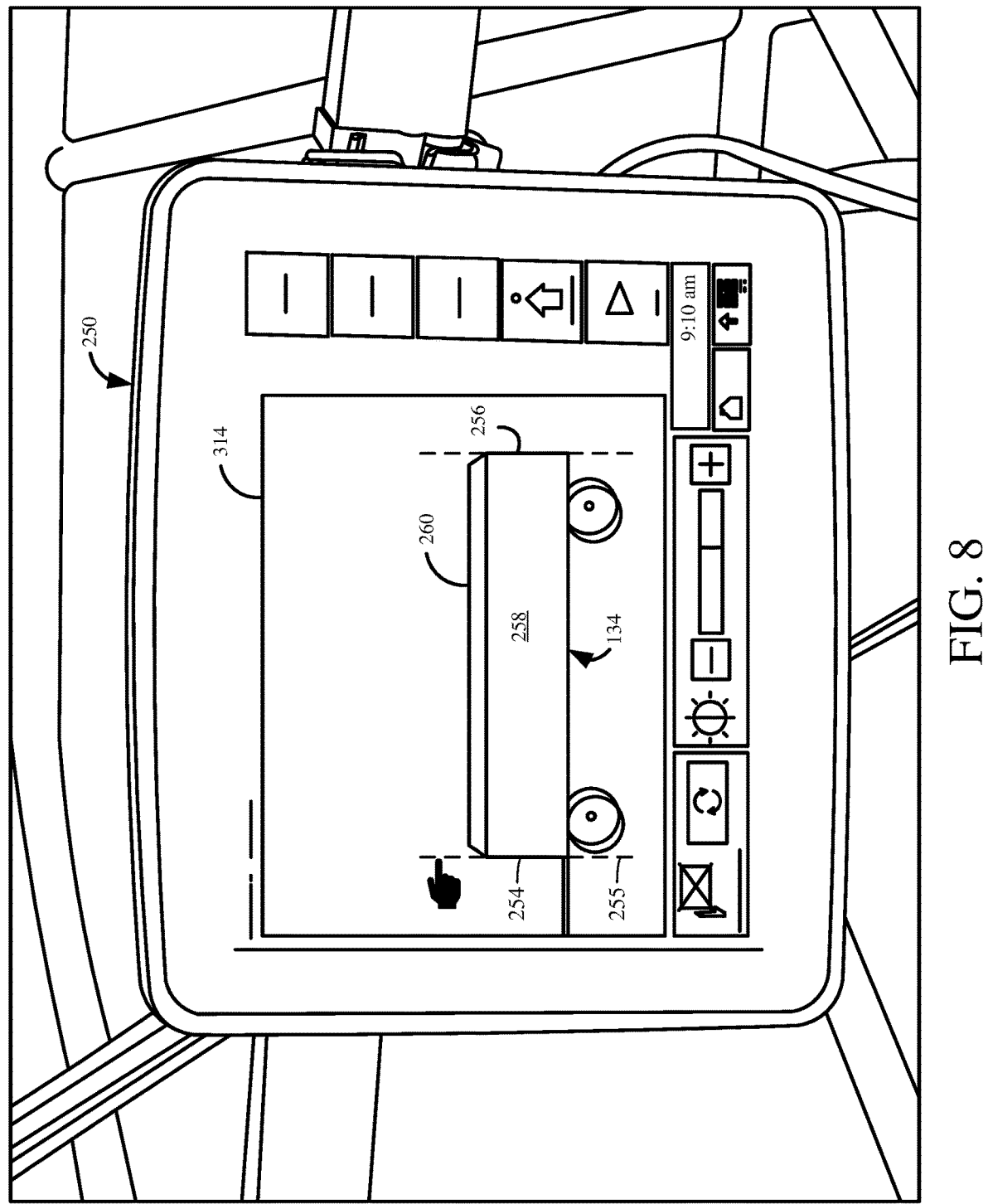
FIGS. 8 and 9 show examples of operator interface displays.

It will be noted that, instead of using image processing to identify the location of front wall 254 (or another receiving vehicle parameter) in the captured image, an operator input can be used to identify the receiving vehicle parameter in the captured image. FIG. 8, for instance, shows one example of an operator interface display 314 on a display device 250 displaying a side view of the receiving vehicle 134. The side view is slightly elevated so that the front wall 254, rear wall 256, near wall 258, and far wall 260, of receiving vehicle 134 are all visible. In the example shown in FIG. 8, operator 194 can use a touch gesture (or point and click device) to trace along the front wall 254 (as indicated in FIG. 8) to identify the location of front wall 254 in the captured image. Also, of course, where the receiving vehicle parameter to be located is the rear wall, or the side walls, operator 194 can trace along those walls.

In another example, system 226 can project a line on the video displayed to the operator and the operator can then align the receiving vehicle parameter (e.g., front wall 254) with the line. For example, in FIG. 8, system 226 can project line 255 on the display 314 (which may be a live video feed from camera 106) so the operator(s) can align front wall 254 with line 255. System 226 knows the pixels used to display line 255. Therefore, once front wall 254 is aligned with line 255 (which can be indicated by an operator input), system 226 will know the location of front wall 254 in the image 314.

Figure 9:
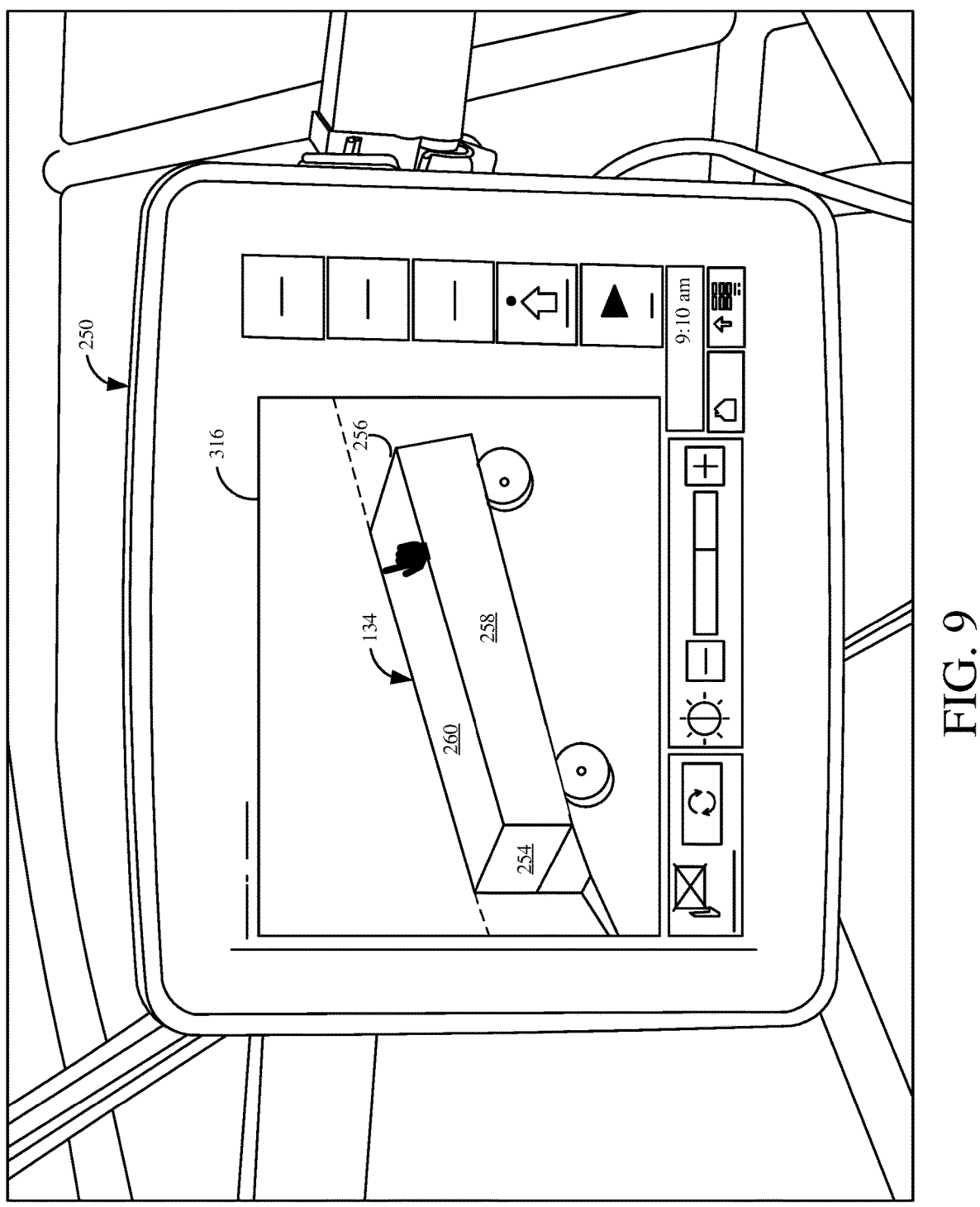

FIG. 9, for example, is similar to FIG. 8 and similar items are similarly numbered. However, the view of receiving vehicle 134 is slightly more elevated and from a slightly different perspective than that shown in FIG. 8. In FIG. 9, it can be seen that the operator has traced along the top edge of the far wall 260 (or a line has been projected at that location and wall 260 has been aligned with the line) to identify the location of the far wall 260 in the displayed image 316. Identifying the receiving vehicle parameter (e.g., one of walls of the receiving vehicle or top edge of the wall, etc.) based on operator interaction with the displayed image is indicated by block 318 in the flow diagram of FIG. 7. Projecting a line and aligning the receiving vehicle parameter with the line is indicated by block 319. Detecting a location of the receiving vehicle parameter in the image and relative to the camera 106 can be done in other ways as well, as indicated by block 320.

Again, once the location of the receiving vehicle parameter is identified in the image, then using the known location and orientation of the camera 106, the location of the receiving vehicle parameter can be identified relative to one or more other reference points on receiving vehicle 101.

Calculating or otherwise obtaining the location of the receiving vehicle parameter relative to the location of a reference point on the leading vehicle 101 is indicated by block 322 in the flow diagram of FIG. 7. In one example, the reference point on leading vehicle 101 is the location of the position sensor 146. Thus, leading vehicle reference locator system 234 identifies the location of the receiving vehicle parameter (e.g., front wall 254) on receiving vehicle 134 relative to the location of the position sensor 146 on leading vehicle 101, as indicated by block 324 in the flow diagram of FIG. 7. Of course, where the reference point is a different reference point on leading vehicle 101, then the location of the receiving vehicle parameter (e.g., front wall 254) relative to that reference point can be calculated as well. Identifying the location of the receiving vehicle parameter relative to the location of another reference point on leading vehicle 101 is indicated by block 236 in the flow diagram of FIG. 7.

Vehicle-to-vehicle location system 236 uses communication system 148 and communication system 198 to communicate with one another so that the position of following vehicle 136 can be identified relative to the position of the leading vehicle 101 as indicated by block 328. In one example, the position of one vehicle relative to the other can be calculated using the absolute positions of both vehicles sensed by the corresponding position sensors 146 and 196. In another example, other sensors can be used (such as RADAR, LIDAR, etc.) to detect the relative position of the two vehicles.

Once vehicle-to-vehicle location system 236 identifies the relative locations of the two vehicles relative to one another, then following vehicle reference locator 238 can identify the location of the receiving vehicle parameter (e.g., front wall 254) relative to the coordinates of a reference point on the following vehicle 136, as indicated by block 330 in the flow diagram of FIG. 7. The reference point on following vehicle 136 can be any of a wide variety of different reference points, such as the location of the position sensor 196, the location of a hitch or wheelbase, etc. Determining the location of the receiving vehicle parameter (e.g., front wall 254) relative to the location of position sensor 196 on following vehicle 136 is indicated by block 332 in the flow diagram of FIG. 7. Determining the location of the receiving vehicle parameter (e.g., front wall 254) relative to the hitch or wheelbase of the following vehicle 136 can be done by retrieving vehicle dimension information from data store 200 or data store 144 or elsewhere, where the dimension information identifies the location of the reference point relative to the position sensor 196. Identifying the location of the receiving vehicle parameter relative to another reference point on following vehicle 136 in this way is indicated by block 334 in the flow diagram of FIG. 7. The location of the receiving vehicle parameter (e.g., front wall 254) relative to the location of a reference point on the following vehicle 136 can be done in a wide variety of other ways as well, as indicated by block 336 in the flow diagram of FIG. 7.

When more receiving vehicle parameters (e.g., rear wall, side walls, etc.) are to be located relative to the reference point on following vehicle 136, as indicated by block 338 in the flow diagram of FIG. 7, processing reverts to block 294 where the operators are prompted to position the two vehicles relative to one another so that the next receiving vehicle parameter can be detected by the receiving vehicle sensors 152 (e.g., camera 106) on leading vehicle 101. It will be noted that, in one example, the location of the receiving vehicle parameters relative to a reference position on the following vehicle 136 can be determined or calculated in a priority order. The priority may be to first locate the front wall 254, then the rear wall 256, then the near wall 258 and finally the far wall 260. In another example, only the front wall 254 is located and then known dimensional information (e.g., the length of the receiving vehicle 134) is used to identify the location of the rear wall. Similarly, a center point on the front wall 254 can be located and then width information that defines the width dimension of receiving vehicle 134 can be used to locate the side walls 258 and 260. In yet another example, the top edges of the walls 254-260 are identified to define the material-receiving opening in material receiving vehicle 134. These are just examples of the different receiving vehicle parameters that can be located relative to a reference point on the following vehicle 134. Other receiving vehicle parameters can be located as well, and they can be located in different orders.

Parameter location output generator 228 can generate an output indicative of the locations of the receiving vehicle parameters relative to the reference point on the following vehicle 134, as calibrated offset values, to data store interaction system 222 which can store the calibrated offset values in data store 144, data store 200, or elsewhere, where the values can be retrieved by leading vehicle 101 when performing the harvesting operation, and when locating the receiving vehicle 134 during an unloading operation. Storing the receiving vehicle parameter locations relative to the reference point on the following vehicle 136 is indicated by block 340 in the flow diagram of FIG. 7.

In one example, the calibrated offset values are stored and indexed by the particular following vehicle 136/receiving vehicle 134 pair for which the calibrated offset values are calculated, as indicated by block 342 so that the values can be looked up during later operation, when a harvester is unloading to this particular following vehicle 136/receiving vehicle 134 pair (or a similar pair). In one example, the calibration offset values are stored locally in data store 144 on vehicle 101, or locally in data store 200 on following vehicle 136, as indicated by block 344. In another example, the calibrated offset values can be stored remotely in a cloud-based system, in another remote server architecture, on a different machine, or in a different system which can then be accessed by leading vehicle 101 at an appropriate time, as indicated by block 346. In another example, the calibrated offset values can be transmitted to other vehicles (such as other harvesters, etc.) so that the calibration need not be performed by all of the other leading vehicles 101 which may encounter this particular following vehicle 136/receiving vehicle 134 pair. Sending the calibrated offset values to other vehicles is indicated by block 348 in the flow diagram of FIG. 7. The calibrated offset values can be stored in other ways, and used in other ways (such as in controlling the unloading operation during a subsequent process), as indicated by block 350 in the flow diagram of FIG. 7. Retrieving and using the calibrated offset values to control an unloading operation is indicated by block 352 in the flow diagram of FIG. 7.

Figure 10:
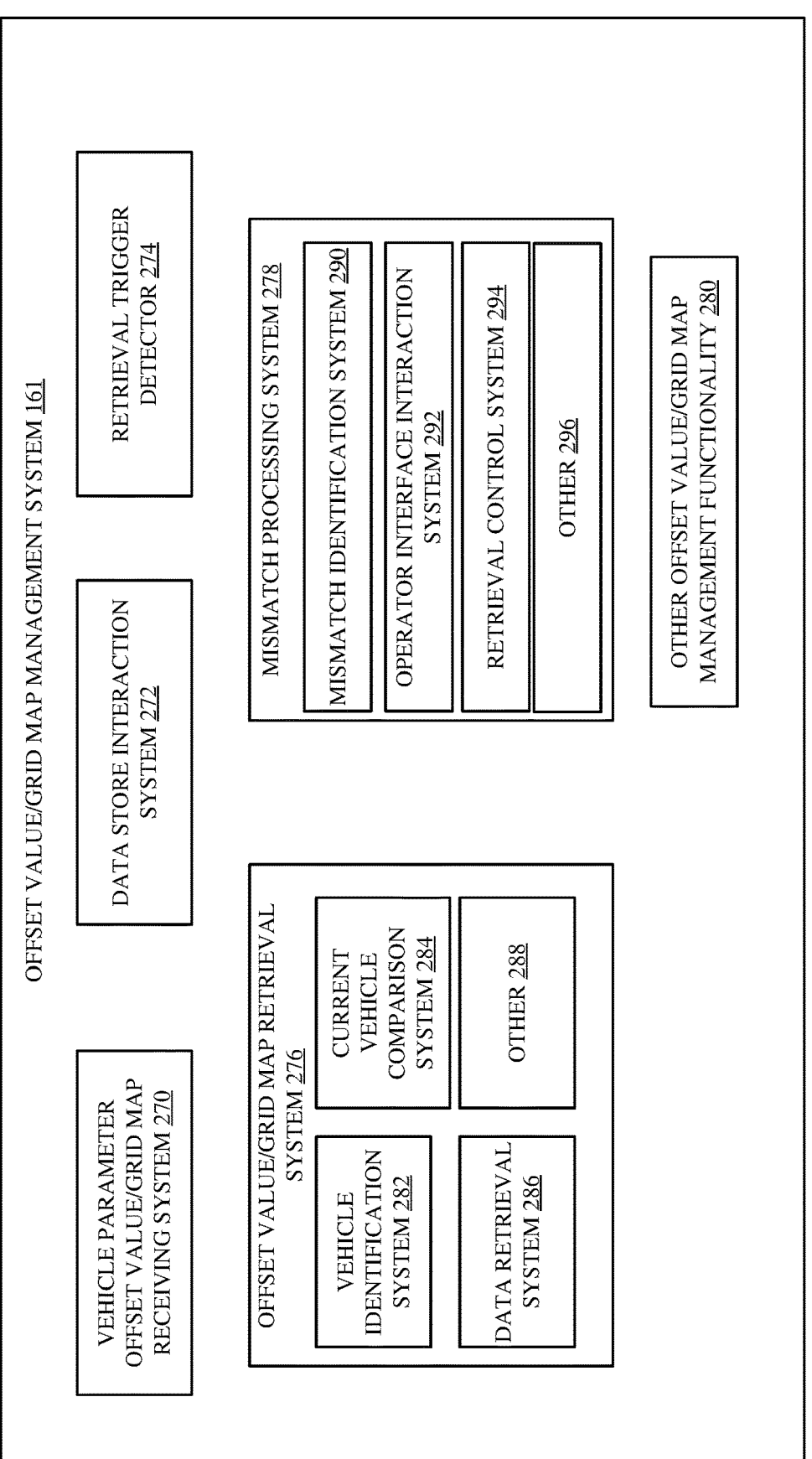
FIG. 10 is a block diagram of one example of an offset value management system in more detail.

FIG. 10 is a block diagram showing one example of offset value/grid map management system 161 in more detail. In the example shown in FIG. 10, offset value/grid map management system 161 includes vehicle parameter offset value/grid map receiving system 270, data store interaction system 272, retrieval trigger detector 274, offset value/grid map retrieval system 276, mismatch processing system 278, and other offset value/grid map management functionality 280. Offset value/grid map retrieval system 276 can include vehicle identification system 282, current vehicle comparison system 284, data retrieval system 286, and other items 288. Mismatch processing system 278 can include mismatch identification system 290, operator interface interaction system 292, retrieval control system 294, and other items 296. Before describing the operation of offset value/grid map management system 161 in more detail, a description of some of the items in system 161, and their operation, will first be provided.

Vehicle parameter offset value receiving system 270 receives vehicle parameter offset values so that they can be stored and managed. In one example, system 270 controls operator interface system 154 to generate an operator interface that allows operator 194 to enter the vehicle parameter offset values, manually. In another example, system 270 can use communication system 148 to communicate with operator interface system 204 on vehicle 136 to generate an operator interface so that operator 208 can enter the vehicle parameter offset values manually. Those values can then be communicated back to vehicle parameter offset value receiving system 270. In another example, system 270 can receive, as the vehicle parameter offset values, the calibrated offset values from calibration system 162.

System 270 can then use data store interaction system 272 to interact with data store 144 to store the vehicle parameter offset values as calibrated offset values 147 and/or grid map 179. In one example, values 147/grid maps 179 are indexed by a vehicle identifier, such as an identifier that identifies the following vehicle 136/receiving vehicle 134 pair, by the VIN of the following vehicle, by a vehicle identifier that identifies the receiving vehicle 134, or in other ways. The values 147/grid maps 179 can be stored in a look-up table or in another data structure.

Thus, when following/receiving vehicle pair detector 160 encounters following vehicle 136/receiving vehicle 134 pair (such as when a pair approaches leading vehicle 101 for unloading), the corresponding vehicle identifier can be obtained and the vehicle parameter offset values can be easily obtained from data store 144 using the corresponding vehicle identifier. In another example, system 270 uses data store interaction system 272 to store the vehicle parameter offset values based upon the model number of the receiving vehicle 134 or a combination of the model numbers of the following vehicle 136 and receiving vehicle 134. In this way, when leading vehicle 101 encounters a following vehicle/receiving vehicle pair that is not identically the same as a pair for which vehicle parameter offset values have been generated, but which has the same vehicle model numbers, then the vehicle parameter offset value(s) for that combination of model numbers (the same model number for the following vehicle 136, and the same model number for the receiving vehicle 134) can be used to control the unloading operation.

Retrieval trigger detector 274 detects a trigger indicating that a set of vehicle parameter offset values 147 and/or grid maps 179 should be retrieved. For example, operator 194 may provide an input indicating that it is time to unload into a new following vehicle 136/receiving vehicle 134 pair. In that case, trigger detector 274 detects this as a trigger indicating that it is time to obtain the vehicle parameter offset values or grid maps for this particular following vehicle 136/receiving vehicle 134 pair. In another example, the control system 202, or operator 208, of following vehicle 136 may send a signal to leading vehicle 101 indicating that following vehicle 136 is approaching leading vehicle 101 for an unloading operation. In that case, trigger detector 274 can detect that a new following vehicle 136/receiving vehicle 134 pair is approaching and so the vehicle parameter offset values or a grid map corresponding to that vehicle pair should be obtained. In yet another example, trigger detector 274 may detect that the clean grain tank of the leading vehicle 101 is nearly full so that an unloading operation needs to be commenced in the near future, in which case the vehicle parameter offset values or grid map can be obtained to prepare for the unloading operation.

Once triggered, offset value retrieval system 276 retrieves the vehicle parameter offset values and/or grid map for the following vehicle 136/receiving vehicle 134 pair to which the harvested material is to be unloaded, based on a vehicle identifier. Vehicle identification system 282 identifies a vehicle identifier corresponding to the following vehicle 136/receiving vehicle 134 pair and current vehicle comparison system 284 determines whether that pair is the same as the pair for which the vehicle parameter offset values or grid map are currently loaded into the control system. If so, then no additional vehicle parameter offset values and/or grid map need to be retrieved. If not, however, then data retrieval system 268 uses data store interaction system 272 to retrieve the vehicle parameter offset values 147 and/or grid map 179 for this particular following vehicle 136/receiving vehicle 134 pair. Those offset values or grid map are then loaded into vehicle position detection system 164 so that the unloading operation can be controlled using the correct vehicle parameter offset values and/or grid map.

Mismatch processing system 278 can detect whether there is a mismatch between the vehicle parameter offset values that are being used for the current following vehicle 136/receiving vehicle 134 pair and the actual offset values or grid map for that vehicle pair. For instance, it may be that operator 208 of following vehicle 136 has switched receiving vehicles (e.g., switched grain carts). In that case, the vehicle parameter offset values or grid map that are stored and correspond to the VIN number of the following vehicle 136 may not be accurate because they correspond to a different receiving vehicle. Therefore, mismatch identification system 290 identifies that the vehicle parameter offset values or grid map are inaccurate.

Identifying a mismatch can be done in a number of different ways. For instance, system 290 may identify the receiving vehicle 134, itself, and determine that the identified receiving vehicle 134 is not the same as the receiving vehicle that is assumed to be connected to following vehicle 136. As one example, where the receiving vehicle 134 may include a unique identifier (such as visual indicia, a visual signature or visual characteristic extracted from visual features of the receiving vehicle 134, a transmission device that transmits a unique identifier, or that stores a unique identifier that can be read by mismatch identification system 290), then the identity of the particular receiving vehicle 134 can be compared against the identity of the receiving vehicle that is assumed to be connected to following vehicle 136 to determine whether they are the same.

If a mismatch is identified (e.g., the receiving vehicle 134 that is actually being used is not the same as that to which the vehicle parameter offset values or grid map correspond and that are currently loaded into vehicle position detection system 164) then operator interface interaction system 292 can generate a notification to operator 194 and/or operator 208. The notification may identify the mismatch, and the notification may also include other information. For instance, the notification may indicate that a calibration operation is automatically being performed, or the notification may provide an operator actuatable button (such as an icon) that can be actuated by one of the operators 194, 208 in order to initiate a calibration operation. In another example, the operator interface can include data input fields which allow one of the operators to input the vehicle parameter offset values or grid map for the receiving vehicle 134 that is being used.

It may also be that there are already vehicle parameter offset values 147 or grid maps 179 stored for this particular following vehicle 136/receiving vehicle 134 pair (even though it was initially assumed that a different receiving vehicle 134 was connected to following vehicle 136). In that case, retrieval control system 294 can retrieve the already-existing vehicle parameter offset values 147 and/or grid maps 179 for this particular following vehicle 136/receiving vehicle 134 pair.

In another example, retrieval control system 294 can obtain the vehicle parameter offset values and/or grid map from calibration system 162, once the calibration operation has been performed. The retrieval control system 294 can retrieve the vehicle parameter offset values or grid maps from the operator interface, once they have been manually entered. The retrieval control system 294 can retrieve the vehicle parameter offset values or grid maps for the current following vehicle 136/receiving vehicle 134 pair in other ways as well. Mismatch processing system 278 can then output the correct calibrated offset values or grid maps to vehicle position detection system 164 for use in loading material into the receiving vehicle 134.

Figure 11B:
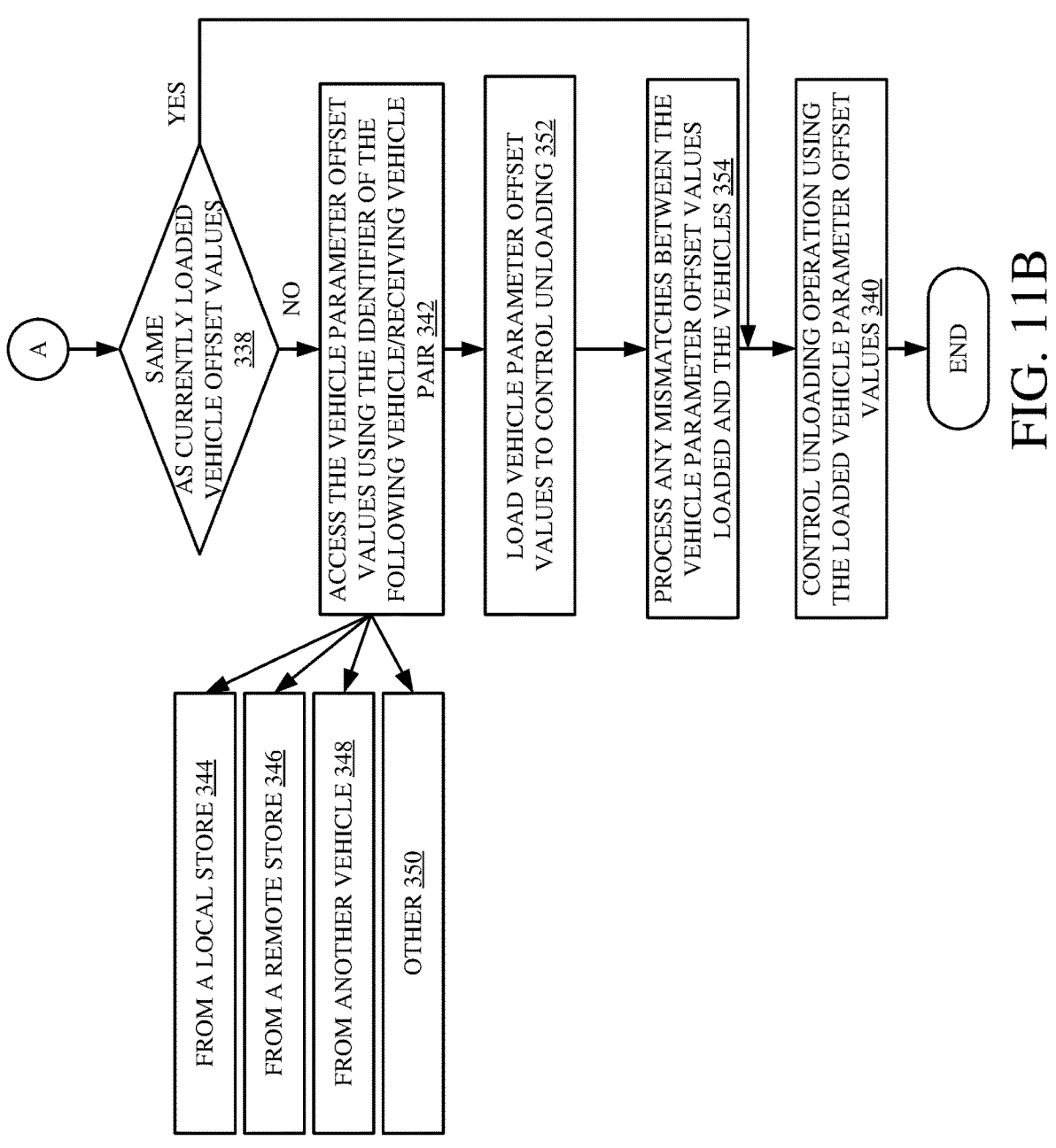

FIGS. 11A and 11B (collectively referred to as FIG. 11) show a flow diagram illustrating one example of the operation of offset value/grid map management system 161 in managing offset values. Similar management processing can be performed for managing grid maps as well. It is first assumed that vehicle identification system 282 obtains a vehicle identifier corresponding to the following vehicle 136/receiving vehicle 134 pair, as indicated by block 291. The vehicle identifier can be for the vehicle pair or for one or both vehicles 136, 134 individually. The vehicle identifier can be input by an operator as indicated by block 293, or automatically detected, as indicated by block 295. The vehicle identifier can be received from the following vehicle 136, as indicated by block 297 or in other ways, as indicated by block 299.

The vehicle parameter offset values (which identify an offset between receiving vehicle parameter and a reference point on following vehicle 136) for the receiving vehicle and following vehicle are detected, for different vehicle parameters. Detecting the vehicle parameter offset values for the different vehicle parameters is indicated by block 298 in the flow diagram of FIG. 11. In one example, the vehicle parameter offset values can be obtained by accessing dimension information 145 in data store 144, and calculating dimensional information indicative of the vehicle parameter offset values, as indicated by block 300. In another example, a display screen can be generated on a user interface on the following vehicle 136 or leading vehicle 101, or both, for manual entry of the vehicle parameter offset values, as indicated by block 302. In yet another example, the vehicle parameter offset values are obtained by calibration system 162 performing a calibration operation, as indicated by block 304. In one example, the vehicle parameter offset values include one or more positions of reference locations on following vehicle 136, as indicated by block 306 in the flow vehicle of FIG. 11, as well as the positions defining the receiving vessel on the receiving vehicle 134 (e.g., the positions of receiving vehicle parameters) relative to the reference locations on vehicle 136, as indicated by block 308.

The machine or vehicle parameters for which offset values are obtained can be parameters for both the following vehicle 136 and/or the receiving vehicle 134. For instance, vehicle parameter offset values can be obtained for the location of the front wall, side walls, and rear wall of the receiving vehicle 134 relative to one or more different reference points on the following vehicle 136. The receiving vehicle parameter offset values and the following vehicle parameter offset values can be detected in other ways as well, as indicated by block 310 in the flow diagram of FIG. 11.

The vehicle parameter offset values are received by vehicle parameter offset value receiving system 270. System 270 then interacts with data store interaction system 272 to store the vehicle parameter offset values, values 147 in data store 144. In one example, the vehicle parameter offset values 147 are stored in a lookup table that is indexed by the vehicle identifier corresponding to this particular following vehicle 136/receiving vehicle 134 pair. One example of the vehicle identifier may include a unique identifier corresponding to the following vehicle 136 and/or receiving vehicle 134 (such as a VIN number, etc.). In another example, the lookup table may be indexed by vehicle model number (including the model numbers of one or both of the following vehicle 136 and receiving vehicle 134), by another vehicle identifier for the following vehicle 136 and/or receiving vehicle 134, or in other ways. Storing the receiving vehicle parameter offset values and following vehicle parameter offset values is indicated by block 312 in the flow diagram of FIG. 11. Storing those values in a lookup table or in another data structure indexed by the vehicle identifier (e.g., VIN) in indicated by block 314. Storing the vehicle parameter offset values by vehicle model identifiers is indicated by block 316 in the flow diagram of FIG. 11. Storing the vehicle parameter offset values in a data structure that is accessible by using other following vehicle/receiving vehicle identifiers is indicated by block 318 in the flow diagram of FIG. 11.

It should also be noted that the vehicle parameter offset values can be stored either on local data store 144, or on a remote data store. The remote data store may be a data store in a remote server environment (e.g., the cloud), a data store on a different vehicle, a data store at a farm manager computing system, a data store in a mobile device, or another data stores.

At some point, retrieval trigger detector 274 detects a trigger indicating that the vehicle parameter offset values are to be obtained for this particular following vehicle 136/receiving vehicle 134 pair. Detecting a trigger is indicated by block 320 in the flow diagram of FIG. 11. The trigger may be based on an operator input 322 provided by operator 194 or operator 208. For example, operator 208 may send a message through communication system 148 to receiving vehicle 101 identifying the VIN number or other vehicle identifier corresponding to vehicle 136 to indicate that an unloading operation is about to commence with respect to vehicle 136 and receiving vehicle 134. An operator input may also be provided by operator 194 indicating that the vehicle offset parameter values are to be obtained.

In another example, following vehicle 136 may automatically send a signal identifying itself to receiving vehicle 101 (and specifically to unloading control system 150). Having the following vehicle 136 automatically send a signal with a vehicle identifier is indicated by block 324. Such a signal may be detected or interpreted by retrieval trigger detector 274 as a trigger to obtain the vehicle parameter offset values for the following vehicle 136 and receiving vehicle 134.

In another example, unloading control system 150 may generate a signal to retrieval trigger detector 274 indicating that an unloading operation is about to commence. This signal may also be a trigger to obtain the vehicle parameter offset values for the following vehicle 136/receiving vehicle 134 pair that is about to be loaded with material. Detecting a signal indicating that leading vehicle 101 is ready to unload signal is indicated by block 326 in the flow diagram of FIG. 11. The trigger detector 274 can detect a retrieval trigger based on other trigger criteria, or in other ways, as indicated by block 328.

Vehicle identification system 282 then obtains a vehicle identifier which identifies the following vehicle 136/receiving vehicle 134 pair, as indicated by block 330 in the flow diagram of FIG. 11. Such a vehicle identifier may be sent from receiving vehicle 134 or from following vehicle 136 to leading vehicle 101, as indicated by block 332. The vehicle identifier may be automatically recognized on the leading vehicle 101, as indicated by block 334. For instance, following vehicle/receiving vehicle pair detector 160 may detect the identifiers of following vehicle 136 and receiving vehicle 134 using optical recognition that identifies optical features or other optical indicia that identify those vehicles. In another example, the vehicles 136 and 134, themselves, send vehicle identifiers (such as the VIN, model number, or other identifiers that identify those vehicles). The vehicle identifiers of the following vehicle 136/receiving vehicle 134 pair (or one or both of those vehicles individually) can be obtained in a wide variety of other ways as well, as indicated by block 336 in the flow diagram of FIG. 11.

Current vehicle comparison system 284 compares the vehicle identified by the vehicle identifier obtained at block 330 to that of the following vehicle 136 and/or receiving vehicle 134 whose offset values are currently loaded into vehicle position detection system 164. If the two are the same, as determined at block 338, then processing continues at block 340. However, if, at block 338, current vehicle comparison system 284 determines that the vehicles identified by the vehicle identifier obtained at block 330 are different than the vehicles for which the vehicle parameter offset values are currently loaded into vehicle position detection system 164, then data retrieval system 268 uses the vehicle identifier from block 330 to access the correct vehicle parameter offset values as indicated by block 342.

The vehicle parameter offset values 147 can be accessed from a local data store 144, as indicated by block 344 in the flow diagram of FIG. 11. The vehicle parameter offset values can be accessed from a remote store, as indicated by block 346, or from another vehicle, as indicated by block 348. For instance, if a different leading vehicle (different from leading vehicle 101) performed a calibration operation to identify the calibrated offset values for this particular following vehicle 136/receiving vehicle 134 pair, then those calibrated offset values can be accessed from that other leading vehicle and used on leading vehicle 101. The vehicle parameter offset values can be accessed from other locations, or in other ways, as well, as indicated by block 350 in the flow diagram of FIG. 11.

Once the vehicle parameter offset values have been obtained, then data retrieval system 268 loads those values into vehicle position detection system 164 for use in controlling the unloading operation. Loading the vehicle parameter offset values to control the unloading operation is indicated by block 352 in the flow diagram of FIG. 11.

Mismatch processing system 278 can also process any mismatches between the vehicle parameter offset values that are loaded into the vehicle position detection system 164 and those for the actual vehicles being loaded. Processing any mismatches is indicated by block 354 in the flow diagram of FIG. 11. Processing the mismatches is described in greater detail below with respect to FIG. 12 as well.

Figure 12:
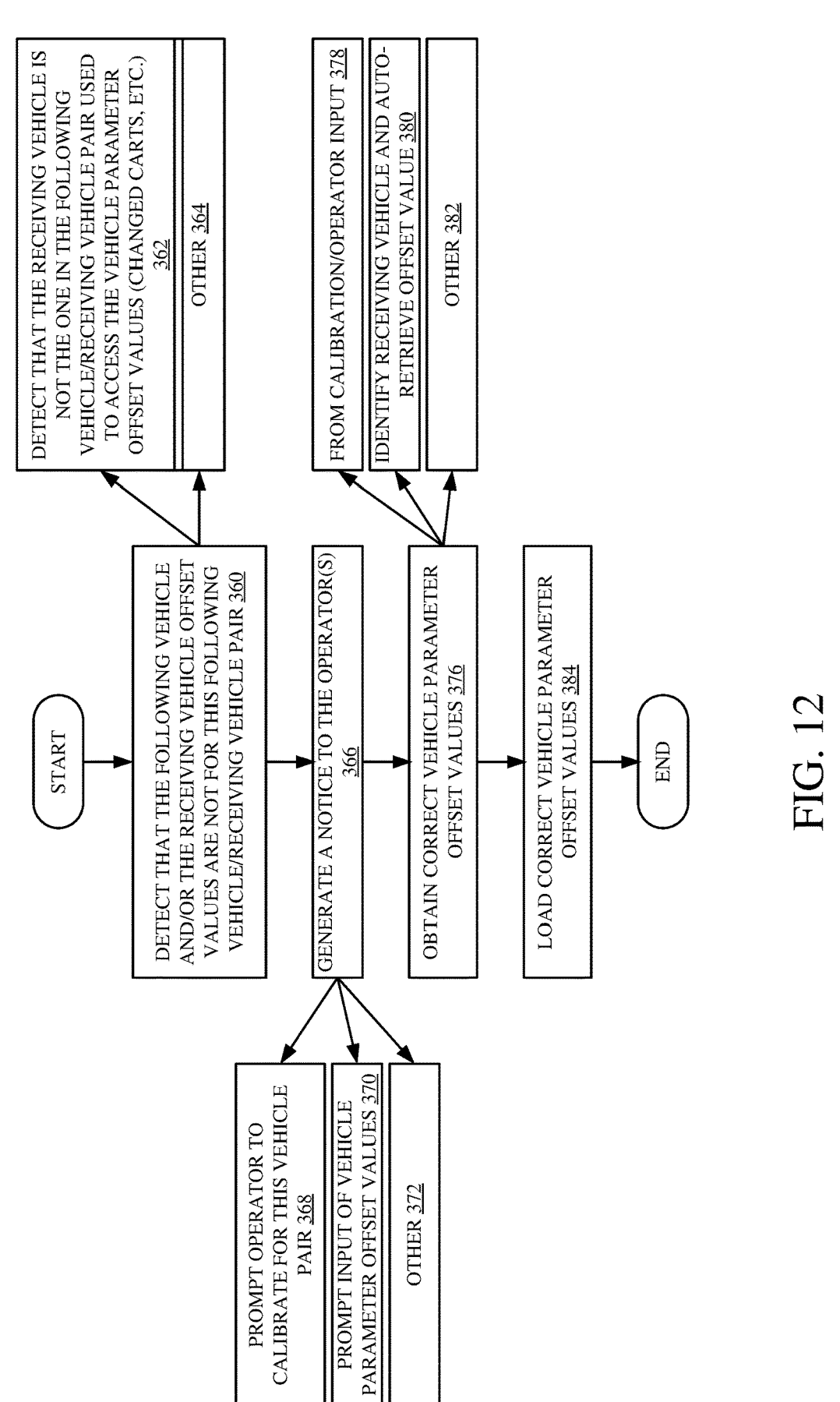
FIG. 12 is a flow diagram illustrating one example of the operation of a mismatch processing system.

FIG. 12 is a flow diagram illustrating one example of the operation of mismatch processing system 278 in performing processing when the vehicle parameter offset values that have been loaded into vehicle position detection system 164 do not appear to correspond to the receiving vehicle 134 that is actually being loaded (or is about to be loaded). Mismatch identification system 290 first detects that the vehicle parameter offset values for the following vehicle and/or the receiving vehicle are not for this particular following vehicle

136/receiving vehicle 134 pair. Detecting this mismatch is indicated by block 360 in the flow diagram of FIG. 12.

For instance, it may be that system 290 has detected that the receiving vehicle 134 is not the one in the following vehicle 136/receiving vehicle 134 pair that was used to access the vehicle parameter offset values, as indicated by block 362. This may be the case, for instance, where the operator 208 has changed grain carts, etc. It may also be that one of the operators 194, 208 has provided an input indicating that there is a mismatch, or the mismatch may be detected in any of a variety of other ways, as indicated by block 364 in the flow diagram of FIG. 12.

Operator interface interaction system 292 then generates a notice to one or more of the operators 194 and/or 208, indicating that a mismatch has been detected. Generating the notice is indicated by block 366 in the flow diagram of FIG. 12. The notice may prompt the operator to trigger calibration system 162 to perform a calibration operation for this particular following vehicle 136/receiving vehicle 134 pair, as indicated by block 368. The notice may prompt the manual or automated input of the actual vehicle parameter offset values, as indicated by block 370. For instance, the notice may provide a text entry field where one of the operators can input the vehicle parameter offset values, or the system 292 can expose an interface that can be automatically called by control system 202 on vehicle 136 to automatically input the vehicle parameter offset values. The notice can be generated for the operators in a wide variety of other ways as well, as indicated by block 372.

Retrieval control system 294 then obtains the correct vehicle parameter offset values, as indicated by block 376 in the flow diagram of FIG. 12. For instance, the vehicle parameter offset values can be received (as calibrated offset values) from calibration system 162 or through an operator input, as indicated by block 378. The vehicle parameter offset values can be obtained by identifying the correct following vehicle 136/receiving vehicle 134 pair and automatically retrieving the vehicle parameter offset values from data store 144 or elsewhere, as indicated by block 380 in the flow diagram of FIG. 12. Retrieval control system 294 can obtain the correct vehicle parameter offset values in any of a wide variety of other ways as well, as indicated by block 382.

Mismatch processing system 278 generates an output indicative of the correct vehicle parameter offset values so that those values can be loaded into vehicle position detection system 164 for use in controlling the unloading operation, as indicated by block 384 in the flow diagram of FIG. 12.

It can thus be seen that the present description proceeds with respect to a system that automatically stores the vehicle parameter offset values corresponding to a following vehicle 136/receiving vehicle 134 pair so that the values can be automatically retrieved and used in controlling an unloading operation when the leading vehicle 101 encounters that following vehicle 136/receiving vehicle 134 pair in the future. The vehicle parameter offset values can be stored in a lookup table or in another data structure that is indexed by a vehicle identifier that identifies the following vehicle 136/receiving vehicle 134 pair or one or both of those vehicle individually. The vehicle identifier may be, for instance, the VIN of the following vehicle 136 and/or of the receiving vehicle 134. The vehicle identifier may be a model number of one or both of the vehicles, an optical identifier, or another type of identifier that identifies the following vehicle 136/receiving vehicle 134 pair or one or both of the vehicles individually, corresponding to the set of vehicle parameter offset values. The vehicle parameter offset values can be stored locally on one of the machines, remotely in a remote server environment, or on a different system. The vehicle parameter offset values can be stored on a mobile device, or on a different vehicle where they can be accessed at a later time.

When a mismatch is identified, in which the following vehicle 136/receiving vehicle 134 pair does not match that corresponding to the vehicle parameter offset values that are currently being used to control the unloading operation, then a notification can be generated for one or more of the operators, and operations can be performed to obtain the correct set of vehicle parameter offset values. The correct set of vehicle parameter offset values is then loaded into the vehicle position detection system for use in controlling the unloading operation.

It can thus be seen that the present description has also described a system which performs a calibration operation that can be used to locate different receiving vehicle parameters relative to a reference point on a following vehicle. This calibrated offset values can then be stored and used in locating the receiving vehicle during subsequent unloading operations so that the receiving vehicle need not be located using visual image capture and image processing, which can be error prone. This increases the accuracy of the unloading operation.

As mentioned above, in one example, the location of the hitch point 137 (hitch point location) on following vehicle 136 can be identified relative to the location of the position sensor (e.g., the GPS receiver) 196 on following vehicle 136. Also, the hitch point location and the route of following vehicle 136 and position of vehicle 136 relative to leading vehicle 101 can be applied to a dynamic model that models the kinematics of receiving vehicle 134. For instance, the dynamic model may model how receiving vehicle 134 moves as the pivot point or hitch point 137 to which it is coupled moves along the route of following vehicle 136. As an example, if following vehicle 136 turns, vehicle 136 pivots about hitch point 137. However, receiving vehicle 134 will eventually also turn to follow the same heading as following vehicle 136. The dynamic model models the motion of various points (e.g., the receiving vehicle parameters or other points) on receiving vehicle 134 through space, based upon the location of pivot point 137 and the route of the following vehicle 136. In such an example, once the calibrated offset value is known which indicates the location of hitch point 137 relative to the position sensor 196 on following vehicle 136, and once the route of following vehicle 136 is known, then the dynamic model can be used to compute the location of receiving vehicle 134 relative to the position sensor 196 or hitch point 137 or other known reference value on following vehicle 136. The location of receiving vehicle 134, relative leading vehicle 101, can thus be determined as well.

Figures 13A, 13B, 13C, 13D:
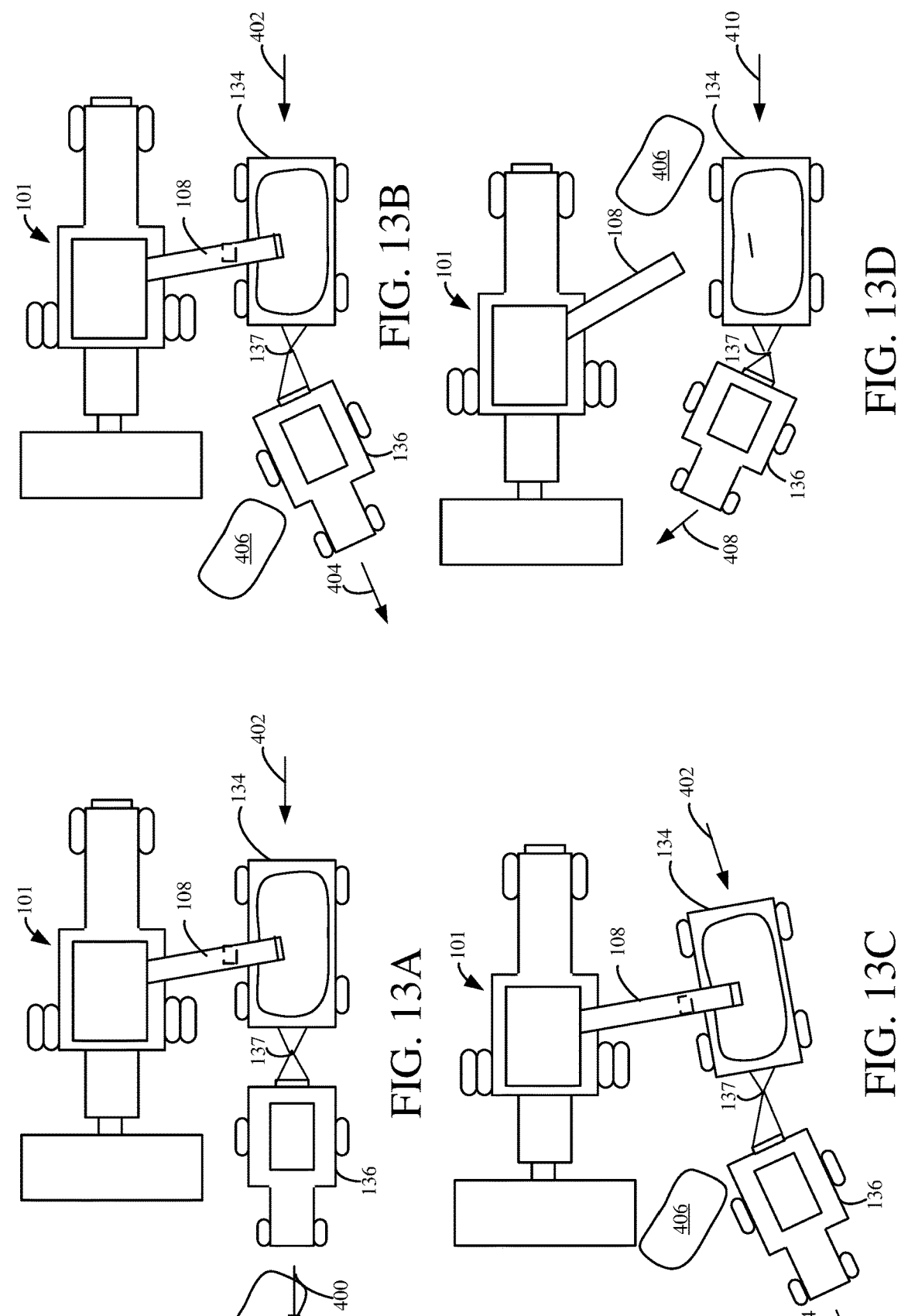
FIGS. 13A, 13B, 13C, 13D, and 13E show examples of how the position of a receiving vehicle changes.

FIGS. 13A-13E show examples of how the movement of receiving vehicle 134 changes based upon the position and heading or route of following vehicle 136. In FIG. 13A, for instance, it can see that vehicle 136 is moving in a forward direction along a route generally indicated by arrow 400, and it can be seen that following vehicle 136 and receiving vehicle 134 have just recently traveled along a route indicated by arrow 402. FIG. 13B, however, shows that following vehicle 136 has now turned to follow a route indicated by arrow 404, in order to avoid an obstacle 406, but receiving vehicle 134 is still traveling as shown by arrow 402.

Figure 13E:
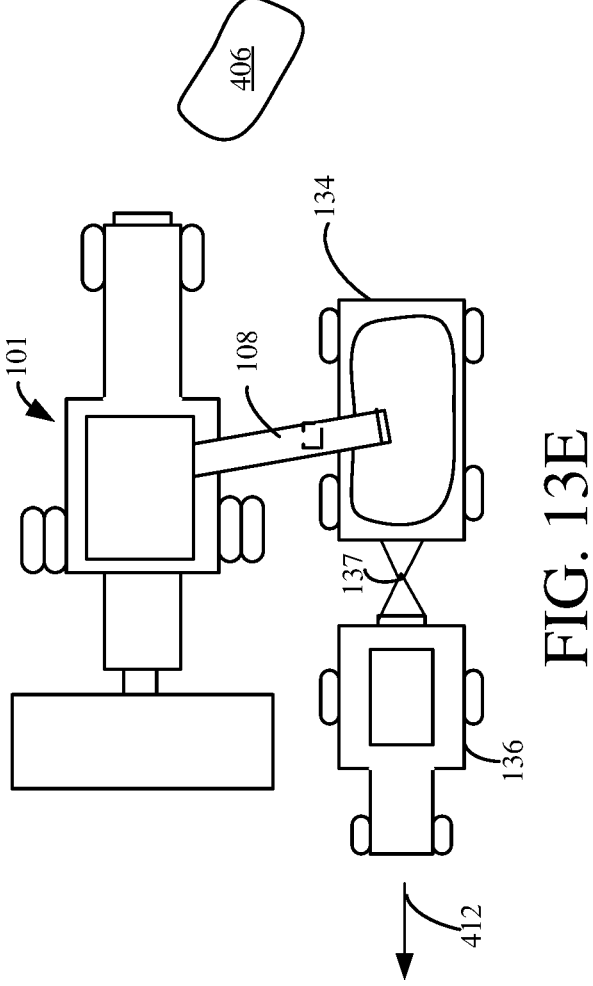

Eventually, because pivot point 137 will move with following vehicle 136, the receiving vehicle 134 will also turn to follow following vehicle 136, as illustrated in FIG. 13C. FIG. 13D shows that following vehicle 136 is now moving in a direction indicated by arrow 408. Receiving vehicle 134 is traveling along a different route indicated by arrow 410, but will soon turn to follow following vehicle 136, as shown in FIG. 13E. This type of movement of receiving vehicle 134 can be modeled by a dynamic model which models the kinematics of receiving vehicle 134 as the hitch point 137 moves through space (e.g., as hitch point 137 moves to follow the route taken by following vehicle 136). The dynamic model may be a machine learned kinematic model that automatically learns the kinematics of receiving vehicle 134, or a model that receives data indicative of the dimensions and movement characteristics of receiving vehicle 134. It can be seen in FIGS. 13A-13E that, by knowing the location of hitch point 137 relative to leading vehicle 101 (e.g., by knowing the offset of hitch point 137 from the position sensor 196 on following vehicle 136 and by knowing the relative position of the position sensor 196 relative to the position sensor on leading vehicle 101), and by knowing the route that following vehicle 136 is following, then the dynamic model can estimate the position of receiving vehicle 134 relative to hitch point 137, or relative to the position sensor 196 on receiving vehicle 136, and/or relative to the position of leading vehicle 101 and/or relative to a subsystem on leading vehicle 101.

Therefore, vehicle position detection system 164 on leading vehicle 101 simply needs to obtain the location of position sensor 196 on following vehicle 136 as well as the route of following vehicle 136 and the offset of hitch point 137 relative to position sensor 196. From that information, and using a dynamic model, vehicle position detection system 164 can detect the position of receiving vehicle 134 relative to spout 108 on leading vehicle 101. Such information can be used to control the unloading operation (e.g., to position spout 108, to position vehicles 136 and 101 relative to one another, to turn on and off the material conveyance subsystem 186 on leading vehicle 101, etc.).

Figure 14:
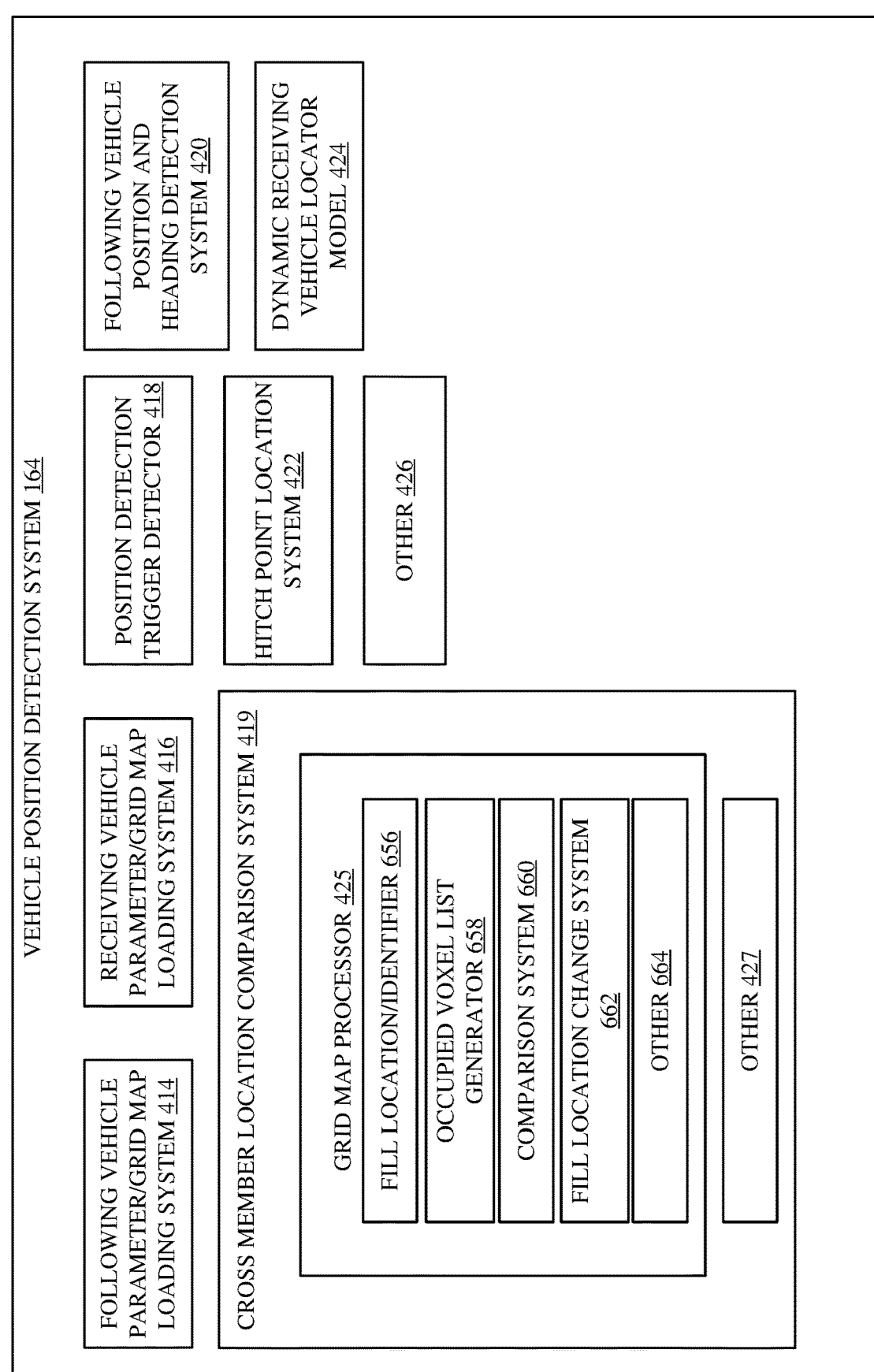
FIG. 14 is a block diagram showing one example of a vehicle position detection system.

FIG. 14 is a block diagram showing one example of vehicle position detection system 164, in more detail. In the example shown in FIG. 14, vehicle position detection system 164 includes following vehicle parameter/grid map loading system 414, receiving vehicle parameter loading system 416, position detection trigger detector 418, cross member location comparison system 419, following vehicle position and heading detection system 420, hitch point location system 422, dynamic receiving vehicle locator model 424, grid map processor 425, and other items 426.

Following vehicle parameter/grid map loading system 414 can obtain parameters, such as dimensions, calibrated offset values/grid maps, etc., with respect to following vehicle 136. The parameter information may include such things as the offset between hitch point 137 and the position sensor 196 on following vehicle 136, grid maps generated for vehicle 136, and/or other dimension information or kinematic information. Receiving vehicle parameter/grid map loading system 416 receives or otherwise obtains access to parameters of receiving vehicle 134, such as calibrated offset values, kinematic information, dimensional information, or grid maps and/or other parameter values. Systems 414 and 416 can obtain the information from following vehicle 136 and/or receiving vehicle 134, from data store 144, from another remote system or another vehicle, etc. Also, the information can be retrieved based upon a vehicle identifier or another identifier that identifies receiving vehicle 134 and/or following vehicle 136, or the pair comprising following vehicle 136 and receiving vehicle 134.

Position detection trigger detector 418 detects trigger criteria indicating when the position or location of receiving vehicle 134 is to be detected. For instance, when trigger detector 418 detects that the following vehicle 136/receiving vehicle 134 pair is in position for leading vehicle 101 to begin an unloading operation, this may trigger detector 418 to detect the position of receiving vehicle 136. The detection may be continuous or intermittent, so long as the unloading operation is being performed, or the trigger criteria can be other criteria or the criteria can be detected in other ways.

Cross member location comparison system 419 is described in more detail elsewhere herein. Briefly, system 419 can use grid map processor 425, when a grid map is used, to compare a fill location where material is to be unloaded into receiving vehicle 134 to a location of the cross members that span at least a portion of a material-receiving area of receiving vehicle 134. If the two locations overlap, system 419 generates a signal so control signal generator 166 can generate appropriate control signals (such as to change the fill location so material is not inadvertently dumped on the hoops or cross members).

Following vehicle position and heading detection system 420 detects the position and heading of following vehicle 136. The position and heading can be in absolute terms, or relative to the position and/or heading of leading vehicle 101. For instance, it may be that system 420 controls communication system 148 to obtain the current position and heading of following vehicle 136 from position sensor 196. In another example, the position and heading of following vehicle 136 can be detected using sensors 152 or other sensors on leading vehicle 101. In another example, system 420 can obtain multiple position indicators from position sensor 196 and calculate the heading of following vehicle 136 based upon the multiple position indicators. System 420 can obtain the position and heading or route of following vehicle 136 in other ways as well.

Hitch point location system 422 can be used to locate the hitch point 137 relative to leading vehicle 101. For instance, once the position of position sensor 196 on following vehicle 136 is known, and once the offset between sensor 196 and hitch point 137 is known, hitch point location system 422 can identify the location of hitch point 137 relative to position sensor 196 on following vehicle 136. Then, obtaining the position of leading vehicle 101 from position sensor 146, hitch point location system 422 can locate the hitch point 137 relative to the position sensor 146 on leading vehicle 101, and relative to any other items on leading vehicle 101 (given that the offset between those items and position sensor 146 is known).

Dynamic receiving vehicle locator model 424 is illustratively a machine learned dynamic model that receives, as an input, the location of hitch point 137 and the route of following vehicle 136 and/or receiving vehicle 134 and calculates the position of receiving vehicle 134 relative to the hitch point 137, relative to following vehicle 136, and/or relative to vehicle 101 (or any subsystem or reference point on vehicle 101). In this way, system 164 can calculate the location of receiving vehicle 134 relative to spout 108 (or other known items on leading vehicle 101) and can use that information to control the unloading operation (such as to turn on or off the material conveyance subsystem 186, to control the position or orientation of material conveyance subsystem 186, to control the relative position of vehicles 101 and 136 or 134 relative to one another, etc.).

Figure 15A:
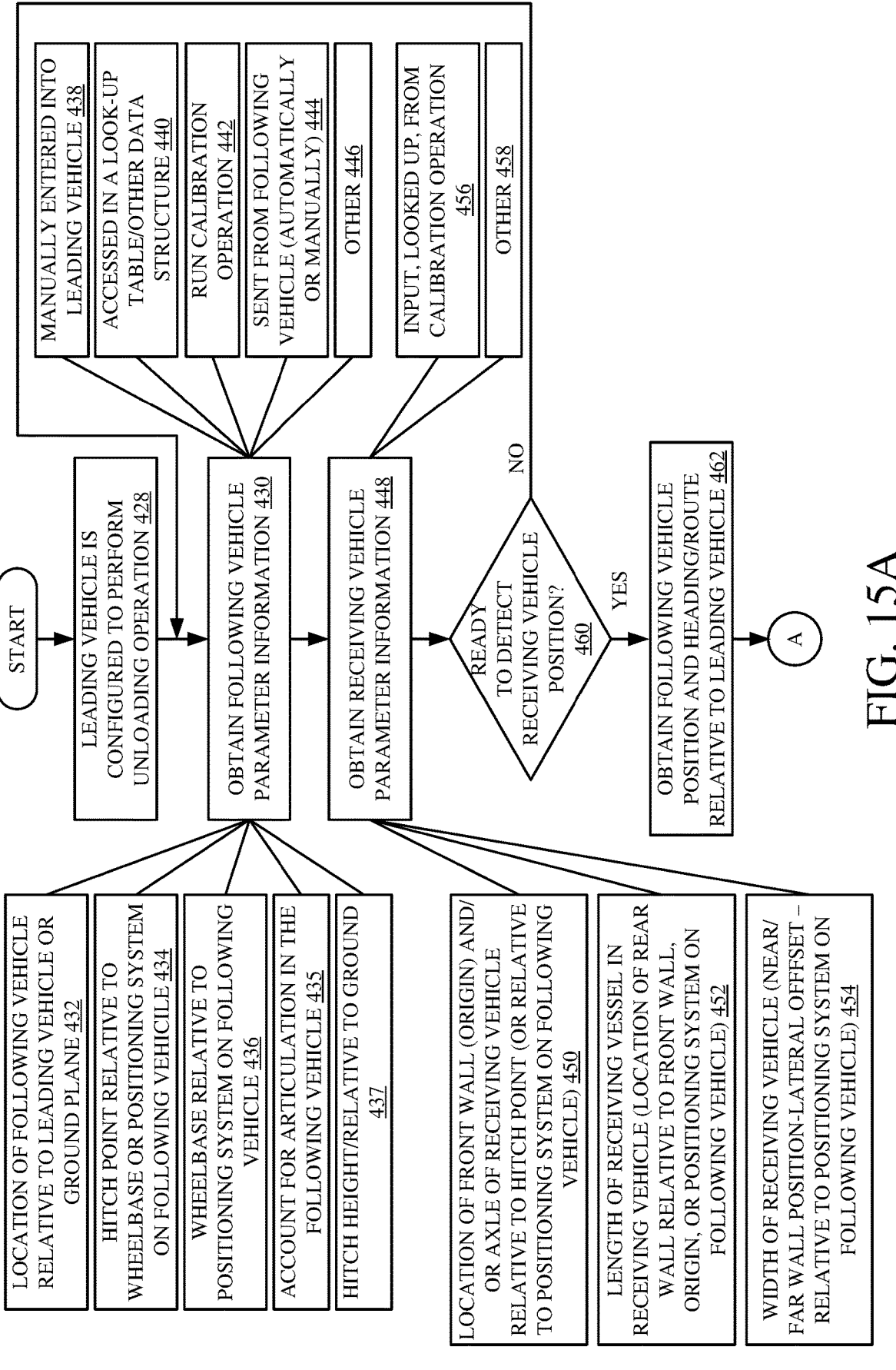
FIGS. 15A and 15B (collectively referred to as FIG. 15) show a flow diagram illustrating one example of the operation of the vehicle position detection system.
Figure 15B:
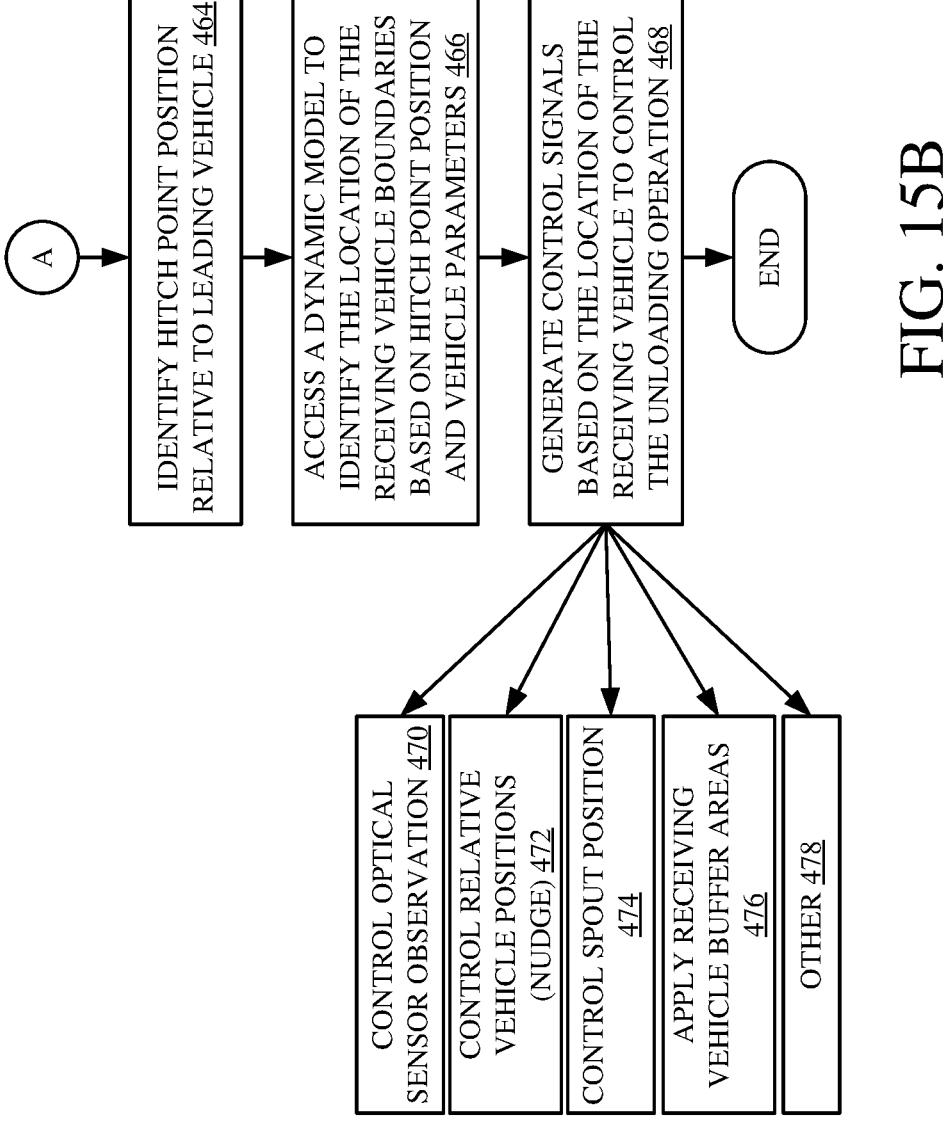

FIGS. 15A and 15B (collectively referred to herein as FIG. 15) show a flow diagram illustrating one example of the operation of vehicle position detection system 164 in using a dynamic model 424 along with the location of hitch point 137 and route of vehicle 136 and/or vehicle 134 to identify the position of receiving vehicle 134 relative to leading vehicle 101. It is first assumed that leading vehicle 101 is configured to perform an unloading operation to unload material into receiving vehicle 134, as indicated by block 428 in the flow diagram of FIG. 15. Following vehicle parameter/grid map loading system 414 then obtains the following vehicle parameter/grid map information, as indicated by block 430. The following vehicle parameter/grid map information can include the location of following vehicle 136 relative to leading vehicle 101, or relative to a ground plane, as indicated by block 432. The following vehicle parameter/grid map information can include the location of hitch point 137 relative to the wheelbase or position sensor 196 on following vehicle 136, as indicated by block 434. The following vehicle parameter/grid map information can identify a grid map corresponding to receiving vehicle 134 and can include the location of the wheelbase of following vehicle 136 relative to the position sensor 196 on following vehicle 136, as indicated by block 436. The following vehicle parameter information can account for the articulation angle when the following vehicle is an articulated vehicle, such as an articulated tractor. The articulation angle can be sensed and a fixed transform, a lookup table, or another technique can be used to identify or calculate the pose of the following vehicle 136 and the receiving vehicle 134 as indicated by block 435. In addition, the following vehicle parameter information can include the height of the hitch above the ground, as indicated by block 437. The following vehicle parameter information can be manually entered into the leading vehicle 101, through a user interface, as indicated by block 438, or it can be accessed in a lookup table or other data structure (e.g., in data store 144) that may be indexed based on vehicle type, vehicle identifier, etc., as indicated by block 440 in the flow diagram of FIG. 15. The following vehicle parameter/grid map information can be obtained by running the calibration operation discussed above, as indicated by block 442, or the following vehicle parameter/grid map information can be sent from following vehicle 136 (where it may be sent manually or automatically) as indicated by block 444. The following vehicle parameter information can include other types of information and it can be obtained in other ways as well, as indicated by block 446.

Receiving vehicle parameter/grid map loading system 416 then obtains the receiving vehicle parameter/grid map information, as indicated by block 448 in the flow diagram of FIG. 15. The receiving vehicle parameter information/grid map can include such things as the location of the front wall (or origin) and/or axle of the receiving vehicle 134 relative to hitch point 137 (or relative to the position sensor 196) on following vehicle 136, as indicated by block 450. The receiving vehicle parameter information can include dimension information such as the length of the receiving vehicle (or the receiving vessel in the receiving vehicle) 134, or the location of the rear wall relative to the front wall or origin, or relative to the positioning sensor 196 on following vehicle 146, or other information, as indicated by block 452 in the flow diagram of FIG. 15. The receiving vehicle parameter information can include the width of the receiving vehicle (e.g., the distance from the near wall to the far wall—or lateral offset of the two walls) or the distance to the near and/or far walls from the position sensor 196 on the following vehicle 136. Obtaining information indicative of the width of the receiving vehicle 134 is indicated by block 454 in the flow diagram of FIG. 15. The information can include a grid map or occupancy values in a grid map which identify cross members or fixtures. The receiving vehicle parameter/grid map information can be manually input, automatically input, looked up in a data store, or obtained by performing the calibration operation, discussed above, as indicated by block 456 in the flow diagram of FIG. 15. The receiving vehicle parameter/grid map information can be obtained in other ways as well, as indicated by block 458.

Position detection trigger detector 418 then detects whether it is time to detect the position of receiving vehicle 134, as indicated by block 460 in the flow diagram of FIG. 15. As discussed above, the trigger criteria may be based on the fact that following vehicle 136 and receiving vehicle 134 are in position for leading vehicle 101 to commence an unloading operation. The trigger criteria may be that the unloading operation has commenced, or the trigger criteria may be an operator input or automated input from following vehicle 136 (that is detected on leading vehicle 101), an operator input or automated input on leading vehicle 101, or other trigger criteria. If the trigger criteria are not yet met, then processing reverts to block 430 where the following vehicle parameter information and receiving vehicle parameter information can be obtained (in case a different following vehicle 136 and receiving vehicle 134 pair have been encountered by leading vehicle 101).

However, once the trigger criteria are met, then following vehicle position and heading detection system 420 detects or calculates the following vehicle position and the heading or route of the following vehicle 136 relative to leading vehicle 101, as indicated by block 462 in the flow diagram of FIG. 15. The following vehicle heading or route and position can be communicated from following vehicle 136 to detection system 420 automatically or manually or the following vehicle position and route can be detected using one or more of the sensors 152 or in other ways.

Hitch point location system 422 then identifies the location of hitch point 137 relative to the leading vehicle 101, as indicated by block 464 in the flow diagram of FIG. 15. Again, the location of the hitch point 137 can be identified based upon the location of position sensor 196 on following vehicle 136 relative to leading vehicle 101, and based on the offset between the position sensor 196 and hitch point 137. The location of the hitch point 137 relative to leading vehicle 101 can be identified or detected in other ways as well.

Vehicle position detection system 164 then uses dynamic receiving vehicle locator model 424 to identify the location of the receiving vehicle boundaries (the walls of receiving vehicle 134 or the center point of receiving vehicle 134) or to otherwise locate receiving vehicle 134. Receiving vehicle 134 is located based upon the location of the hitch point 137, the route of following vehicle 136, and/or any other desired vehicle parameters (either following vehicle parameters or receiving vehicle parameters) as indicated by block 466 in the flow diagram of FIG. 15. Dynamic model 424 can model the kinematics of receiving vehicle 134 given the location of hitch point 137 and the route of the vehicles. Model 424 can be a machine learned model, or an artificial intelligence (AI) model, or another model.

Vehicle position detection system 164 outputs the location of receiving vehicle 136 relative to leading vehicle 101 to control signal generator 166. Control signal generator 166 then generates control signals based upon the location of the receiving vehicle 134, in order to control the unloading operation, as indicated by block 468 in the flow diagram of FIG. 15. In one example, control signal generator 166 generates control signals to control optical sensor positioning subsystem 191. System 191 can be actuated to point or aim camera 106 based on the location of receiving vehicle 134 relative to leading vehicle 101. For example, when optical sensor 169 is being used to observe the fill profile in receiving vehicle 136, or to observe other items, then optical sensor positioning system 191 can be controlled so that the field of view of sensor 169 obtains a best or satisfactory view of the fill level in receiving vehicle 134. Controlling the position of optical sensor 106 based upon the location of the receiving vehicle 134 relative to the leading vehicle 101 is indicated by block 470 in the flow diagram of FIG. 15.

Control signal generator 166 can generate control signals to control the propulsion subsystem 188 and steering subsystem 190 on leading vehicle 101 and/or the propulsion subsystem and steering subsystem on following vehicle 136. Control signal generator 166 can generate other control signals to control the relative vehicle positions (such as to nudge one forward or backward relative to the other) as indicated by block 472 in the flow diagram of FIG. 15. In another example, control signal generator 166 can generate control signals to control material conveyance subsystem 186 (such as to turn on and off the blower, auger, etc.), to position the spout and/or flap, etc. as indicated by block 474 in the flow diagram of FIG. 15.

Also, some control algorithms calculate buffer zones proximate the edges (or walls) of the receiving vehicle 134 so that the filling operation does not fill material in those zones in order to avoid inadvertent spillage of material over the side of receiving vehicle 134. Thus, the location of the receiving vehicle 134 relative to leading vehicle 101 can be used to define the buffer zones in performing the unloading operation. Calculating and using buffer zones or buffer areas on receiving vehicle 134 is indicated by block 476 in the flow diagram of FIG. 15. Control signal generator 166 can generate any of a wide variety of other control signals to control other operations or subsystems in order to control the unloading operation, as indicated by block 478 in the flow diagram of FIG. 15.

It can thus be seen that the present description describes a system that models the kinematics of a receiving vehicle based on the location of the hitch point and the heading of the following vehicle relative to the leading vehicle. The heading and position of the following vehicle can be communicated to the leading vehicle so that the dynamic model can locate the receiving vehicle relative to the leading vehicle without needing to rely on images captured by an optical sensor. This improves the accuracy and robustness of the location and control systems.

Figure 16:
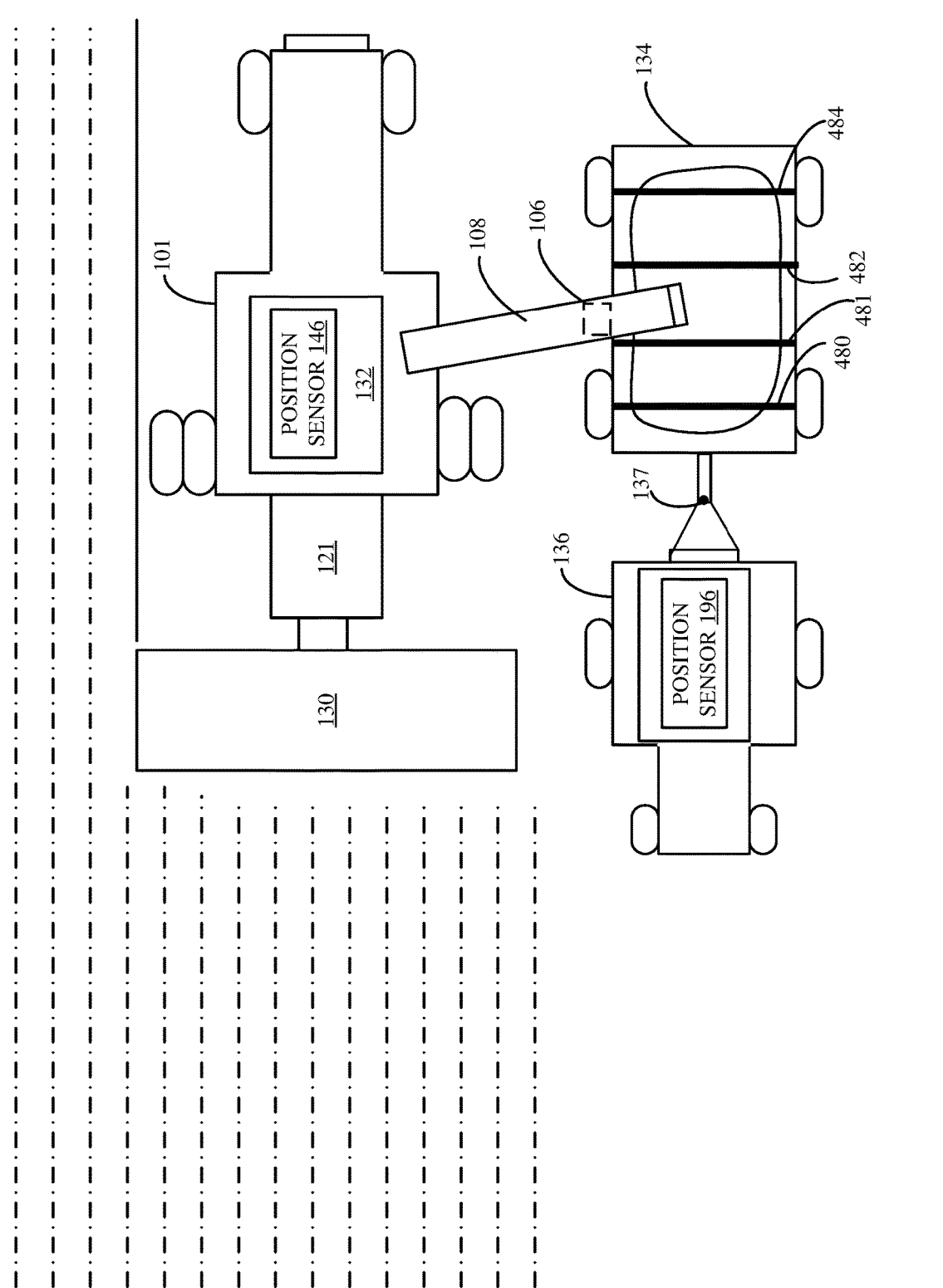
FIG. 16 shows one example of a combine harvester filling a receiving vehicle, where the receiving vehicle has a cross member.

FIG. 16 is similar to FIG. 3, and some more items are similarly numbered. However, FIG. 16 shows that receiving vehicle 134 has a plurality of cross members, or hoops, 480, 481, 482, and 484 (hereinafter referred to as cross members). Cross members 480-484 may be rigid or flexible (e.g., straps) that span part or all of the material-receiving area of receiving vehicle 134. Cross members 480-484 can be used to hold a cover on receiving vehicle 134. When grain exits spout 108 and hits one of the cross members 480, 481, 482, or 484, the grain may bounce out of receiving vehicle 134 and/ or damage the cross member that it strikes. Therefore, in accordance with one example, the location of cross members 480-484 are determined relative to leading vehicle 101 (and/or the unloading end of spout 108) so that spout 108 can be controlled to avoid unloading grain onto cross members 480, 481, 482, and 484.

Figure 17:
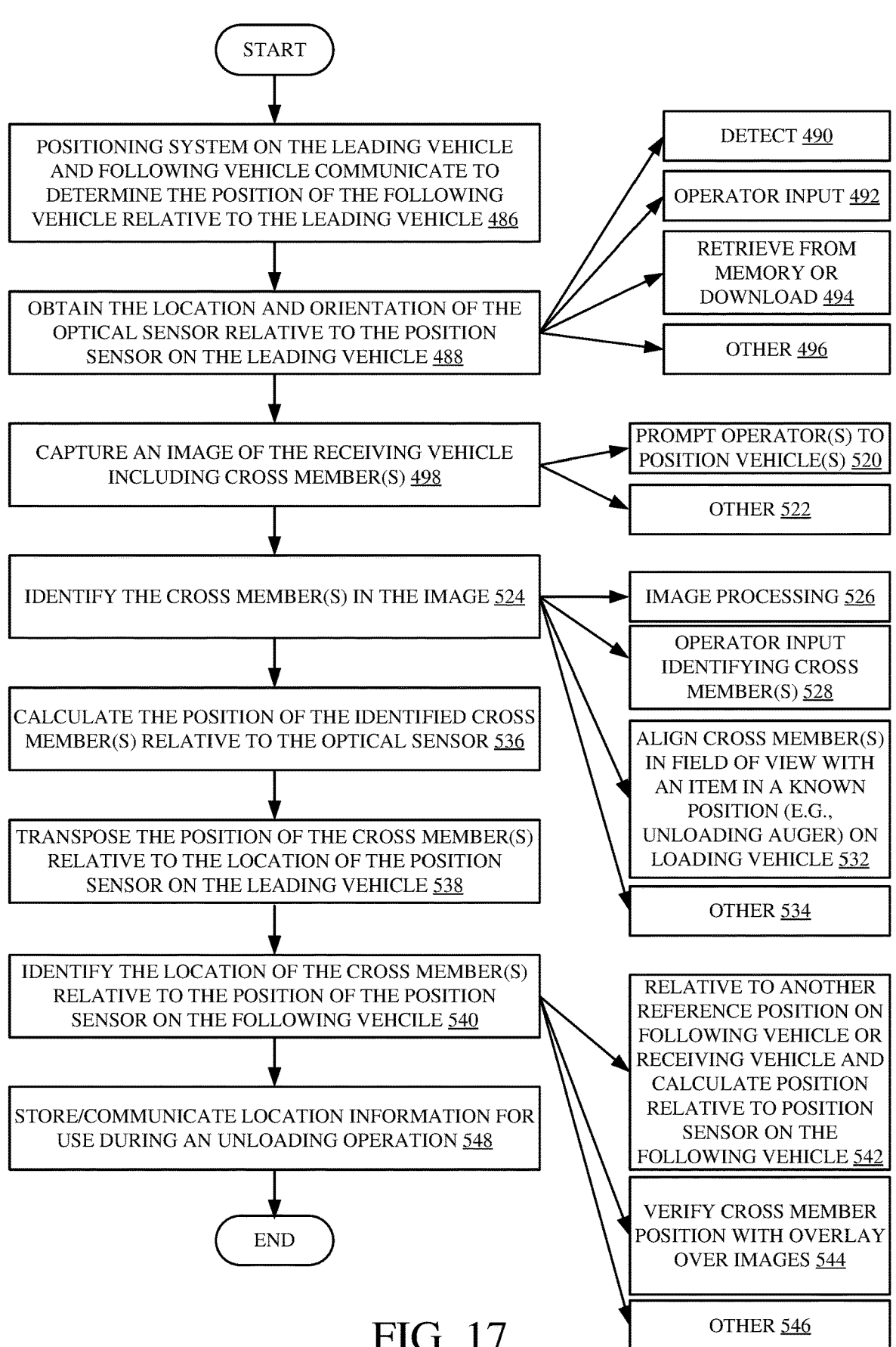
FIG. 17 is a flow diagram showing one example of the operation of a calibration system in locating cross members on a receiving vehicle.

FIG. 17 is a flow diagram illustrating one example of the operation of calibration system 162 in identifying the location of the cross members 480-484 relative to position sensor 196 on following vehicle 136 based on image processing (identifying cross members 480-484 or other fixtures using a grid map corresponding to receiving vehicle 134 is described in greater detail below with respect to FIGS. 21-24). Once the location of the cross members 480-484 relative to position sensor 196 (or relative another reference point on following vehicle 136) is known, then the unloading control system 150 on leading vehicle 101 can control the unloading operation to unload grain from leading vehicle 101 into receiving vehicle 104, while avoiding cross members 480-484.

It is first assumed that the positioning systems 146 and 196 communicate their positions to one another so that vehicle-to-vehicle location system 236 can calculate or otherwise obtain the position of the following vehicle 136 relative to the leading vehicle 101. Determining this position is indicated by block 486 in the flow diagram of FIG. 17. Receiving vehicle parameter locator system 226 then obtains the location and orientation of the optical sensor 106 relative to the position sensor 146 on the leading vehicle, as indicated by block 488 in the flow diagram of FIG. 17. This location and orientation can be detected as indicted by block 490 or entered through an operator interface generated by operator interface system 154, as indicated by block 492 in the flow diagram of FIG. 17. In another example, the location and orientation of the camera 106 relative to the position sensor 146 on leading vehicle 101 can be pre-calculated and stored so that data store interaction system 222 can retrieve that information from a data store or memory, as indicated by block 494. The location and orientation of camera 106 relative to position sensor 146 can be obtained in other ways as well, as indicated by block 496 in the flow diagram of FIG. 17.

Camera 106 then captures an image of the receiving vehicle 134, including one or more of the cross members 480-484. For instance, operator prompt generator 224 can prompt the operator of one or both vehicles 101, 136 to position the vehicles so that the image can be captured. Capturing the image of the receiving vehicle 134 including at least one of the cross members is indicated by block 498 in the flow diagram of FIG. 17. Prompting the operator to position the vehicles appropriately is indicated by block 520 in the flow diagram of FIG. 17. The image can be captured in other ways as well, as indicated by block 522.

Figure 19:
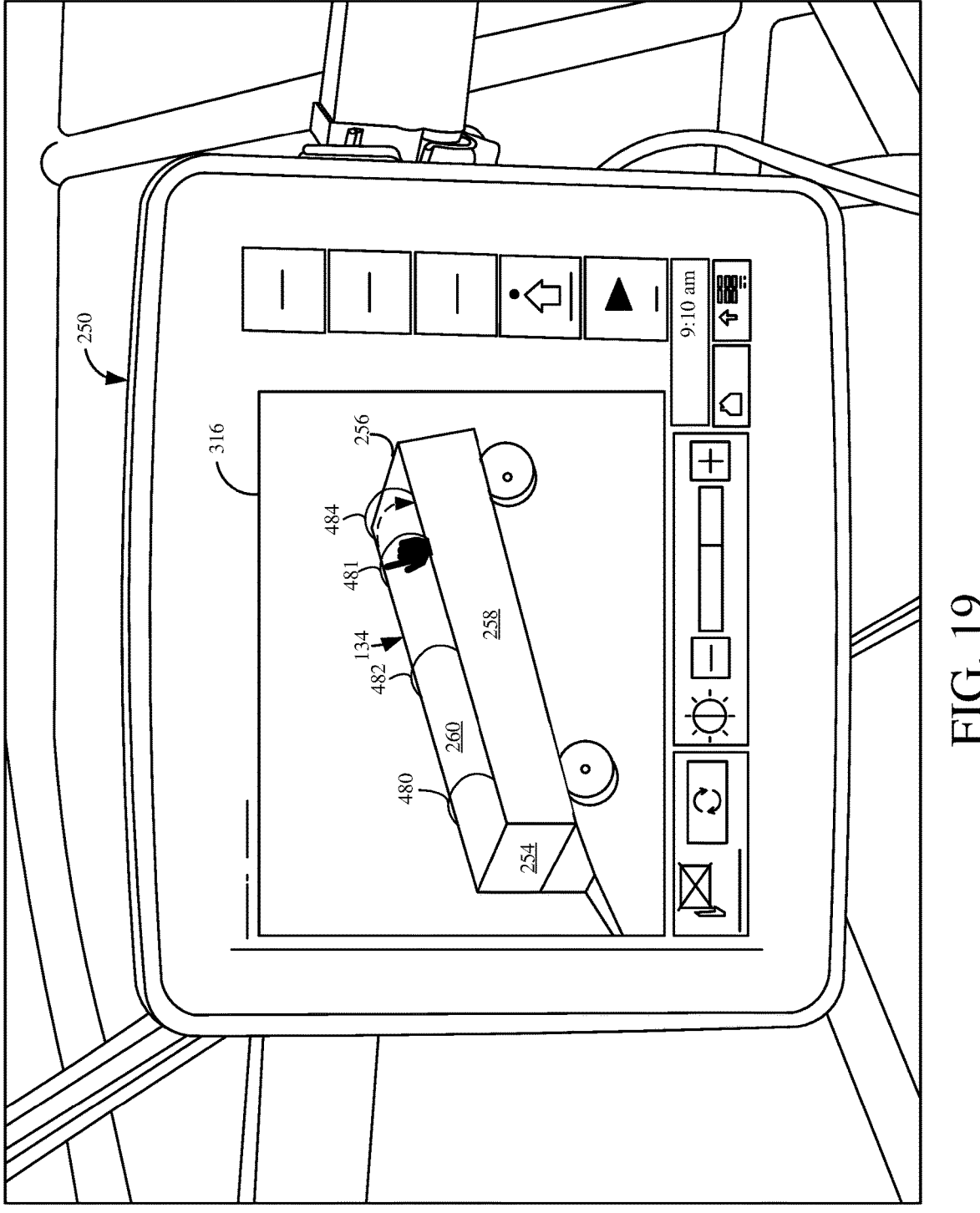
FIGS. 19 and 20 show examples of operator interfaces.
Figure 20:
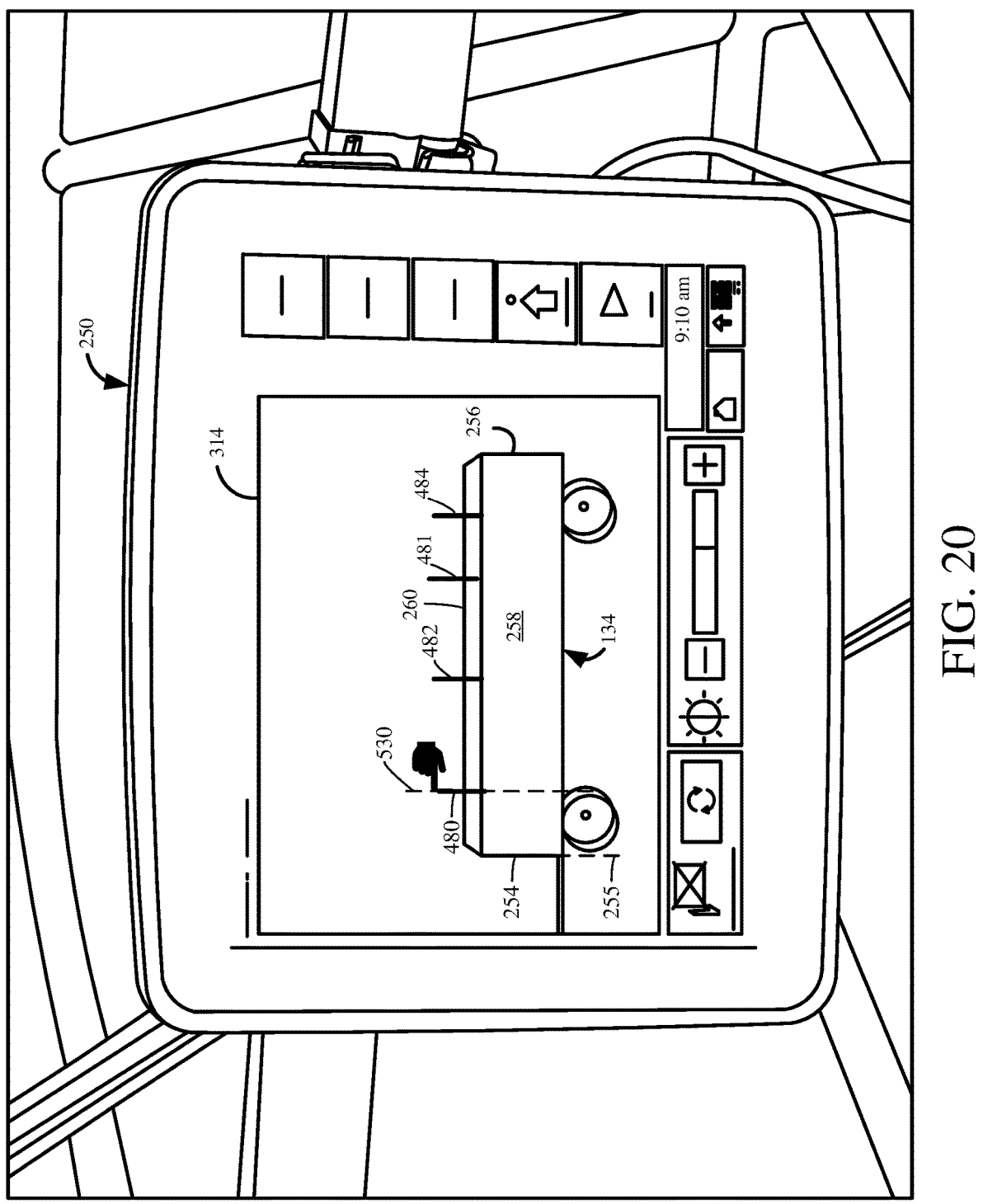

Optical sensor 169 then identifies the location of the hoops in the captured image, as indicated by block 524. For instance, image processor 174 can automatically identify the locations of the cross members in the image by processing the image (e.g., identify which pixels correspond to the cross members), as indicated by block 526. In another example, an operator input can be used to identify the cross members in the image, as indicated by block 528. For instance, FIG. 19 shows an operator interface that is similar to that shown in FIG. 9, and similar items are similarly numbered. However, FIG. 19 also shows cross members 480-484 on receiving vehicle 134. The operator can trace over the cross members 480-484 using a point and click device, or using a touch gesture, as illustrated in FIG. 19, in order to identify the locations of the cross members 480-484 in the captured image. In another example, such as that shown in FIG. 20, the operator can trace or otherwise indicate a marker or line 530 on the image, and then cause vehicles 136 and/or 101 to move to align a cross member (e.g., cross member 480 shown in FIG. 20) with that line 530 to identify the location of the cross member in the captured image. The examples shown in FIGS. 19, and 20 are examples only, and the operator can identify the cross members in the captured image in other ways as well.

In yet another example, the cross members can be identified on the image by aligning the cross members in the field of view of camera 106 with an item that is in a known position relative to the camera 106 (e.g., the unloading auger or spout 108) on leading vehicle 101, so the position of the cross member in the image coincides with the position of the known item with which the cross member is aligned. This way of identifying the cross members in the image is indicated by block 532 in the flow diagram of FIG. 17. The cross members can be identified in the image in other ways as well, as indicated by block 534.

Once the position of a cross member in the image is identified, then cross member locator system 237 can calculate the position of the identified cross member relative to camera 106 (or optical sensor 169) as indicated by block 536 in the flow diagram of FIG. 17. Given that the location and orientation of camera 106 is known relative to position sensor 146, then the position of the cross members relative to camera 106 can be transposed by cross member locator system 237 to obtain the position of the cross members relative to the location of the position sensor 146 on leading vehicle 101, as indicated by block 538. Also, because vehicle-to-vehicle location system 236 has identified the relative positions of the position sensors 146 and 196, then the location of the cross members relative to the location or position of position sensor 196 on the following vehicle 136 can also be generated, as indicated by block 540. The location of the cross members 480-484 can also be identified relative to another reference position on following vehicle 136 (such as the hitch point or other reference position) or a reference position on receiving vehicle 134 and that reference position can then be used to calculate the position of the cross members 480-484 relative to position sensor 196 on the following vehicle 136. This involves an additional step in calculation, but may be performed as well, as indicated by block 542 in the flow diagram of FIG. 17.

Also, in accordance with one example, overlay generator 239 can verify the position of the cross member so that the user can make corrections to that position. For instance, in an operator interface display such as that shown in FIG. 20, overlay generator 239 (shown in FIG. 5) can generate an optical overlay, overlaying the calculated position of the cross members 480-484 onto the image shown in FIG. 20, so that the operator can determine whether the overlayed image matches the actual location of the hoops or cross members 480-484. If not, then the operator may illustratively use a touch gesture or another input to correct the location of the overlayed cross members to match the actual cross members shown in the image. Verifying the cross member position with an overlay on the captured image is indicated by block 544 in the flow diagram of FIG. 17. The location of the cross members relative to the position of the position sensor 196 or another reference point on following vehicle 136 can be determined in other ways as well, as indicated by block 546 in the flow diagram of FIG. 17.

Once the location of the cross members 480-482 has been calculated relative to the location of position sensor 196 (e.g., the calibrated cross member offset values), that information can be stored (on vehicle 136, vehicle 101, at a remote server location, etc.) and/or the information can be communicated to another vehicle, or to remote storge locations, for use during an unloading operation, the next time a leading vehicle 101 encounters the pair of following vehicle

136 and receiving vehicle 134. Storing or communicating the location information in this way is indicated by block 548 in the flow diagram of FIG. 17.

FIG. 18 is a flow diagram illustrating one example of the operation of unloading control system 150 in controlling the unloading operation based upon the location of the cross members 480-484 relative to the position of position sensor 196 (or another reference position) on following vehicle 136.

Following vehicle/receiving vehicle pair detector 160 can identify the vehicle pair to obtain the location values (e.g., the calibrated cross member offset values) for the cross members for this particular vehicle pair. The calibrated cross member offset values will indicate the offset (e.g., distance and direction or just distance) of the cross members relative to a reference point on following vehicle 136 (such as relative to the position sensor 196). Obtaining the calibrated cross member offset values for the cross members for this following vehicle/receiving vehicle pair is indicated by block 550 in the flow diagram of FIG. 18. The values can be retrieved from a memory 552 on leading vehicle 101, or from a remote location (such as from another vehicle or remote server location). The values can be obtained by running a calibration operation, as described above, and as indicated by block 554 in the flow diagram of FIG. 18. The calibrated cross member offset values can be obtained in other ways as well, as indicated by block 556.

Vehicle position detection system 164 then tracks the positions of the cross members relative to the leading vehicle during the unloading operation, as indicated by block 558. For instance, the dynamic receiving vehicle locator model 424 can be used to track the movement of those cross members relative to the leading vehicle 101, as indicated by block 560. The location of the cross members can be tracked by updating the relative position of the following vehicle 136 relative to receiving vehicle 101 using communication between position sensors 146 and 196. The position of the cross members can be tracked in a similar way as other receiving vehicle parameters, as indicated by block 562, or in other ways, as indicated by block 564.

Control signal generator 166 then generates control signals to control the unloading operation based upon the cross member positions, as indicated by block 566 in the flow diagram of FIG. 18. For instance, assume that spout 108 is positioned relative to receiving vehicle 134 to fill at a particular location in receiving vehicle 134. Assume also that the fill level has reached an appropriate level so that the vehicles should be nudged relative to one another to move spout 108 relative to receiving vehicle 134 to a new fill location. Obtaining the new fill location is indicated by block 568 in the flow diagram of FIG. 18. The cross member location comparison system 419 can then compare the new fill location to the location of the cross members to determine whether the new fill location is appropriate for filling. Comparing the locations is indicated by block 570 in the flow diagram of FIG. 18.

In one example, the location of the cross members is increased to include a buffer region on either side of the cross members to ensure that no material inadvertently hits the cross members. Therefore, cross member location comparison system 419 can compare the location of the cross members, including the buffer regions, to the new fill location to determine whether the new fill location is too close to (e.g., overlaps with) the cross member location (plus the buffer). If so, then a different fill location is obtained (e.g., a fill location that may be closely proximate the previous fill location but adjusted by a distance so the fill location is outside the location of the cross members plus the buffer region). Finding a different fill location in this way is indicated by block 572 in the flow diagram of FIG. 18. Control signal generator 166 then generates control signals to move the vehicles so spout 108 is unloading material at the adjusted fill location. Unloading control system 150 can generate control signals to control the unloading operation based upon the location of the cross members in other ways as well, as indicated by block 574 in the flow diagram of FIG. 18.

In another example, instead of using image processing to identify cross members 480-484, grid map processing system 229 in calibration system 162 can perform a calibration operation to generate a three dimensional grid map corresponding to receiving vehicle 134. Grid map processor 425 in vehicle position detection system 164 can then process that grid map, when receiving vehicle 134 is being filled by harvester 101, in order to avoid dumping material onto the cross members 480-484.

Figure 21:
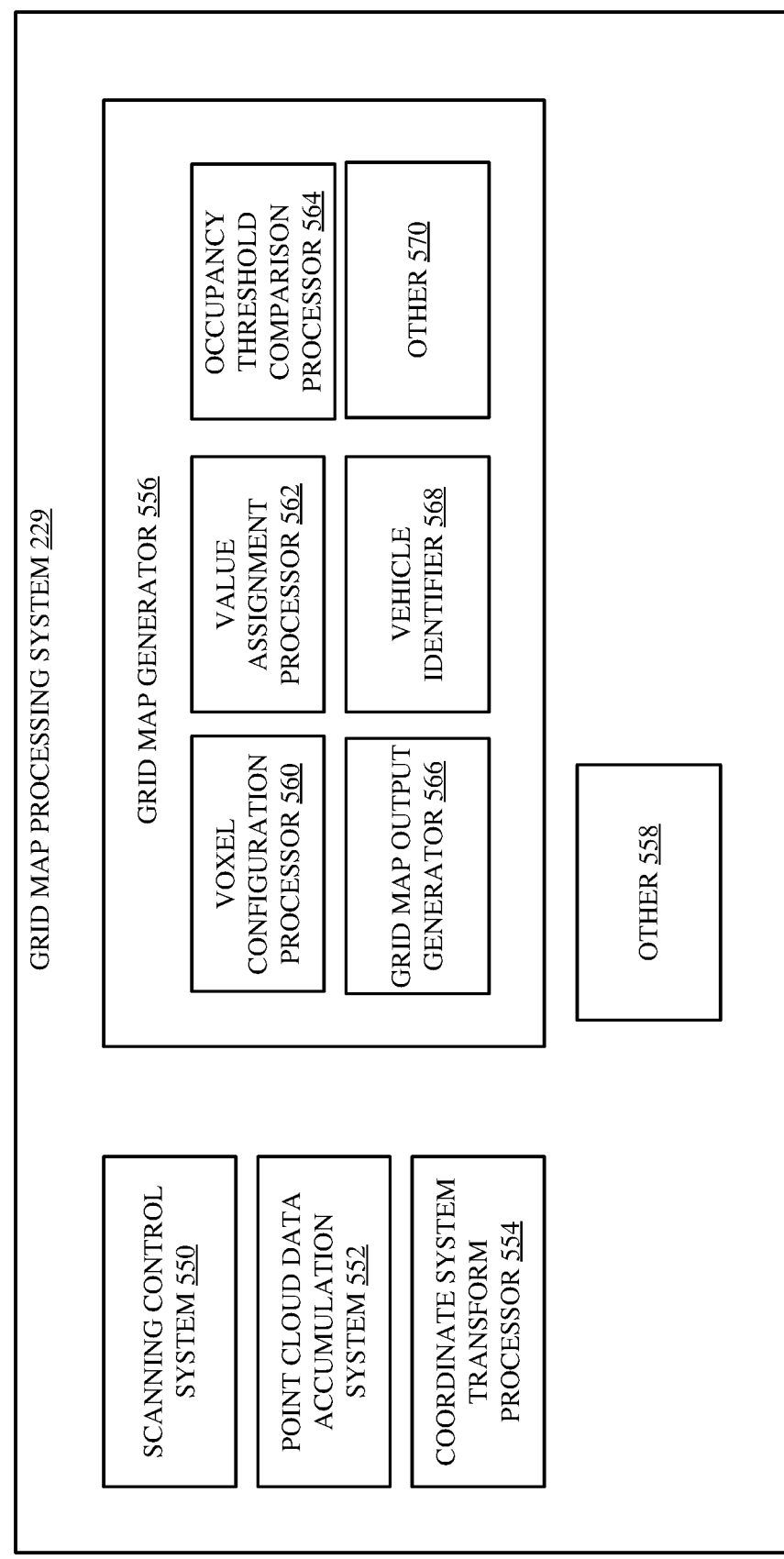
FIG. 21 is a block diagram showing one example of a grid map processing system.

FIG. 21 is a block diagram showing one example of grid map processing system 229 in more detail. In the example shown in FIG. 21, grid map processing system 229 can include scanning control system 550, point cloud data accumulation system 552, coordinate system transform processor 554, grid map generator 556, and other functionality 558. Grid map generator 556 can include voxel configuration processor 560, value assignment processor 562, occupancy threshold comparison processor 564, grid map output generator 566, vehicle identifier 568, and other items 570. Before describing the operation of grid map processing system 229, in more detail, a description of some of the items in grid map processing system 229, and their operation, will first be provided.

Figure 23:
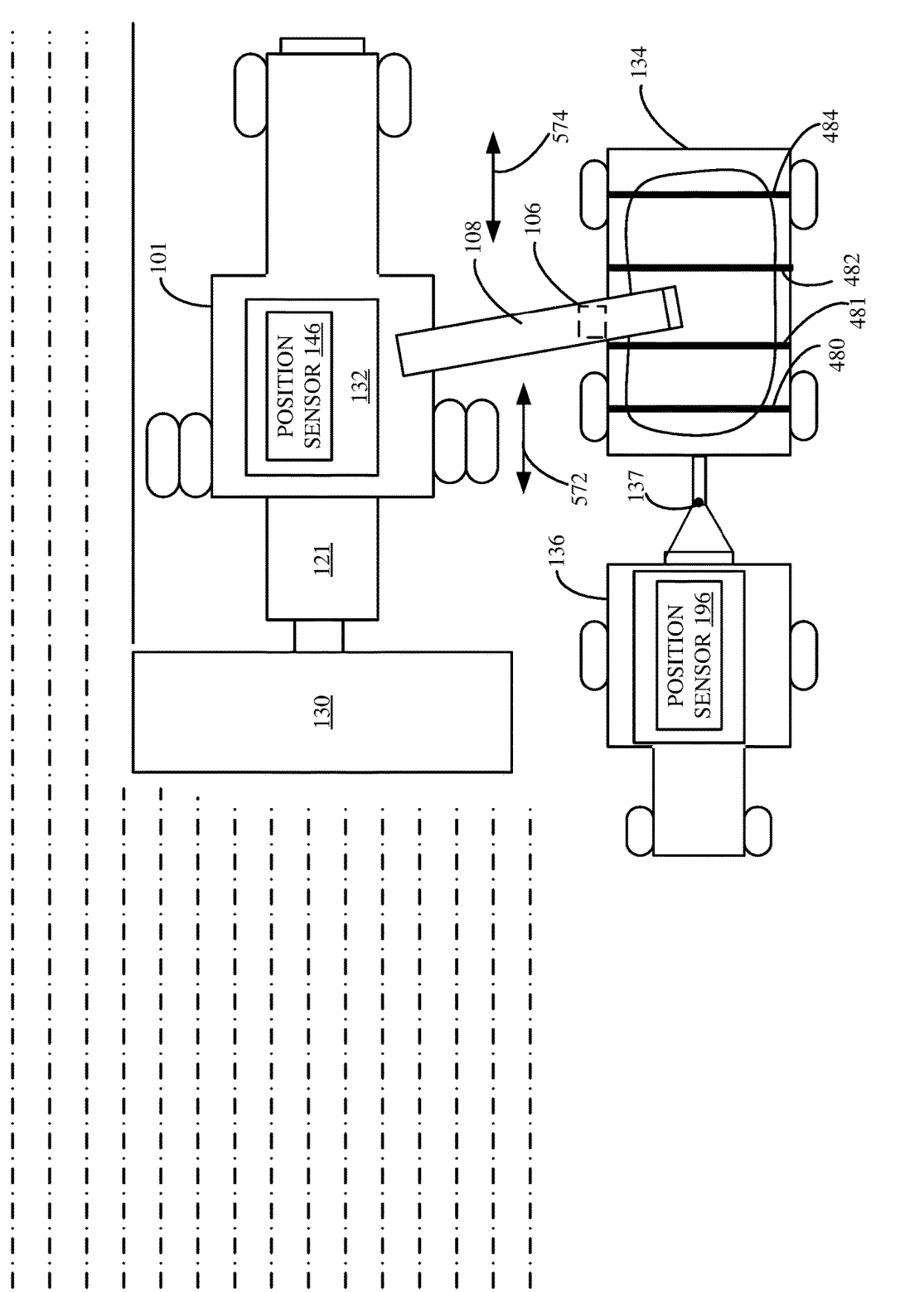
FIG. 23 is a pictorial illustration illustrating one example of scanning a receiving vehicle.

In one example, in order to generate a grid map, the operator of vehicles 101 and 136 are instructed to position the vehicles in the unloading position with spout 108 extended, as shown in FIG. 23. The operators are then instructed to move optical sensor (e.g., camera 106) along (e.g., back and forth relative to) receiving vehicle 134 (such as in the directions indicated by arrows 572 and 574 in FIG. 23) so that camera 106 can capture images of receiving vehicle 134 (and cross members 480-484) from different angles or perspectives. Scanning control system 550 captures those images and point cloud data accumulation system 552 accumulates point cloud data based on the captured images.

Coordinate system transform processor 554 transforms the coordinate system of the image captured by camera 106 to the coordinate system of receiving vehicle 134. Based upon the transformed coordinate systems and the point cloud data, grid map generator 556 generates a grid map corresponding to receiving vehicle 134. Voxel configuration processor 560 discretizes the point cloud data by dividing the receiving volume defined by the walls and floor of receiving vehicle 134 into voxels, and value assignment processor 562 assigns point values to the voxels based upon the point cloud data. The point values are calculated based on the number of points found in the volume defined by a particular voxel. Occupancy threshold comparison processor 564 compares the point values for each voxel to an occupancy threshold value. If the point value for the voxel meets the occupancy threshold value, then the voxel is identified as "occupied" by occupancy threshold comparison processor 564. Vehicle identifier 568 identifies the particular receiving vehicle (as discussed elsewhere herein) and grid map output generator 566 outputs a three dimensional grid map representative of the voxels and corresponding voxel values, for this particular receiving vehicle 136. The location of a voxel in the map corresponds to the location of that voxel in the receiving volume defined by the receiving vehicle 134. The grid map can be stored, for instance, as a grid map 179 in data store 144, in a remote vehicle, in a remote server environment, etc.

Figure 22A:
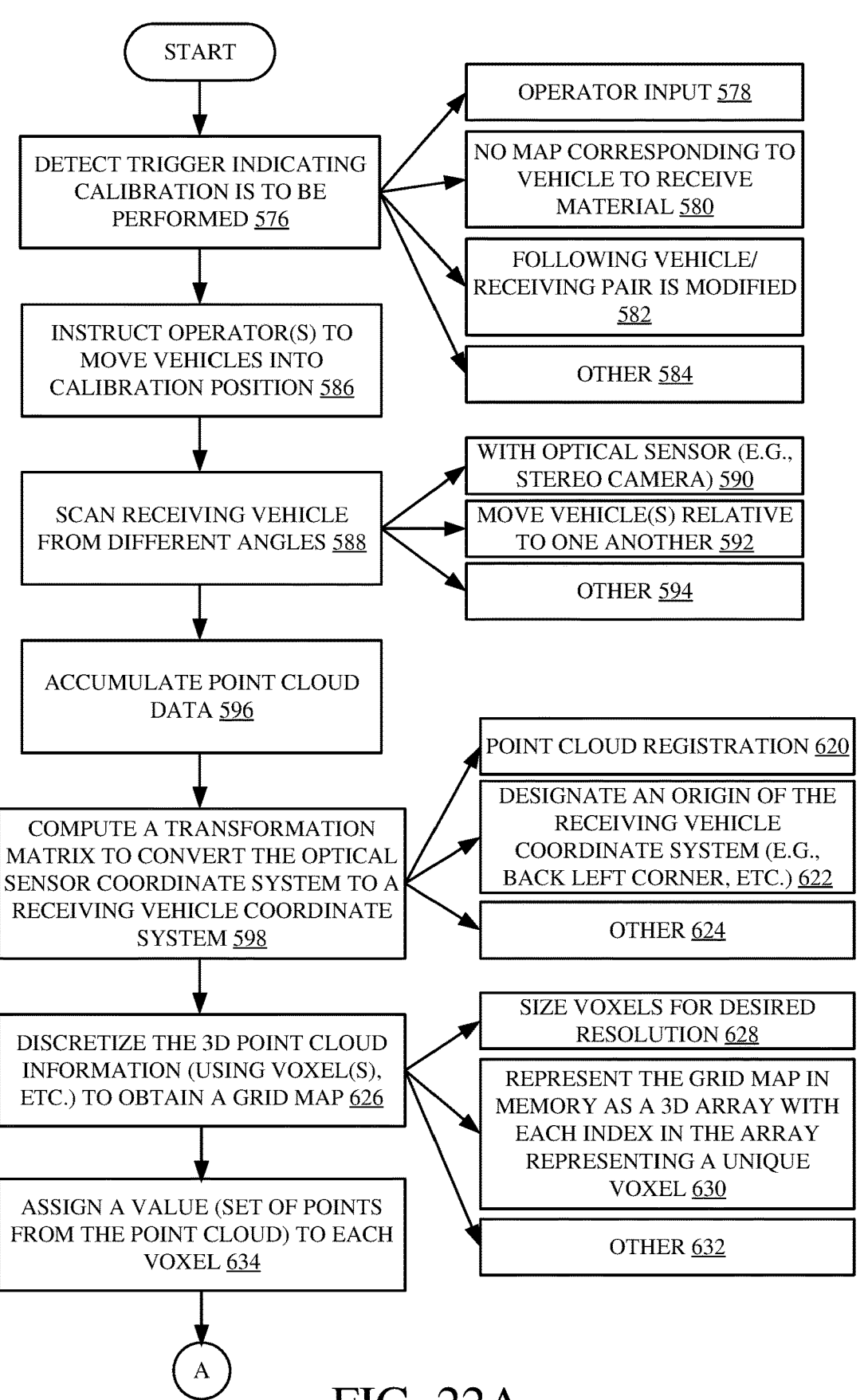
FIGS. 22A and 22B (collectively referred to herein as FIG. 22) shows a flow diagram illustrating one example of the operation of generating a grid map.
Figure 22B:
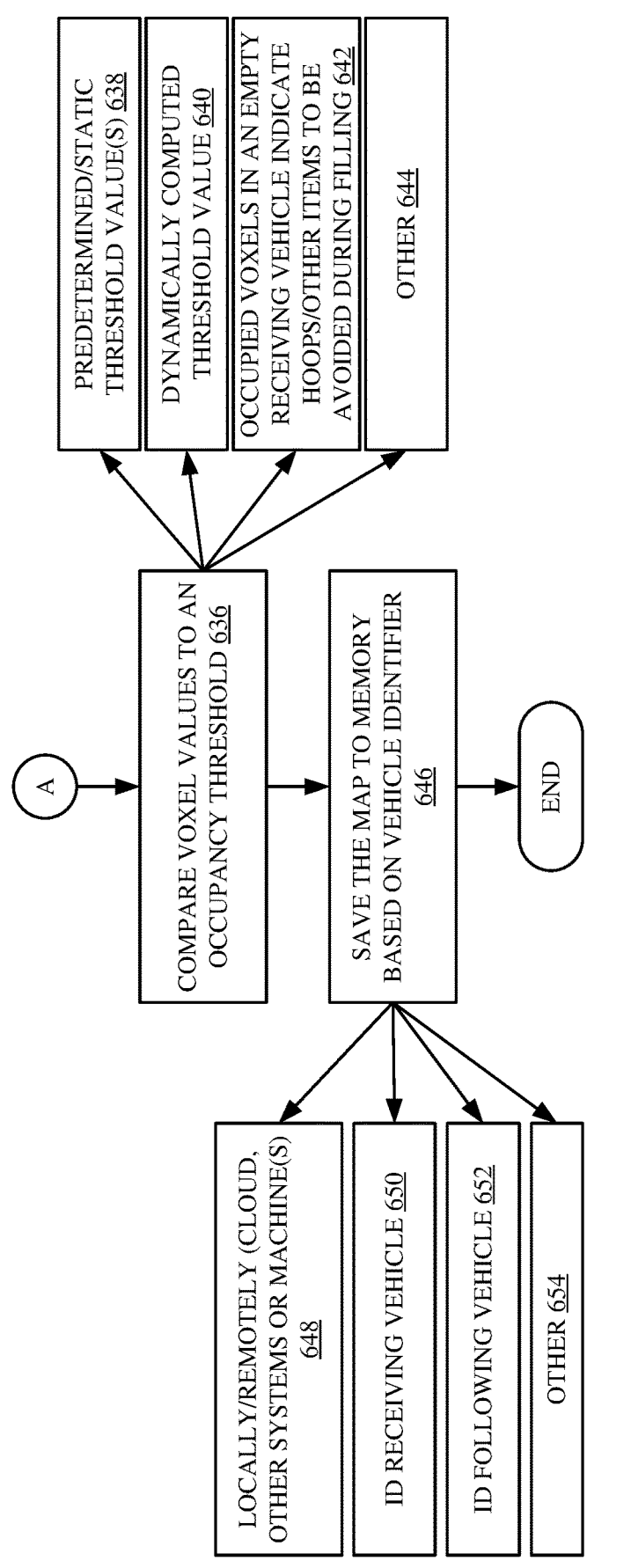

FIGS. 22A and 22B illustrate a flow diagram showing one example of the operation of grid map processing system 229 in generating a grid map for a receiving vehicle 134, where the grid map can be used later to control the unloading operation so that material being loaded into the receiving vehicle 134 does not inadvertently contact the cross members or other fixtures that may extend over the opening in the receiving vehicle 134 or otherwise impede the unloading operation. In the example described with respect to FIG. 22, the grid map is generated as part of a calibration operation performed by calibration system 162 (also shown in FIG. 5). Trigger detector 220 first detects a trigger indicating that a calibration is to be performed in order to generate a grid map for a receiving vehicle 134. Detecting a trigger to perform a calibration operation is indicated by block 576 in the flow diagram of FIG. 22. The trigger can be based on an operator input 578, or a determination that no grid map corresponding to this particular receiving vehicle has yet been generated, as indicated by block 580. The trigger may also be detected when it is determined that the following vehicle/receiving vehicle pair has been modified (for instance, that following vehicle 136 has been connected to a different receiving vehicle 134) as indicated by block 582 in the flow diagram of FIG. 22. The trigger to perform a calibration operation can be detected in other ways as well, as indicated by block 584 in the flow diagram of FIG. 22.

Operator prompt generator 224 (shown in FIG. 5) then provides an output instructing one or more of the operators of vehicles 101 and 136 to move the vehicles into calibration position where the vehicles are aligned in an unloading position so that receiving vehicle 134 can receive material from leading vehicle 101. An example is shown in FIG. 23 in which spout 108 is extended to the unloading position over receiving vehicle 134. Instructing the operations to move the vehicles into the calibration position is indicated by block 586 in the flow diagram of FIG. 22.

Operator prompt generator 224 may also prompt the operators to move one or more of the vehicles relative to the other so that camera 106 can scan (or obtain images) of the receiving vehicle 134 from different angles or different perspectives. For instance, the operator of vehicle 101 can be instructed to move forward and rearward (in the directions indicated by arrows 572-574 in FIG. 23) along the length of receiving vehicle 134 to obtain a series of images which show receiving vehicle 134 and cross members 480-484 from different angles. Scanning the receiving vehicle to obtain images from different angles is indicated by block 588 in the flow diagram of FIG. 5. Obtaining those images with an optical sensor (such as a stereo camera) is indicated by block 590. Moving the vehicles relative to one another to scan the receiving vehicle 134 is indicated by block 592. The scanning and images can be obtained in other ways as well, as indicated by block 594 in the flow diagram of FIG. 22.

Point cloud data accumulation system 552 accumulates point cloud data corresponding to receiving vehicle 134 from the captured image, as indicated by block 596 in the flow diagram of FIG. 22. Coordinate system transform processor 554 computes a transformation matrix to convert the optical sensor coordinate system (of camera 106) to the receiving vehicle coordinate system, as indicated by block

598. The transformation matrix can be computed using point cloud registration, as indicated by block 620. In one example, the origin of receiving vehicle 134 in the coordinate system is identified in a common way across all receiving vehicles. For instance, the origin of receiving vehicle 134 can be designated in the coordinate system as the back lower left corner (e.g., rear, drivers side, lower corner) of the receiving vehicle, as indicated by block 622. The origin of the receiving vehicle in the coordinates system can be designated in other ways as well, as indicated by block 624.

Voxel configuration processor 560 then discretizes the three dimensional point cloud information using a set of volumes (e.g., using voxels) to obtain a grid map, as indicated by block 626 in the flow diagram of FIG. 22. The size of the voxels can be chosen for a desired map resolution, with smaller sized voxels being used to obtain a higher resolution map. Configuring the voxel size based on a desired map resolution is indicated by block 628 in the flow diagram of FIG. 22. The grid map can be represented in memory by a data structure, such as a three dimensional array in which each index value into the three dimensional array represents a unique voxel at a particular location in the material receiving volume defined by the receiving vehicle 134, as indicated by block 630 in the flow diagram of FIG. 22. The 3D point cloud information can be discretized in other ways as well, as indicated by block 632.

Based upon the point cloud data, value assignment processor 562 assigns a point value to each voxel. The point value corresponds to the set of points from the point cloud data that reside in the volume represented by that particular voxel. Assigning a value to the voxels based on the point cloud data is indicated by block 634 in the flow the flow diagram of FIG. 22.

Occupancy threshold comparison processor 564 then compares the point value in each voxel to an occupancy threshold. If the point value meets the occupancy threshold, then processor 564 identifies the voxel as occupied, meaning that something is present within (or occupies) that voxel. Comparing the voxel values to an occupancy threshold is indicated by block 636 in the flow diagram of FIG. 22. The occupancy threshold may be a predetermined threshold or static threshold as indicated by block 638. The occupancy threshold can be a dynamically computed threshold value, as indicated by block 640. Recall that the calibration process is being performed on an empty receiving vehicle 134. Therefore, any occupied voxels in the empty receiving vehicle indicate that there are hoops or other fixtures on receiving vehicle 134 that should be avoided during a filling operation, as indicated by block 642 in the flow diagram of FIG. 22. The occupied voxels can be identified and aggregated in a list of voxels that can accompany the grid map, or that can be stored separately. Performing the voxel value comparison to the occupancy threshold can be done in other ways as well, as indicated in block 644 in the flow diagram of FIG. 22.

Vehicle identifier 568 obtains the identification data that identifies the particular receiving vehicle 134 for which the grid map (or list of occupied voxels) is generated. Again, the identification data can be the identifier of following vehicle 136 that is towing vehicle 134, a particular identifier for vehicle 134, itself, or another identifier. Grid map output generator 566 then saves the grid map (or list of occupied voxels, or both) to memory based on the vehicle identifier, so that the grid map or list of occupied voxels, or both, can be retrieved from memory using the vehicle identifier.

Saving the map to memory based on the vehicle identifier is indicated by block 646 in the flow diagram of FIG. 22.

It will be noted that the map and/or list of occupied voxels can be stored locally or remotely (such as in the cloud, in other systems or machines, etc.) as indicated by block 648. The map or occupied voxels can be stored on receiving vehicle 101 or can be stored along with an identifier of receiving vehicle 134, as indicated by block 650 or based on an identifier of following vehicle 136, as indicated by block 652. The grid map and/or list of occupied voxels can be output in other ways as well, as indicated by block 654.

Grid map processor 425 shown in FIG. 14 (in vehicle position detection system 164) locates cross members 480-484 (or other fixtures) so that the unloading operation can be controlled to avoid dumping material onto any of the cross members 480-484 (or other fixtures). Grid map processor 425 thus includes fill location identifier 656, occupied voxel list generator 658, comparison system 660, fill location change system 662, and other items 664. In one example, grid map processor 425 uses receiving vehicle parameter/grid map loading system 416 to load the grid map for the particular receiving vehicle 134 that is about to receive material from leading vehicle 101. Fill location identifier 656 obtains the fill location (the spot in receiving vehicle 134 that leading vehicle 101 is to begin filling) from the control signal generator. If the list of occupied voxels has not yet been generated from the grid map for this particular receiving vehicle 134, then occupied voxel list generator 658 generates a list of those voxels, and comparison system 660 compares the current fill location to the location of the occupied voxels to see if the current fill location overlaps any occupied voxels.

Recall that an occupied voxel will identify a cross member 480-484 or another fixture that may impede loading material into receiving vehicle 134. Therefore, if the current fill location overlaps with an occupied voxel, then fill location change system 662 generates a signal indicating that the fill location should be changed to a different location which does not overlap with the position of any occupied voxels in the list generated by list generator 658 (or otherwise generated based on the grid map).

Figure 24:
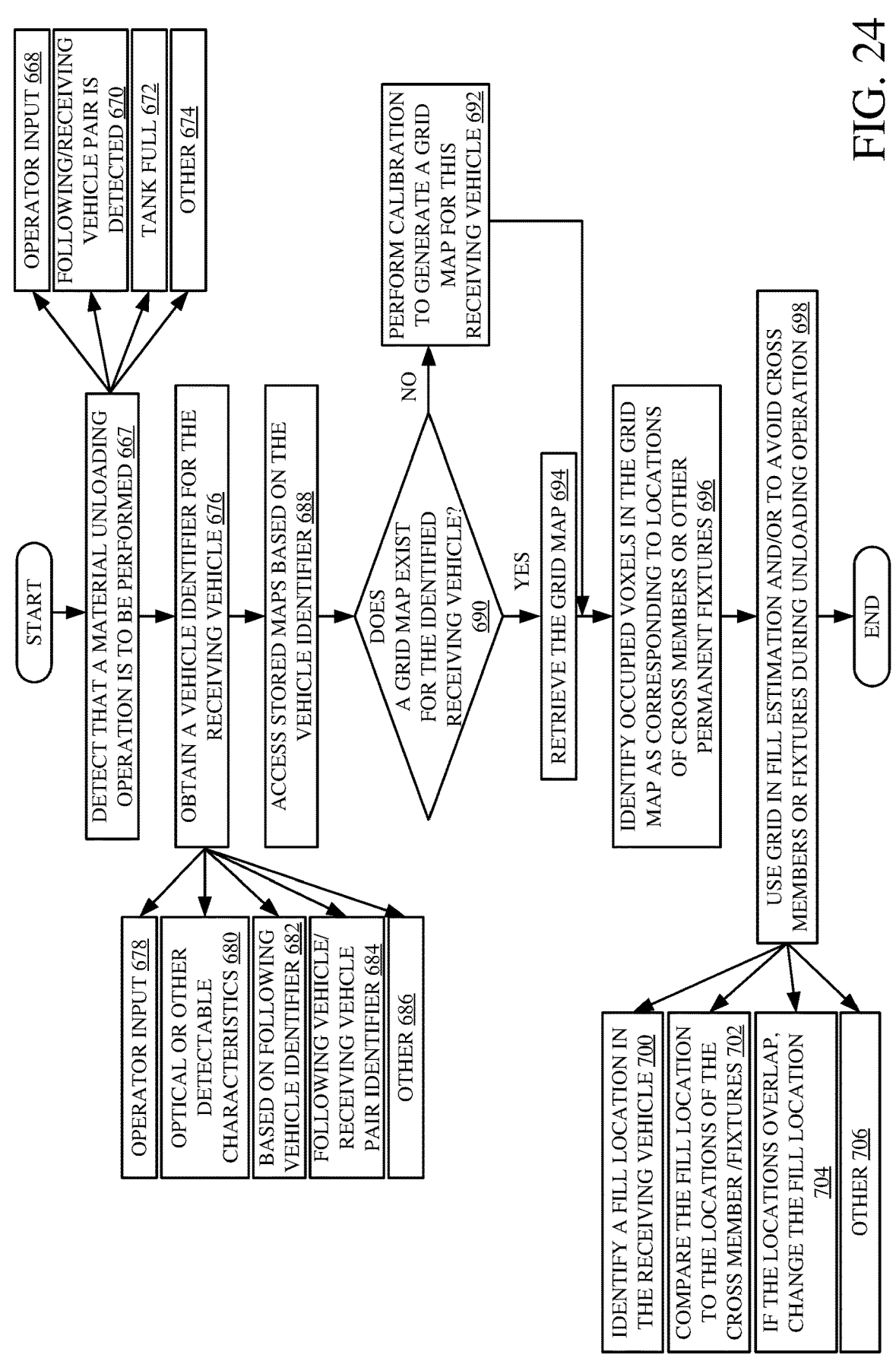
FIG. 24 is a flow diagram showing one example of using a grid map to control unloading to avoid fixtures.

FIG. 24 is a flow diagram illustrating one example of the operation of grid map processor 425 in processing a grid map so that the processed grid map can be used to control the loading operation so as to avoid dumping material onto cross members 480-484 or other fixtures on receiving vehicle 134. Position detection trigger detector 418 detects that a material unloading operation is about to be performed, as indicated by block 667 in the flow diagram of FIG. 24. The trigger can be based on an operator input 668, or an input indicating that a following vehicle/receiving vehicle pair has been detected in the proximity of leading vehicle 101, as indicated by block 670. The trigger can determine that the clean grain tank 132 on leading vehicle 101 is full so that an unloading operation is to be performed, as indicated by block 672. Detecting that the material unloading operation is to be performed can be done in a wide variety of other ways as well, as indicated by block 674 in the flow diagram of FIG. 24.

The identity of the receiving vehicle 134 can then be obtained to determine whether a grid map (and/or list of occupied voxels) has already been generated for this receiving vehicle 134. Obtaining an identifier corresponding to the receiving vehicle 134 is indicated by block 676 in the flow diagram of FIG. 24. The vehicle identifier can be input by the operator, as indicated by block 678, or the vehicle identifier can be an optical characteristic of the receiving vehicle 134 that is detected, as indicated by block 680. The vehicle identifier can be based on the identifier of following vehicle 136 that is towing receiving vehicle 134, as indicated by block 682, or the vehicle identifiers can be an identifier that identifies this particular following vehicle/receiving vehicle pair, as indicated by block 684. The vehicle identifier for receiving vehicle 134 can be any of a wide variety of other identifiers as well, as indicated by block 686.

Receiving vehicle grid map loading system 416 can then access the stored grid maps based upon the vehicle identifier, as indicated by block 688, to determine whether a grid map exists for this particular receiving vehicle, as indicated by block 690. If not, then calibration system 162 can perform a calibration operation to generate a grid map for this particular receiving vehicle 134, as indicated by block 692 and as discussed above with respect to FIG. 22.

However, if, at block 690, it is determined that a grid map does exist for this receiving vehicle 134, then receiving vehicle grid map loading system 416 retrieves that grid map, as indicated by block 694. Occupied voxel list generator 658 then (if it has not already been done) identifies the occupied voxels in the grid map as corresponding to locations of cross members 480-484 or other permanent fixtures which may impede the unloading operation, as indicated by block 696.

The voxels in the grid map can be used for fill estimation as indicated by block 698. Comparison system 660 and fill location change system 662 can provide outputs to control signal generator 166 to control the unloading operation in order to avoid the cross members 480-484 or other fixtures during the unloading operation, as indicated by block 698. For instance, fill location identifier 656 can identify the fill location in the receiving vehicle, as also indicated by block 700. Comparison system 660 can then compare the fill location to the locations of the occupied voxels (which correspond to the locations of the cross members and/or fixtures) as indicated by block 702. If the locations overlap, then fill location change system 662 can generate an output signal indicating that the fill location should be changed to a different location, which does not overlap with any of the location of any of the occupied voxels, as indicated by block 704. The unloading operation can be controlled in other ways to avoid the cross members or other fixtures, as indicated by block 706.

It can thus be seen that the present description describes a system which automatically identifies the locations of cross members on a receiving vehicle, and controls the material unloading operation to avoid those locations. This reduces the likelihood that grain or other material that is being unloaded will come into contact with the cross members. Therefore, inadvertent spillage or damage to the cross members can be avoided.

Also, as discussed elsewhere herein, during automatic unloading from a leading vehicle into a receiving vehicle, some detection systems detect the top of the receiving vehicle and estimate a fill level based upon the detected top of the receiving vehicle. Other systems may determine the fill level of the receiving vehicle based upon the weight of material transferred to the receiving vehicle, and/or the volume of the material transferred to the receiving vehicle, etc. In these types of methods, fill estimation algorithms may have difficulty in estimating the fill level of the receiving vehicle because the volume of the receiving vehicle, and the volume profile of the receiving vehicle, may be unknown. Some receiving vehicles may have oblique or slanted sides so that simple measurements of the receiving vehicle are difficult to obtain and normally cannot be used to discern the volume profile of the receiving vehicle. This makes it difficult to estimate the volume of material in the receiving vehicle. Such a problem is exacerbated where the volume of material in the receiving vehicle is estimated based upon an optically captured image of the receiving vehicle due to the high levels of dust or other obscurants. Also, some systems use the calibration mechanism discussed above, or operator inputs, to detect the length and other dimensions of the receiving vehicle in order to develop the dynamic receiving vehicle locator model 424 (discussed above with respect to FIG. 14).

The present description thus describes a system which can be used to obtain the receiving vehicle volume profile and extract dimension information that can be used to estimate the volume of material that is loaded into the receiving vehicle, in order to improve the performance of fill estimation algorithms and also to improve tracking algorithms or models that are used to track the location, orientation, and pose of the receiving vehicle, without the need to enter such dimensions manually or perform calibration routines. In one example, a manufacturer or supplier of the receiving vehicle uploads a CAD file (such as an STP file or a STEP file) corresponding to the receiving vehicle. The CAD file can be uploaded to a remote server environment or directly onto a CAD file processing system on the leading vehicle, or elsewhere. Algorithms are run on the CAD file to extract dimension data corresponding to the receiving vehicle, such as the receiving vehicle length, width, a distance from the front of the receiving vehicle to a hitch point on the receiving vehicle, the height of the receiving vehicle, axle position, cross member locations, the dimension profile of the receiving vehicle, and the volume profile of the receiving vehicle (or sufficient information so that the volume profile along a front-to-back axis of the receiving vehicle can be obtained or derived).

A CAD file can be uploaded and processed for each receiving vehicle make and model so that the dimension data and volume profile for each receiving vehicle is generated and stored. The CAD files can be pre-processed, before they are used to control unloading, and the derived information can then be accessed during unloading. The CAD file can also be processed during the unloading operation.

In one example, the algorithms that generate the volume profile for the receiving vehicle can segment the volume profile into discrete sections which are used by a fill control system 150 so that the fill level and/or volume of material in each discrete section can be identified and used during the fill operation to obtain an even fill of material in the receiving vehicle. Thus, each discrete section may be a landing point for material during the unloading operation. Similarly, the dimensions and other information from the CAD file can be used to track the cart and the volume profile. For instance, during an unloading operation, a receiving vehicle identifier is communicated over a wifi bridge from the following vehicle 136 to the leading vehicle 101 and the receiving vehicle identifier is used to obtain the dimension and profile information for the receiving vehicle 134. An optical sensor can then be used to generate point cloud information corresponding to the receiving vehicle during the unloading operation. That point cloud information can be matched against the information generated from the CAD file to identify the location, orientation, and/or pose of the receiving vehicle. Such information can be used during the unloading operation to execute a fill pattern (such as a back-to-front or front-to-back or multi-pass fill pattern) where material is filled into the discrete sections identified in the volume profile of the receiving vehicle.

In addition, a logistics processor can generate estimates of the volume of material that has been loaded into the receiving vehicle based upon the fill level of the material and the volume profile of the receiving vehicle, or in other ways. Similarly, an estimate of the volume of material that will be loaded into the receiving vehicle during a future fill operation can be generated. This information can be used to schedule receiving vehicles and other tender vehicles which may be used to service leading vehicles 101. For instance, when the leading vehicle 101 is a combine harvester that has a given volume in the clean grain tank, then a receiving vehicle 134 having a sufficient volume profile to handle the entire volume of the combine harvester 101 may be dispatched to the combine harvester 101. Other logistics control signals can be generated as well.

Figure 25:
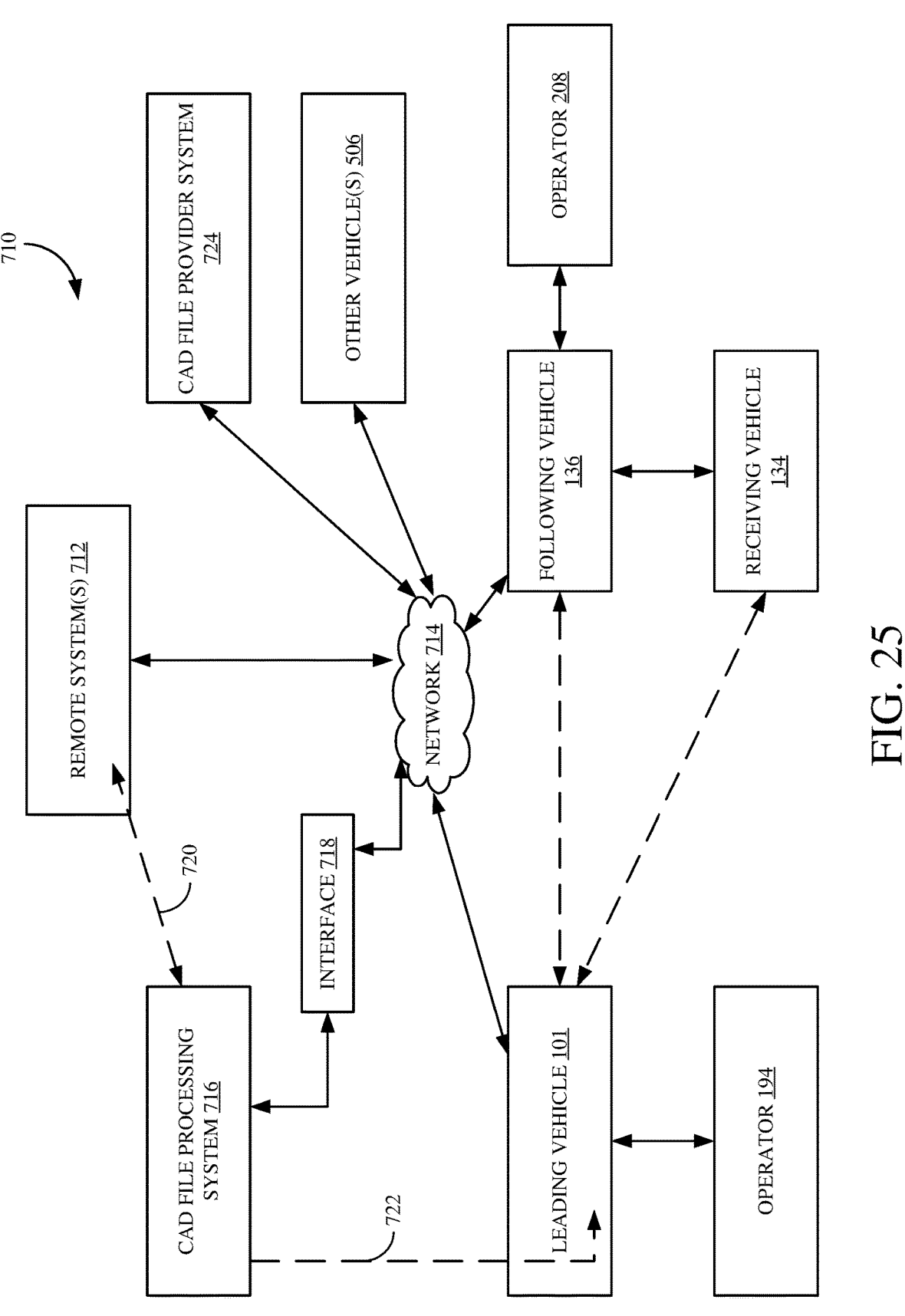
FIG. 25 shows one example of a harvesting machine architecture.

FIG. 25 is a block diagram of one example of a system architecture 710 in which a leading vehicle 101 can perform an unloading operation to unload material into receiving vehicle 134, which is propelled by following vehicle 136. Architecture 710 also shows that leading vehicle 101 and/or following vehicle 136 (and/or receiving vehicle 134) can be connected to one or more remote systems 712 and other vehicles 506 over a network 714. Similarly, a CAD file processing system 716 can expose an interface 718 for access by other items in architecture 710 over network 714. FIG. 25 also shows that CAD file processing system 716 can reside in one or more remote systems 712 or on leading vehicle 101 (as indicated by dashed arrows 720 in 722, respectively) or elsewhere in architecture 710. For example, CAD file processing system 716 can be part of unloading control system 150 on leading vehicle 101, separately disposed on leading vehicle 101, located in a remote system 712 and accessed by leading vehicle 101, located on one or more other machines, disbursed among different locations, or disposed in other ways.

FIG. 25 also shows that one or more CAD file provider systems 724 can communicate over network 714 with other items in architecture 710. The CAD file provider system 724 may be controlled by manufacturers or vendors of receiving vehicles 134 or other organizations that have CAD files corresponding to each of a plurality of different types of receiving vehicle 134. For instance, a CAD file provider system 724 may provide CAD files for multiple different models of receiving vehicle 134. In one example, CAD file provider system 724 can upload the CAD files using interface 718 exposed by CAD file processing system 716 so that the CAD files can be accessed and processed by CAD file processing system 716. Again, it will be noted that CAD file processing system 716 may be located in a remote system 712 that is accessible by leading vehicle 101, or in another system. CAD file processing system 716 is shown as a separate system communicating with other items in architecture 710 over network 714 for the sake of example only.

CAD file processing system 716 can obtain the CAD files and run algorithms on the uploaded CAD files in order to generate parameters and dimension information, as well as volume profile information, corresponding to each of the CAD files and thus corresponding to each different type of receiving vehicle 134. The information generated by CAD file processing system 716 (e.g., the derived information) for a plurality of different receiving vehicles 134 can be downloaded and stored on leading vehicle 101 automatically, or leading vehicle 101 can first identify the receiving vehicle 134 that is about to be loaded with material from leading vehicle 101 and, based upon the identify of receiving vehicle 134, leading vehicle 101 can request the CAD file or derived information for the specific receiving vehicle 134 that is about to be filled. Unloading control system 150 on leading vehicle 101 can then use that derived information to control the unloading process to unload material into receiving vehicle 134.

For example, CAD file processing system 716 (or another item on leading vehicle 101) can generate point cloud data corresponding to optical detection of receiving vehicle 134. That point cloud data can be compared against corresponding data derived from the CAD file for receiving vehicle 134 so that the location, orientation, and/or pose of receiving vehicle 134, relative to leading vehicle 101, can be identified. This type of location information can be used to track receiving vehicle 134 relative to leading vehicle 101, and thus control the position of the material conveyance subsystem 186 so that material is conveyed to receiving vehicle 134 at desired locations. Similarly, because the volume profile of receiving vehicle 134 is known, then the volume of material transferred to receiving vehicle 134 can be detected and/or estimated based upon the fill level of material in receiving vehicle 134 and the corresponding volume profile. Further, a logistics controller can generate logistics control signals based upon the information derived from the CAD file (such as based upon the volume profile corresponding to the receiving vehicle 134). The logistics control signals can be control signals that are used to control various operations based upon the volume capacity and volume profile of a receiving vehicle 134 (e.g., which receiving vehicle should be dispatched for unloading to which leading vehicle 101), as well as the volume of material that is actually loaded into a receiving vehicle 134.

Figure 26:
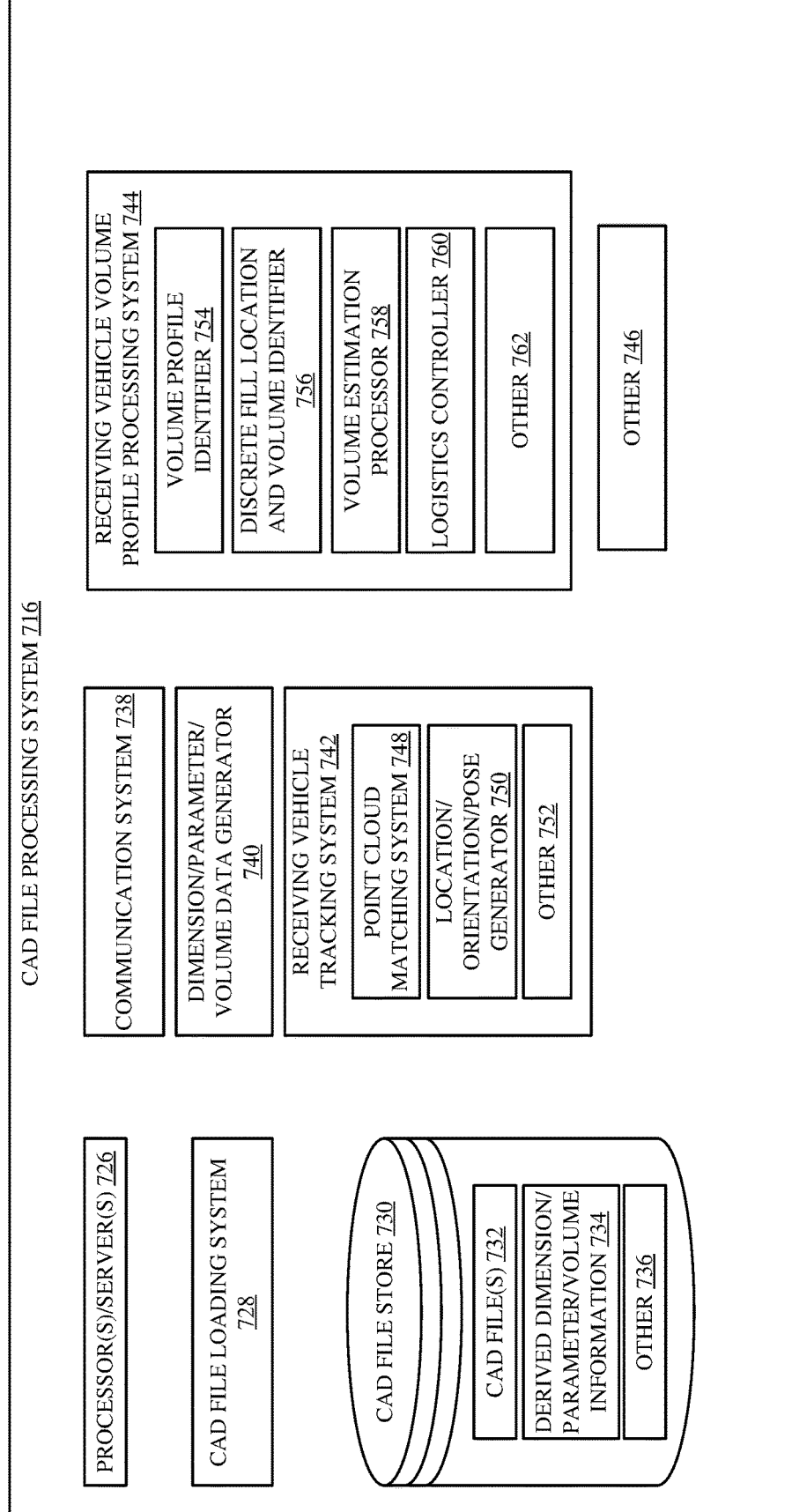
FIG. 26 shows a block diagram of one example of a computer aided design (CAD) file processing system.

FIG. 26 is a block diagram showing one example of CAD file processing system 716 in more detail. In the example shown in FIG. 26, CAD file processing system 716 includes one or more processors or servers 726, CAD file loading system 728, CAD file store 730 (which may include one or more CAD files 732, derived dimension/parameter/volume information 734, and other items 736), communication system 738, dimension/parameter/volume data generator 740, receiving vehicle tracking system 742, receiving vehicle volume profile processing system 744, and other items 746. Receiving vehicle tracking system 742 can include point cloud matching system 748, location/orientation/pose generator 750, and other items 752. Receiving vehicle volume profile processing system 744 can include volume profile identifier 754, discrete fill location and volume identifier 756, volume estimation processor 758, logistics controller 760, and other items 762. Before describing the operation of CAD file processing system 716 in more detail, a description of some of the items in CAD file processing system 716 and their operation, will first be provided.

CAD file loading system 728 illustratively exposes interface 718 (shown in FIG. 25) which can be accessed by CAD file provider systems 724 to upload CAD files for various different receiving vehicles 134. Dimension/parameter/volume data generator 740 can run algorithms on the CAD files to generate the parameter and dimension information, as well as the volume profile information that describes the volume profile corresponding to the receiving vehicle 134 represented by the CAD file. The CAD file 732 along with the derived dimension/parameter/volume information 734 can then be stored in CAD file store 730, and indexed by identifiers that identify the different corresponding receiving vehicles 134.

When leading vehicle 101 is, or is about to, unload material into a receiving vehicle 134, receiving vehicle tracking system 742 can use the CAD file 732 and/or the derived information 734 corresponding to that receiving vehicle 134 in order to track the location, orientation, and/or pose of the receiving vehicle 134 relative to leading vehicle 101. In one example, an optical sensor 169 on leading vehicle 101 captures images or other information corresponding to receiving vehicle 134 and generates point cloud data from the captured images. For instance, the point cloud data can be generated from images captured by a stereo camera or in other ways. The point cloud data can then be matched against information in CAD files 732 or derived information 734 in order to identify the location, orientation, and/or pose of receiving vehicle 134 relative to the optical sensor 106, and thus relative to the material conveyance subsystem 186 on leading vehicle 101. The location, orientation, and/or pose can be output to vehicle position detection system 164 or directly output to control signal generator 166, or output to another item in unloading control system 150, so the unloading operation can be controlled accordingly.

Receiving vehicle volume profile processing system 744 identifies or generates the receiving vehicle volume profile from the CAD files 732 or from the derived information 734. Discrete fill location and volume identifier 756 divides the volume profile into discrete parts (e.g., discrete volumes, along the front-to-back axis of receiving vehicle 134 or in another way). Each of the discrete areas can correspond to a landing point where material conveyance subsystem 186 will be controlled to convey material within receiving vehicle 134. Therefore, the discrete fill locations and corresponding volumes generated by identifier 756 can be provided to vehicle position detection system 164 and/or control signal generator 166, or to other items in unloading control system 150, to be used during the unloading operation. By way of example, the material conveyance subsystem 186 can be controlled to convey material to the different discrete locations in receiving vehicle 134 according to a desired fill pattern (e.g., front-to-back, back-to-front or multi-pass fill pattern).

Volume estimation processor 758 can obtain an indication of the fill level of material in each of the discrete unloading locations and estimate the volume of material that has been unloaded into each of those locations based on the volume of each discrete location and based on the fill level in each discrete location. By way of example, if the volume profile of each discrete location is known, and the fill height or other indication of fill level that measures the level of material unloaded into each of the discrete locations is known, then the volume of material unloaded into each of the discrete locations can be generated as well. Volume estimation processor 758 also aggregates the volume of material loaded into each of the discrete locations to obtain an overall volume of material that has been unloaded into the receiving vehicle 134. The volume information (e.g., the volume capacity for a receiving vehicle 134 as well as the volume of material loaded into receiving vehicle 134), can be used by logistics controller 760 to generate logistics control signals. The logistics control signals can control receiving vehicle dispatch which determines which particular receiving vehicles are to be sent to the different leading vehicles, and when the receiving vehicles are to be dispatched, as well as to control other transport and control logistics.

FIG. 27 is a flow diagram illustrating one example of the operation of architecture 710 in obtaining and utilizing CAD files for a plurality of different receiving vehicles 134. In one example, CAD file processing system 716 exposes interface 718 for uploading CAD files corresponding to receiving vehicles, as indicated by block 764 in the flow diagram of FIG. 27. It should be noted that the CAD file store 730 can be in CAD file processing system 716 or elsewhere in architecture 710.

In one example, the CAD files are uploaded from an external source, such as CAD file provider system 724. Each CAD file may be identified by the model number of the receiving vehicle 134 that it represents, or in other ways, as indicated by block 766. The CAD files can be uploaded in other ways as well, as indicated by block 768.

The CAD file processing system 716 eventually receives a CAD file and a vehicle identifier (that identifies the receiving vehicle 134 corresponding to the CAD file) through the exposed interface 718, as indicated by block 770 in the flow diagram of FIG. 27. At some point, CAD file processing system 716 detects a trigger indicating that a leading vehicle 101 wishes to access the CAD file (or information derived from the CAD file), as indicated by block 772 in the flow diagram of FIG. 27. For instance, in one example, the trigger may be that communication system 738 receives a request from a leading vehicle 101 for the CAD file or derived information. In another example, such as where the CAD file processing system 716 is located on leading vehicle 101, then as soon as the identity of receiving vehicle 134 is obtained, that can serve as a trigger for CAD file processing system 716 to output the CAD file 732 or the derived information 734 corresponding to the identified receiving vehicle 136. It will be noted that CAD file processing system 716 can run the processing algorithms to preprocess the CAD file 732 to generate the dimension/parameter/volume data 734. Preprocessing the CAD file 732 (before it is requested) is indicated by block 774 in the flow diagram of FIG. 27. Also, the CAD files 732 may be processed during runtime so that the dimension/parameter/volume data can be generated as it is requested by a leading vehicle 101. Processing the CAD file during runtime is indicated by block 776. Detecting a trigger to access the CAD file or derived information can be performed in other ways as well, as indicated by block 778.

The CAD file and/or the derived information is then loaded into receiving vehicle tracking system 742 and/or receiving vehicle volume profile processing system 744 so that the tracking information and/or volume profile information can be used by leading vehicle 101. Loading the CAD file and/or derived information in such a way is indicated by block 780 in the flow diagram of FIG. 27.

The CAD file and/or the derived information are then used by leading vehicle 101 in order to control the unloading operation, as indicated by block 782 in the flow diagram of FIG. 27. In one example, receiving vehicle volume profile processing system 744 can perform volume processing, as indicated by block 784. Receiving vehicle tracking system 742 can also generate outputs that can be used to track the receiving vehicle 134 during an unloading operation, as indicated by block 786. The CAD file and/or derived information can be used to control the unloading operation in other ways as well, as indicated by block 788.

Figure 28A:
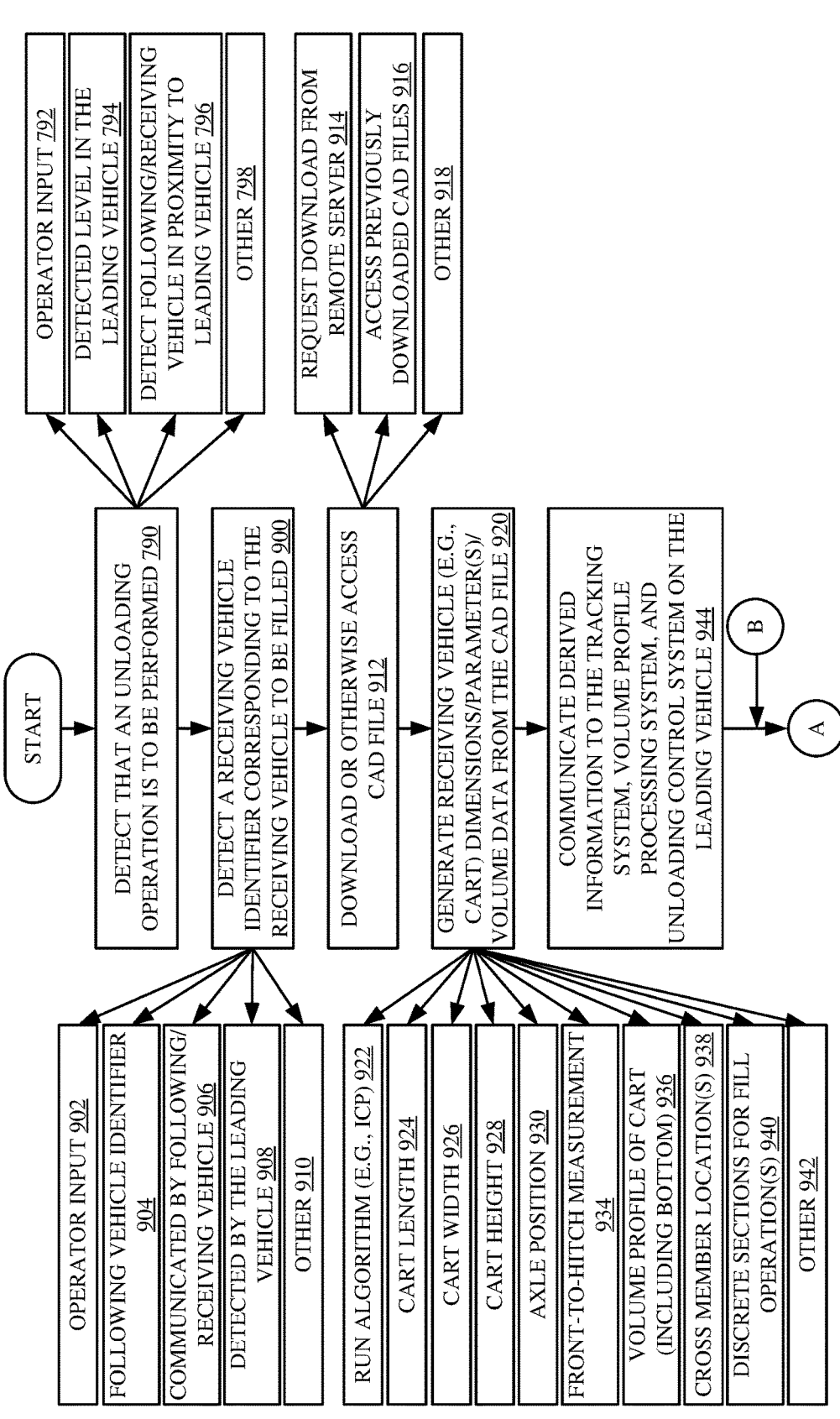
FIGS. 28A, 28B, and 28C (hereinafter collectively referred to as FIG. 28) show a flow diagram illustrating one example of using CAD file information in performing unloading control.
Figure 28B:
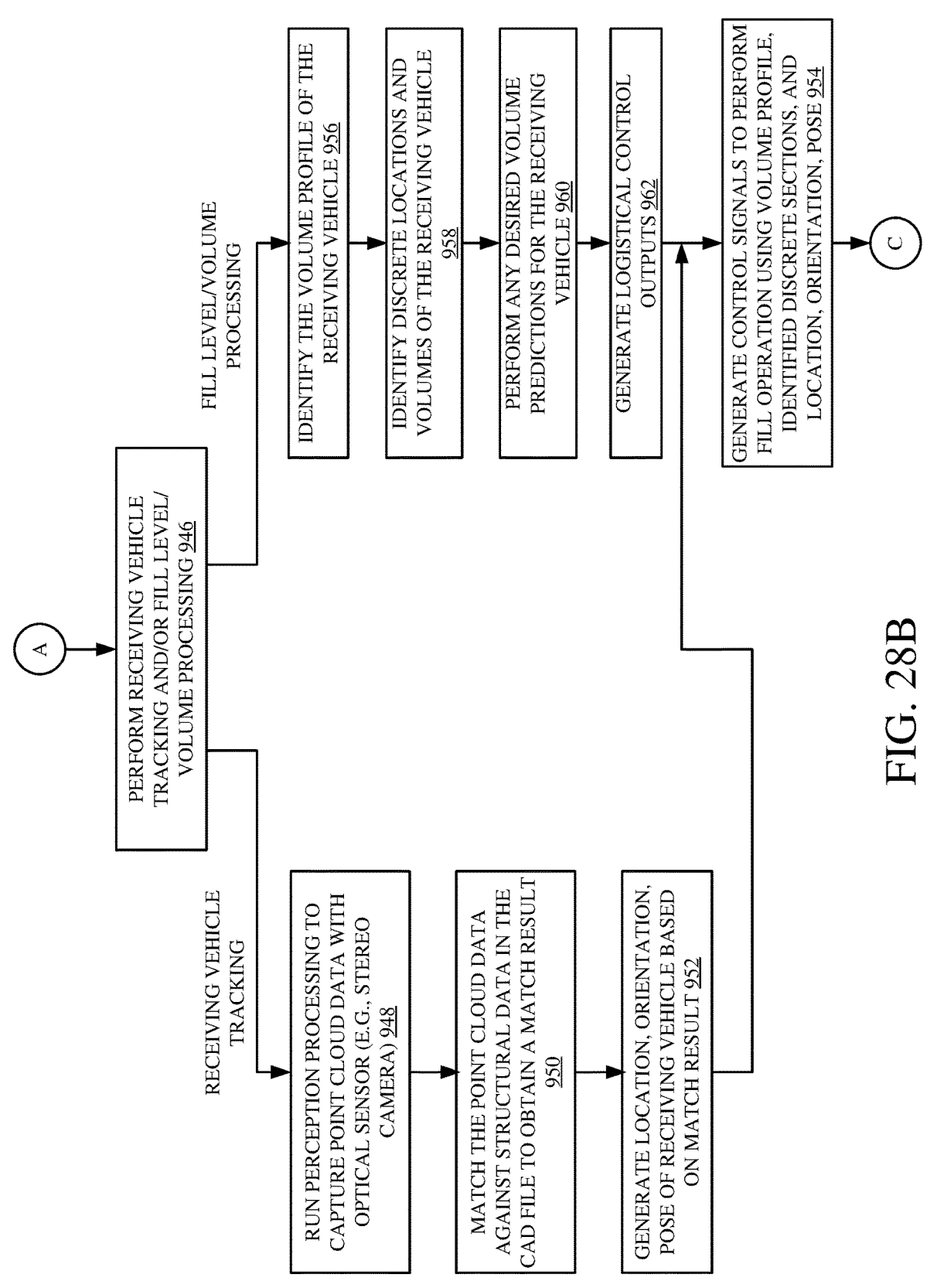
Figure 28C:
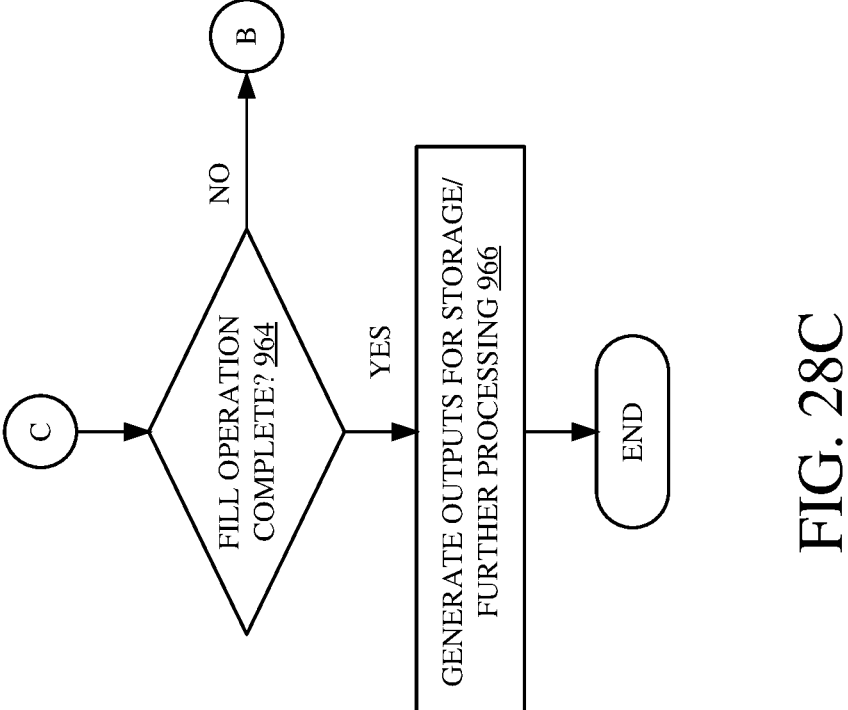

FIGS. 28A, 28B, and 28C (collectively referred to herein as FIG. 28) show a flow diagram illustrating one example of the operation of CAD file processing system 716 and unloading control system 150 in controlling an unloading operation and performing volume estimation and logistics processing. It is assumed for the sake of describing FIG. 28 that a receiving vehicle 101 is about to perform an unloading operation to unload material into a receiving vehicle 134. Detecting that an unloading operation is to be performed is indicated by block 790 in the flow diagram of FIG. 28. In one example, operator 194 can provide an operator input 792 indicating that an unloading operation is about to be performed. In another example, a sensor on leading vehicle 101 can detect the level of material in the leading vehicle 101 (in the clean grain tank of a harvester) indicating that an unloading operation needs to be performed, as indicated by block 794. In another example, receiving vehicle sensor 152 or following vehicle/receiving vehicle pair detector 160 can detect that a following vehicle 136 and receiving vehicle 134 are in the proximity of leading vehicle 101 indicating that an unloading operation is about to begin, as indicated by block 796. Detecting that an unloading operation is about to be performed can be performed in other ways as well, as indicated by block 798.

Following vehicle/receiving vehicle pair detector 160 detects an input that includes a receiving vehicle identifier that identifies the receiving vehicle 134 that is to be filled. Detecting the receiving vehicle identifier is indicated by block 900 in the flow diagram of FIG. 28. The receiving vehicle identifier can be based on an operator input 902 (such as from operator 208 manually communicating the receiving vehicle identifier, or from operator 194 manually inputting the receiving vehicle identifier). The receiving vehicle identifier may be the vehicle identification number (VIN) for following vehicle 136, as indicated by block 904. The receiving vehicle identifier may be communicated by the following vehicle 136 or the receiving vehicle 134, itself, to leading vehicle 101, as indicated by block 906 in the flow diagram of FIG. 28. The receiving vehicle identifier can be detected by a sensor on leading vehicle 101, as indicated by block 908. The receiving vehicle identifier can be detected or obtained in other ways as well, as indicated by block 910.

If the derived information 734 has not already been generated for the identified receiving vehicle 134, then CAD file loading system 728 loads the CAD file 732 or otherwise accesses the CAD file 732 corresponding to the receiving vehicle 134. Downloading or accessing the CAD file 732 is indicated by block 912 in the flow diagram of FIG. 28. In one example, CAD file loading system 728 can request loading of the CAD file 732 from the CAD file provider system 724, as indicated by block 914. In another example, the CAD file 732 may have already been downloaded and can simply be accessed to generate the derived information 734, as indicated by block 916. The CAD file 732 can be obtained in other ways as well, as indicated by block 918.

Dimension/parameter/volume data generator 740 then generates receiving vehicle dimension/parameter/volume data (the derived data) from the CAD file, as indicated by block 920 in the flow diagram of FIG. 28. In one example, the generator 740 can run one or more algorithms (e.g., the ICP algorithm or other algorithms) against the CAD file 732 to generate the derived information, as indicated by block 922. Some of the derived information can include the receiving vehicle length 924, the receiving vehicle width 926, the receiving vehicle height 928, the axle position 930 on the receiving vehicle, the front-to-hitch point measurement 934, the volume profile of the receiving vehicle (e.g., including the volume profile of the bottom portion of the vehicle which may be unseen) as indicated by block 936, the cross member locations 938 on the receiving vehicle, as well as the location of the discrete sections of the receiving vehicle 134 that may be used during the fill operation, as indicated by block 940. The derived information can include any of a wide variety of other information 942 as well. The derived information can be communicated to the receiving vehicle tracking system 742, the receiving vehicle volume profile processing system 744, and/or other portions of the unloading control system 150 on the leading vehicle 101, as indicated by block 944 in the flow diagram of FIG. 28.

Receiving vehicle tracking system 742 can generate outputs indicative of the location, orientation, and/or pose of receiving vehicle 134, relative to the material conveyance subsystem 186 on leading vehicle 101. Receiving vehicle volume profile processing system 744 can generate outputs indicative of the volume profile of receiving vehicle 134 and the volume of material loaded into the various discrete sections of receiving vehicle 134. Loading control system 150 can generate outputs controlling the unloading operation as well. Performing receiving vehicle tracking and/or fill level/volume processing is indicated by block 946 in the flow diagram of FIG. 28.

In order to perform receiving vehicle tracking, point cloud matching system 748 can receive point cloud data that is generated using an optical sensor 169 (such as a stereo camera) for to receiving vehicle 134. The point cloud information can be generated by vehicle position detection system 164 or another system running a perception algorithm based upon the captured images. Capturing the point cloud data corresponding to receiving vehicle 134 is indicated by block 948 in the flow diagram of FIG. 28.

Point cloud matching system 748 then matches the point cloud data captured from receiving vehicle 134 against the structural data in the CAD file (or the derived data) to obtain a match result, as indicated by block 950. For instance, point cloud matching system 748 may attempt to take the point cloud data captured from the receiving vehicle 134 and align that data against similar point cloud data derived from the CAD file. The matching result may indicate the orientation, location or position, and/or pose of receiving vehicle 134 in the captured image.

Location/orientation/pose generator 750 then uses the match result (the way that the captured point cloud data is transformed in order to align with the CAD file data) to generate a location, orientation, and/or pose of the receiving vehicle 134 relative to the leading vehicle 101 (and, in one example, relative to the material conveyance subsystem 186 on the leading vehicle 101). Generating the location, orientation, and/or pose of the receiving vehicle 134 is indicated by block 952 in FIG. 28. The output from generator 750 can include coordinates in a global or local coordinate system that identify the location, orientation, and/or pose of receiving vehicle 134. Those coordinates can then be transformed into the coordinate system of the leading vehicle 101 so that the location, orientation, and/or pose of receiving vehicle 134 can be identified relative to the location of material conveyance subsystem 186 so that the unloading operation can be performed (e.g., nudges can be generated to change the relative position of receiving vehicle 134 and leading vehicle 101) in order to perform a desired fill operation.

Vehicle position detection system 164 and/or control signal generator 166 can then generate control signals to perform a fill operation using the volume profile of receiving vehicle 134, the discrete sections identified in receiving vehicle 134, as well as the location, orientation, and/or pose of receiving vehicle 134. Generating the control signals to perform the desired fill operation is indicated by block 954 in the flow diagram of FIG. 28. Generating the control signals to perform the fill operation can also include generating an output indicating the volume of material that has been loaded into each of the discrete locations in receiving vehicle 134.

Receiving vehicle volume profile processing system 744 can perform the volume profile processing in conjunction with, or sequentially with, the processing being performed by receiving vehicle tracking system 742. In one example, volume profile identifier 754 identifies the volume profile of the receiving vehicle 134, as indicated by block 956 in the flow diagram of FIG. 28. Discrete fill location and volume identifier 756 can identify the discrete fill locations on receiving vehicle 134, as well as the volume corresponding to each of those locations. Identifying the discrete locations of the receiving vehicle 134 that are to be used along with the volume of each of those sections is indicated by block 958 in the flow diagram of FIG. 28.

Volume estimation processor 758 can also perform any desired volume predictions for the receiving vehicle 134, such as aggregating the volume of the discrete sections in receiving vehicle 134 to obtain an overall material volume capacity for receiving vehicle 134. Performing such volume predictions for receiving vehicle 134 is indicated by block 960 in the flow diagram of FIG. 28.

Logistics controller 760 can generate logistics control outputs, as indicated by block 962. The logistics control outputs can include dispatch control outputs that control which receiving vehicles are dispatched to which leading vehicles 101, the timing of dispatch, among other things.

Until the fill operation is complete, as determined at block 964 in the flow diagram of FIG. 28, processing can revert back to block 946 where CAD file processing system 716 continues to perform the receiving vehicle tracking operations as well as the fill level/volume processing. Once the fill operation is complete, then CAD file processing system 716 can generate outputs for storage or further processing, as indicated by block 966 in the flow diagram of FIG. 28.

It can thus be seen that the present description describes a system in which a CAD file corresponding to a receiving vehicle 134 is obtained and processed to obtain a volume profile for that receiving vehicle. The volume profile can be used to control a fill operation and to generate logistics control signals.

Figure 29:
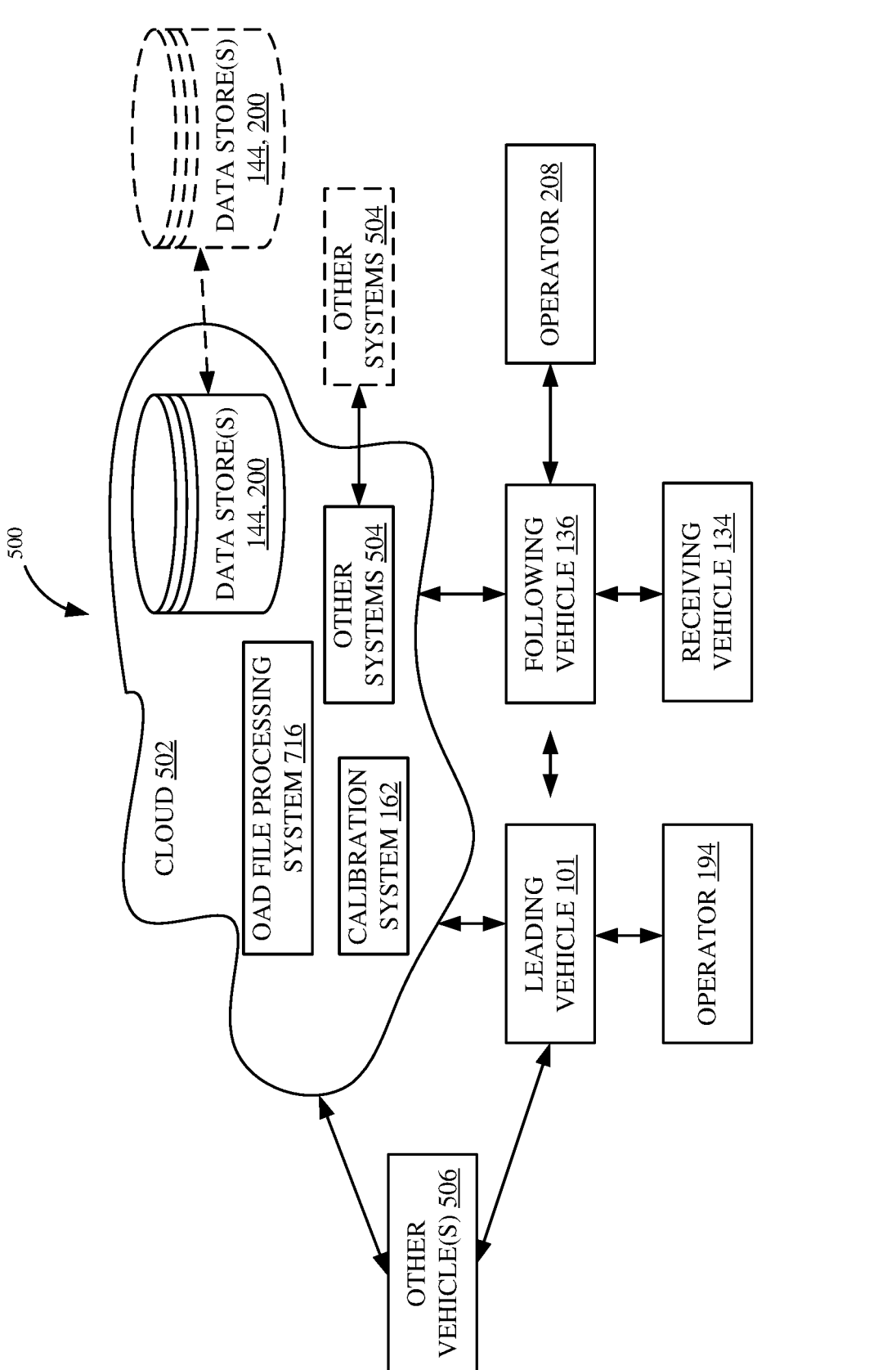
FIG. 29 is a block diagram showing one example of a harvesting machine deployed in a remote server architecture.

FIG. 29 is a block diagram illustrating agricultural system, shown in FIG. 25, except that the system is disposed in a remote server architecture 500. In an example, remote server architecture 500 can provide computation, software, data access, and storage services that do not require end-user knowledge of the physical location or configuration of the system that delivers the services. In various examples, remote servers can deliver the services over a wide area network, such as the internet, using appropriate protocols. For instance, remote servers can deliver applications over a wide area network and they can be accessed through a web browser or any other computing component. Software or components shown in previous FIGS. as well as the corresponding data, can be stored on servers at a remote location. The computing resources in a dispersed. Remote server infrastructures can deliver services through shared data centers, even though they appear as a single point of access for the user. Thus, the components and functions described herein can be provided from a remote server at a remote location using a remote server architecture. Alternatively, the components and functions can be provided from a conventional server, or the components and functions can be installed on client devices directly, or in other ways.

In the example shown in FIG. 29, some items are similar to those shown in FIG. 25 and they are similarly numbered. FIG. 29 specifically shows that data stores 144, 200, calibration system 162, CAD file processing system 176, and other systems 504, can be located at a remote server location 502. Therefore, vehicles 101, 136 can access those systems through remote server location 502.

FIG. 29 also depicts another example of a remote server architecture. FIG. 29 shows that it is also contemplated that some elements of FIG. 25 can be disposed at remote server location 502 while others are not. By way of example, one or more of data stores 144, 200 and other systems 504, or other items can be disposed at a location separate from location 502, or disbursed among various locations, and accessed through the remote server at location 502. Regardless of where the items are located, the items can be accessed either directly by machine 101 and/or machine 136, through a network (either a wide area network or a local area network), the items can be hosted at a remote site by a service, or the items can be provided as a service, or accessed by a connection service that resides in a remote location. Also, the data can be stored in substantially any location and intermittently accessed by, or forwarded to, interested parties. All of these architectures are contemplated herein.

FIG. 29 shows that other vehicles 506 can communicate with one or more vehicles 101, 136, or with remote server environment 502 to obtain the calibrated offset values and/or other information. It will also be noted that the elements of FIG. 25, or portions of them, can be disposed on a wide variety of different devices. Some of those devices include servers, desktop computers, laptop computers, tablet computers, or other mobile devices, such as palm top computers, cell phones, smart phones, multimedia players, personal digital assistants, etc.

Figure 30:
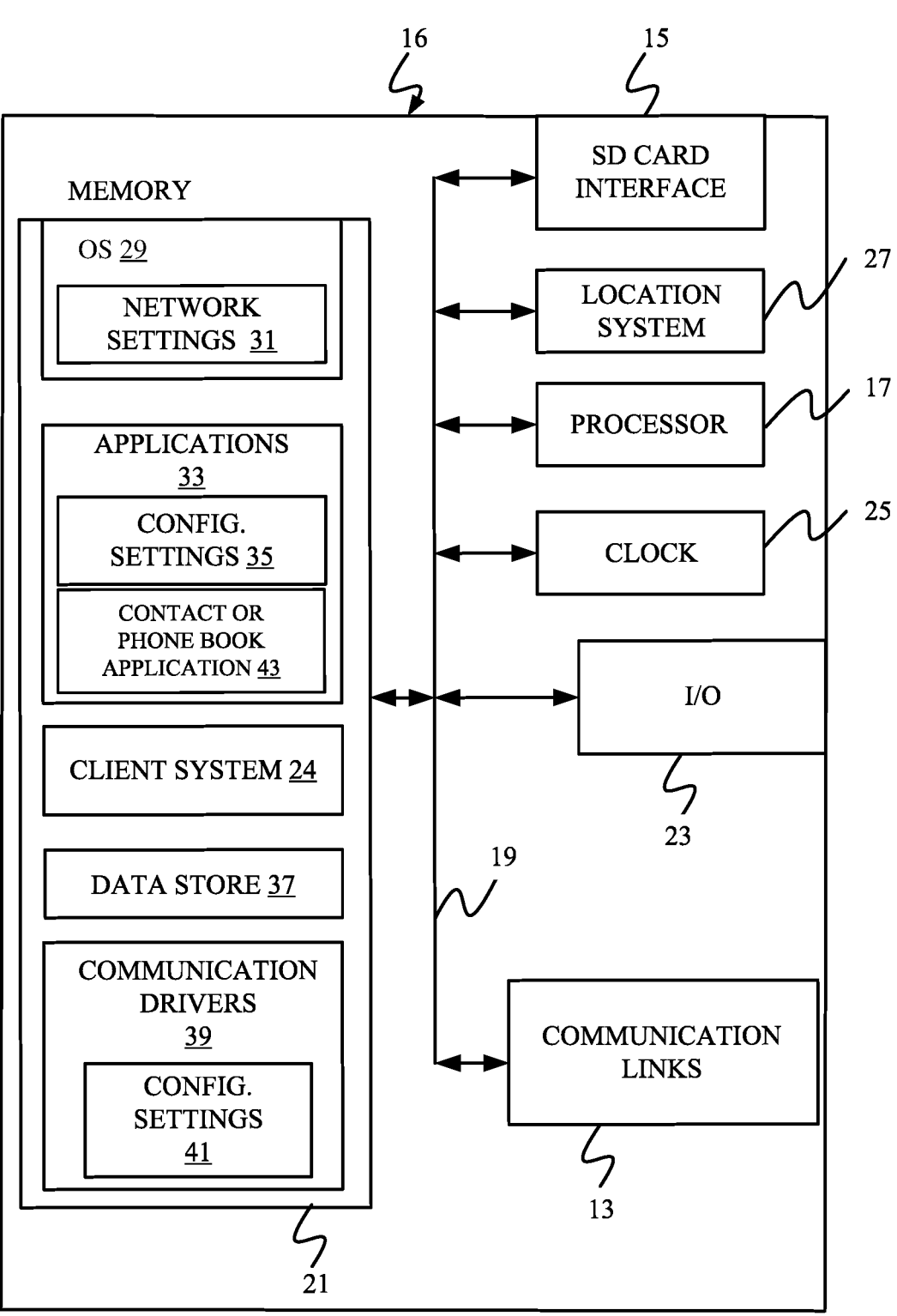
FIGS. 30-32 show examples of mobile devices that can be used in the machines and systems described in other figures.
Figure 31:
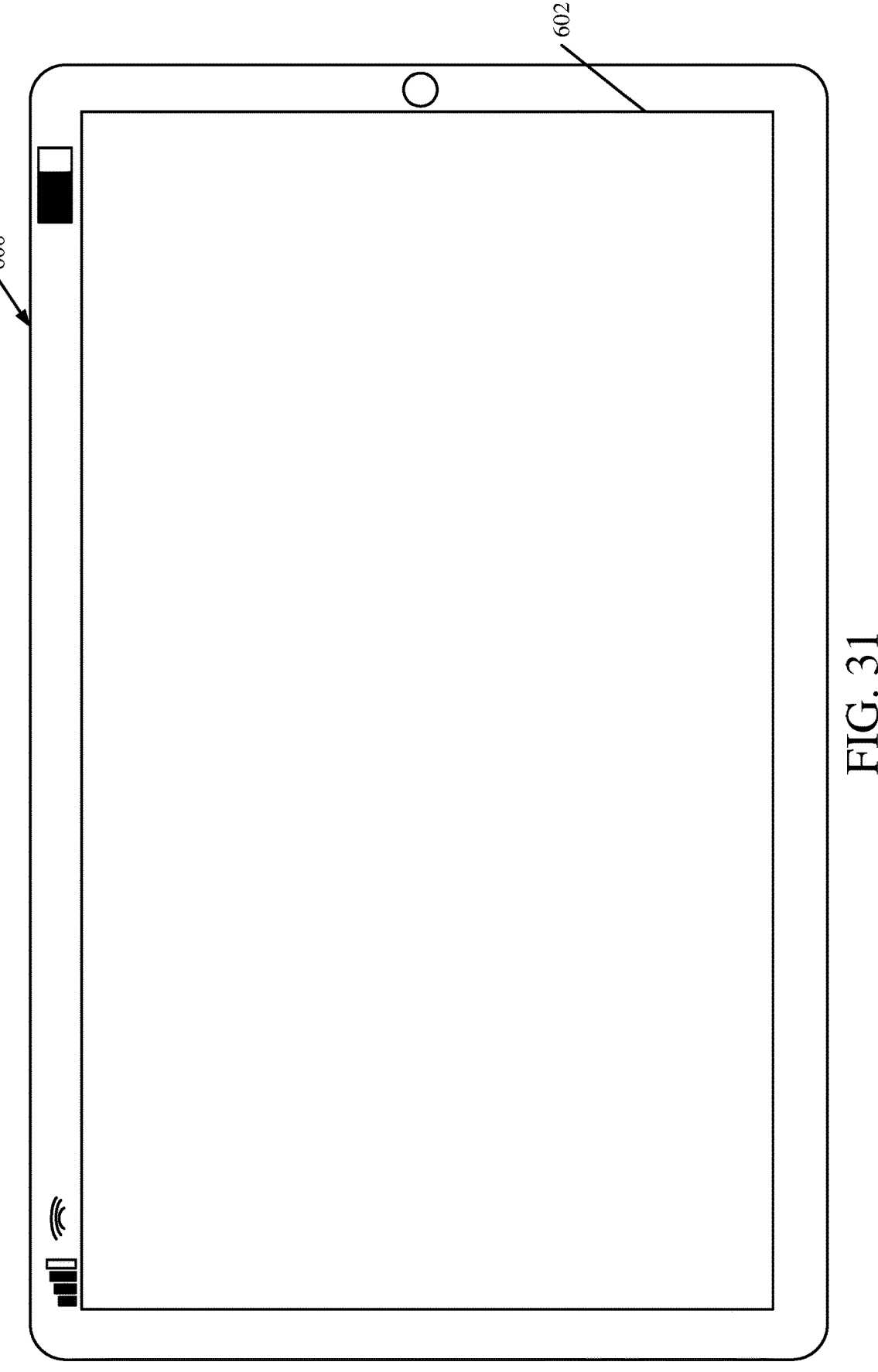
Figure 32:
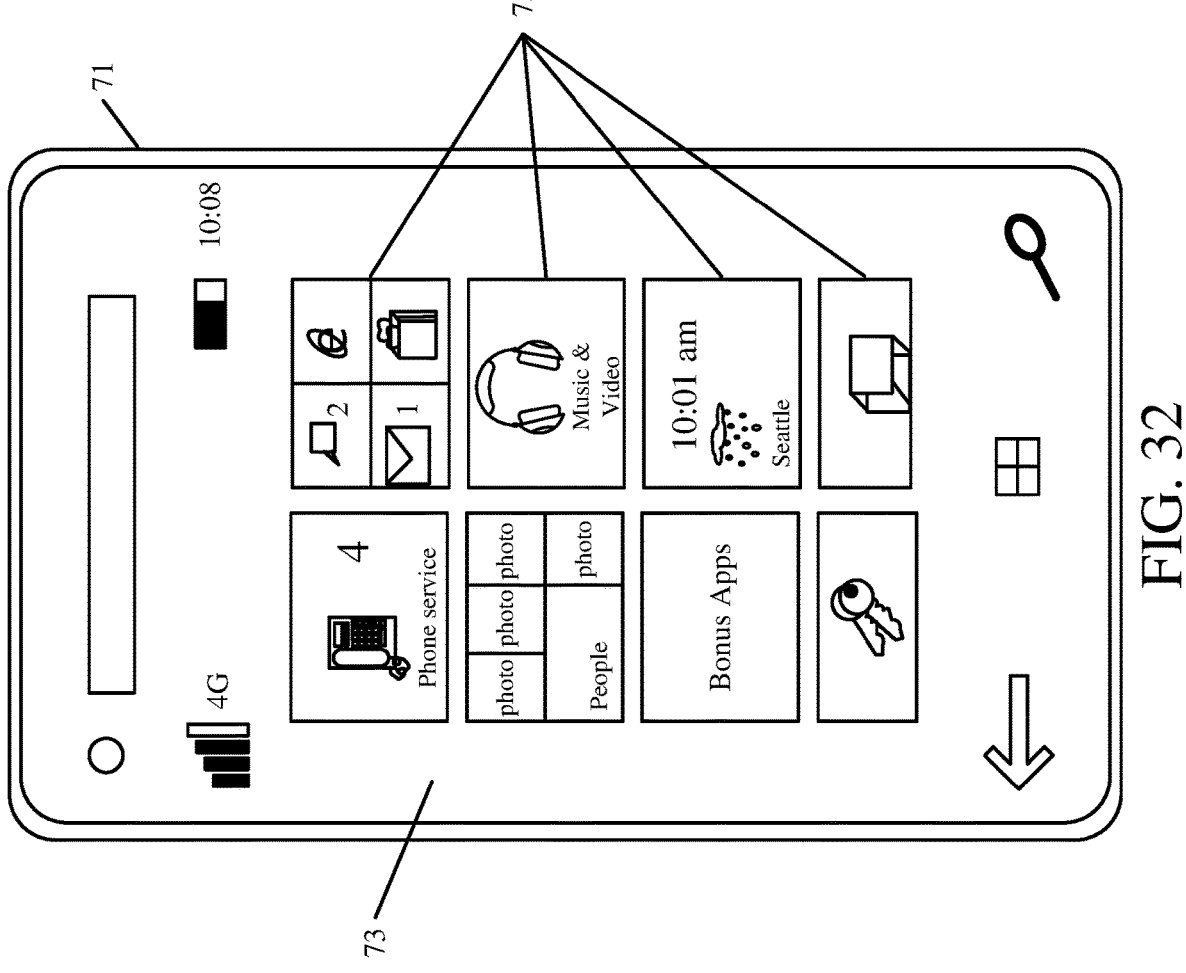

FIG. 30 is a simplified block diagram of one illustrative example of a handheld or mobile computing device that can be used as a user's or client's hand held device 16, in which the present system (or parts of it) can be deployed. For instance, a mobile device can be deployed in the operator compartment of one or both of vehicles 101, 136 for use in generating, processing, or displaying the calibrated offset values. FIGS. 31-32 are examples of handheld or mobile devices.

FIG. 30 provides a general block diagram of the components of a client device 16 that can run some components shown in FIG. 25, that interacts with them, or both. In the device 16, a communications link 13 is provided that allows the handheld device to communicate with other computing devices and in some examples provides a channel for receiving information automatically, such as by scanning. Examples of communications link 13 include allowing communication though one or more communication protocols, such as wireless services used to provide cellular access to a network, as well as protocols that provide local wireless connections to networks.

In other examples, applications can be received on a removable Secure Digital (SD) card that is connected to an interface 15. Interface 15 and communication links 13 communicate with a processor 17 (which can also embody processors from previous FIGS.) along a bus 19 that is also connected to memory 21 and input/output (I/O) components 23, as well as clock 25 and location system 27.

I/O components 23, in one example, are provided to facilitate input and output operations. I/O components 23 for various examples of the device 16 can include input components such as buttons, touch sensors, optical sensors, microphones, touch screens, proximity sensors, accelerometers, orientation sensors and output components such as a display device, a speaker, and or a printer port. Other I/O components 23 can be used as well.

Clock 25 illustratively comprises a real time clock component that outputs a time and date. It can also, illustratively, provide timing functions for processor 17.

Location system 27 illustratively includes a component that outputs a current geographical location of device 16. This can include, for instance, a global positioning system (GPS) receiver, a dead reckoning system, a cellular triangulation system, or other positioning system. Location system 27 can also include, for example, mapping software or navigation software that generates desired maps, navigation routes and other geographic functions.

Memory 21 stores operating system 29, network settings 31, applications 33, application configuration settings 35, data store 37, communication drivers 39, and communication configuration settings 41. Memory 21 can include all types of tangible volatile and non-volatile computer-readable memory devices. Memory 21 can also include computer storage media (described below). Memory 21 stores computer readable instructions that, when executed by processor 17, cause the processor to perform computer-implemented steps or functions according to the instructions. Processor 17 can be activated by other components to facilitate their functionality as well.

FIG. 31 shows one example in which device 16 is a tablet computer 600. In FIG. 31, computer 600 is shown with user interface display screen 602. Screen 602 can be a touch screen or a pen-enabled interface that receives inputs from a pen or stylus. Tablet computer 600 can also use an on-screen virtual keyboard. Of course, computer 600 might also be attached to a keyboard or other user input device through a suitable attachment mechanism, such as a wireless link or USB port, for instance. Computer 600 can also illustratively receive voice inputs as well.

FIG. 32 shows that the device can be a smart phone 71. Smart phone 71 has a touch sensitive display 73 that displays icons or tiles or other user input mechanisms 75. Mechanisms 75 can be used by a user to run applications, make calls, perform data transfer operations, etc. In general, smart phone 71 is built on a mobile operating system and offers more advanced computing capability and connectivity than a feature phone.

Note that other forms of the devices 16 are possible.

Figure 33:
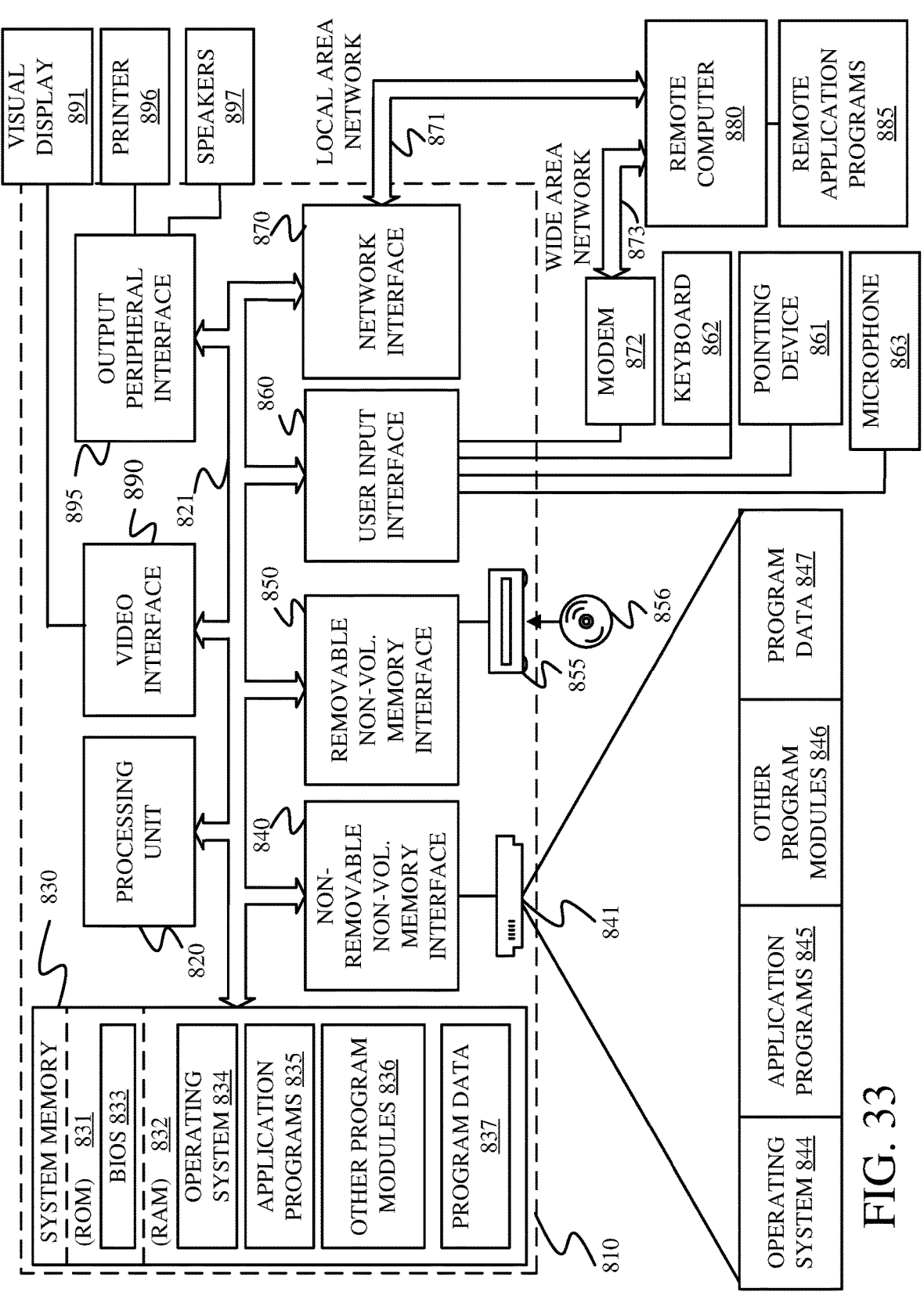
FIG. 33 is a block diagram showing one example of a computing environment that can be used in the machines and systems described with respect to previous figures.

FIG. 33 is one example of a computing environment in which elements of previous FIGS., or parts of them, (for example) can be deployed. With reference to FIG. 33, an example system for implementing some embodiments includes a computing device in the form of a computer 810 programmed to operate as discussed above. Components of computer 810 may include, but are not limited to, a processing unit 820 (which can comprise processors from previous FIGS.), a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. Memory and programs described with respect to previous FIGS. can be deployed in corresponding portions of FIG. 33.

Computer 810 typically includes a variety of computer readable media. Computer readable media can be any available media that can be accessed by computer 810 and includes both volatile and nonvolatile media, removable and non-removable media. By way of example, and not limitation, computer readable media may comprise computer storage media and communication media. Computer storage media is different from, and does not include, a modulated data signal or carrier wave. Computer storage media includes hardware storage media including both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 810. Communication media may embody computer readable instructions, data structures, program modules or other data in a transport mechanism and includes any information delivery media. The term "modulated data signal" means a signal that has one or more of its characteristics set or changed in such a manner as to encode information in the signal.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 33 illustrates operating system 834, application programs 835, other program modules 836, and program data 837.

The computer 810 may also include other removable/non-removable volatile/nonvolatile computer storage media. By way of example only, FIG. 33 illustrates a hard disk drive 841 that reads from or writes to non-removable, nonvolatile magnetic media, an optical disk drive 855, and nonvolatile optical disk 856. The hard disk drive 841 is typically connected to the system bus 821 through a non-removable memory interface such as interface 840, and optical disk drive 855 are typically connected to the system bus 821 by a removable memory interface, such as interface 850.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (e.g., ASICs), Application-specific Standard Products (e.g., ASSPs), System-on-a-chip systems (SOCs), Complex Programmable Logic Devices (CPLDs), etc.

The drives and their associated computer storage media discussed above and illustrated in FIG. 33, provide storage of computer readable instructions, data structures, program modules and other data for the computer 810. In FIG. 33, for example, hard disk drive 841 is illustrated as storing operating system 844, application programs 845, other program modules 846, and program data 847. Note that these components can either be the same as or different from operating system 834, application programs 835, other program modules 836, and program data 837.

A user may enter commands and information into the computer 810 through input devices such as a keyboard 862, a microphone 863, and a pointing device 861, such as a mouse, trackball or touch pad. Other input devices (not shown) may include a joystick, game pad, satellite dish, scanner, or the like. These and other input devices are often connected to the processing unit 820 through a user input interface 860 that is coupled to the system bus, but may be connected by other interface and bus structures. A visual display 891 or other type of display device is also connected to the system bus 821 via an interface, such as a video interface 890. In addition to the monitor, computers may also include other peripheral output devices such as speakers 897 and printer 896, which may be connected through an output peripheral interface 895.

The computer 810 is operated in a networked environment using logical connections (such as a controller area network—CAN, local area network—LAN, or wide area network WAN) to one or more remote computers, such as a remote computer 880.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. In a networked environment, program modules may be stored in a remote memory storage device. FIG. 33 illustrates, for example, that remote application programs 885 can reside on remote computer 880.

It should also be noted that the different examples described herein can be combined in different ways. That is, parts of one or more examples can be combined with parts of one or more other examples. All of this is contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of controlling an unloading operation, comprising:

detecting a receiving vehicle identifier at a leading vehicle, the receiving vehicle identifier corresponding to a receiving vehicle that receives material from the leading vehicle during the unloading operation;

accessing, based on the receiving vehicle identifier, computer aided design (CAD) file information corresponding to a CAD file representing the receiving vehicle; and controlling the unloading operation based on the CAD file information.

2. The method of claim 1 wherein controlling the unloading operation comprises:

identifying a position of the receiving vehicle relative to the leading vehicle based on the CAD file information; and controlling the unloading operation based on the position of the receiving vehicle relative to the leading vehicle.

3. The method of claim 2 wherein identifying a position of the receiving vehicle relative to the leading vehicle comprises:

detecting an image of the receiving vehicle with an optical sensor;

generating point cloud data corresponding to the receiving vehicle based on the image;

comparing the point cloud data to the CAD file information to generate a comparison result; and identifying the position of the receiving vehicle relative to the leading vehicle based on the comparison result.

4. The method of claim 3 and further comprising:

iteratively performing the steps comprising detecting an image of the receiving vehicle, generating point cloud, comparing the point cloud data to the CAD file information, and identifying the position of the receiving vehicle to track the position of the receiving vehicle during the unloading operation; and controlling the unloading operation based on the tracked position.

5. The method of claim 1 wherein controlling the unloading operation comprises:

identifying a volume profile corresponding to the receiving vehicle based on the CAD file information; and controlling the unloading operation based on the volume profile.

6. The method of claim 5 wherein controlling the unloading operation based on the volume profile comprises:

detecting a fill level of material in the receiving vehicle based on the volume profile; and controlling the unloading operation based on the detected fill level.

7. The method of claim 5 wherein controlling the unloading operation based on the detected fill level comprises:

identifying discrete fill locations based on the volume profile; and controlling the unloading operation based on the discrete fill locations.

8. The method of claim 7 wherein controlling the unloading operation based on the discrete fill locations comprises:

identifying a discrete volume corresponding to each of the discrete fill locations;

detecting a fill level at each of the discrete fill locations based the corresponding discrete volume; and controlling the unloading operation based on the detected fill level at each of the discrete fill locations.

9. The method of claim 5 wherein controlling the unloading operation comprises:

identifying a volume capacity corresponding to the receiving vehicle based on the volume profile; and generating a logistic control signal based on the volume capacity.

10. The method of claim 1 and further comprising:

generating the CAD file information from the CAD file, wherein generating the CAD file information comprises at least one of:

generating receiving vehicle dimension information; or generating receiving vehicle volume information.

11. The method of claim 1 wherein accessing the CAD file information comprises:

receiving, at a remote server system, the CAD file;

generating the CAD file information, based on the CAD file, at the remote server system;

receiving, at the remote server system, the receiving vehicle identifier from the leading vehicle; and sending the CAD file information to the leading vehicle.

12. The method of claim 1 wherein detecting the receiving vehicle identifier comprises:

obtaining a vehicle identifier for a following vehicle that provides propulsion to the receiving vehicle.

13. A machine unloading system comprising:

at least one processor;

memory storing instructions executable by the at least one processor, wherein the instructions, when executed, cause the machine unloading system to:

detect a receiving vehicle identifier at a leading vehicle, the receiving vehicle identifier corresponding to a receiving vehicle that receives material from the leading vehicle during an unloading operation;

access, based on the receiving vehicle identifier, CAD file information corresponding to a CAD file representing the receiving vehicle; and control an unloading operation based on the CAD file information.

14. The machine unloading system of claim 13 wherein the instructions, when executed, cause the machine unloading system to:

iteratively identify a position of the receiving vehicle relative to the leading vehicle based on the CAD file information to track the position of the receiving vehicle during the unloading operation; and control the unloading operation based on the tracked position of the receiving vehicle relative to the leading vehicle.

15. The machine unloading system of claim 13 wherein the instructions, when executed, cause the machine unloading system to:

identify a volume profile corresponding to the receiving vehicle based on the CAD file information; and control the unloading operation based on the volume profile.

16. The machine unloading system of claim 15 wherein the instructions, when executed, cause the machine unloading system to:

identify discrete fill locations in the receiving vehicle and to identify a discrete volume corresponding to each of the discrete fill locations based on the volume profile; and control the unloading operation based on the discrete fill locations and corresponding volumes.

17. The machine unloading system of claim 16 wherein the instructions, when executed, cause the machine unloading system to:

generate an output indicative of a volume of material unloaded at each of the discrete fill locations; and control the unloading operation based on the volume of material unloaded at each of the discrete fill locations.

18. A computer-implemented method comprising:

receiving, at a remote server system, a computer aided design (CAD) file representing a receiving vehicle that receives material from a leading vehicle during an unloading operation;

processing the CAD file to extract CAD file information representing the receiving vehicle;

obtaining a receiving vehicle identifier from the leading vehicle, the receiving vehicle identifier corresponding to the receiving vehicle; and controlling an unloading operation based on the CAD file information.

19. The computer implemented method of claim 18 and further comprising:

identifying a position of the receiving vehicle relative to the leading vehicle based on the CAD file information;

identifying a volume profile corresponding to the receiving vehicle based on the CAD file information; and controlling the unloading operation based on the position of the receiving vehicle relative to the leading vehicle and based on the volume profile.

20. The computer implemented method of claim 18, further comprising: sending the CAD file information to the receiving vehicle for controlling the unloading operation.

* * * * *